(12) United States Patent
Degner et al.

(10) Patent No.: US 10,725,507 B2
(45) Date of Patent: *Jul. 28, 2020

(54) DESKTOP ELECTRONIC DEVICE

(71) Applicant: Apple Inc., Cupertino, CA (US)

(72) Inventors: Brett W. Degner, Menlo Park, CA (US); Caitlin Elizabeth Kalinowski, San Francisco, CA (US); Richard D. Kosoglow, Sunnyvale, CA (US); Joshua D. Banko, Palo Alto, CA (US); David H. Narajowski, Palo Alto, CA (US); Jonathan L. Berk, Mountain View, CA (US); Michael E. Leclerc, Sunnyvale, CA (US); Michael D. McBroom, Leonard, TX (US); Asif Iqbal, Los Altos Hills, CA (US); Paul S. Michelsen, San Jose, CA (US); Mark K. Sin, Santa Clara, CA (US); Paul A. Baker, Los Altos, CA (US); Harold L. Sontag, Gilroy, CA (US); Wai Ching Yuen, Palo Alto, CA (US); Matthew P. Casebolt, Fremont, CA (US); Kevin S. Fetterman, Campbell, CA (US); Alexander C. Calkins, San Francisco, CA (US); Daniel L. McBroom, Leonard, TX (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/377,155

(22) Filed: Apr. 6, 2019

(65) Prior Publication Data
US 2019/0235587 A1    Aug. 1, 2019

Related U.S. Application Data

(63) Continuation of application No. 15/964,973, filed on Apr. 27, 2018, now Pat. No. 10,254,805, which is a
(Continued)

(51) Int. Cl.
*G06F 1/16* (2006.01)
*G06F 1/18* (2006.01)
(Continued)

(52) U.S. Cl.
CPC .......... *G06F 1/181* (2013.01); *G02B 6/0001* (2013.01); *G02B 6/001* (2013.01); *G02B 6/0008* (2013.01);
(Continued)

(58) Field of Classification Search
USPC ..................................... 361/679.47
See application file for complete search history.

(56) References Cited

U.S. PATENT DOCUMENTS

| 3,596,139 A | 7/1971 | Walsh |
| 3,942,586 A | 3/1976 | Fries |

(Continued)

FOREIGN PATENT DOCUMENTS

| CN | 2416536 Y | 1/2001 |
| CN | 2476056 Y | 2/2002 |

(Continued)

OTHER PUBLICATIONS

PCT Application No. PCT/US2014/041153—International Search Report and Written Opinion dated Oct. 15, 2014, 19 pages.
(Continued)

*Primary Examiner* — Hung S. Bui
(74) *Attorney, Agent, or Firm* — Dickinson Wright RLLP

(57) ABSTRACT

An internal component and external interface arrangement for a cylindrical compact computing system is described that
(Continued)

includes at least a structural heat sink having triangular shape disposed within a cylindrical volume defined by a cylindrical housing. A computing engine having a generally triangular shape is described having internal components that include a graphics processing unit (GPU) board, a central processing unit (CPU) board, an input/output (I/O) interface board, an interconnect board, and a power supply unit (PSU).

18 Claims, 30 Drawing Sheets

Related U.S. Application Data continuation of application No. 15/637,940, filed on Jun. 29, 2017, now Pat. No. 9,964,999, which is a continuation of application No. 15/263,222, filed on Sep. 12, 2016, now Pat. No. 9,974,206, which is a continuation of application No. 15/173,377, filed on Jun. 3, 2016, now Pat. No. 9,665,134, which is a continuation of application No. 14/297,574, filed on Jun. 5, 2014, now Pat. No. 9,395,772.

(60) Provisional application No. 61/832,709, filed on Jun. 7, 2013, provisional application No. 61/832,695, filed on Jun. 7, 2013, provisional application No. 61/832,633, filed on Jun. 7, 2013, provisional application No. 61/832,698, filed on Jun. 7, 2013.

(51) Int. Cl.

| | | |
|---|---|---|
| *G06F 1/20* | (2006.01) | |
| *H05K 7/20* | (2006.01) | |
| *H01L 23/40* | (2006.01) | |
| *H05K 5/03* | (2006.01) | |
| *H05K 1/02* | (2006.01) | |
| *F21V 8/00* | (2006.01) | |
| *G06F 3/00* | (2006.01) | |
| *G08B 5/36* | (2006.01) | |
| *G08B 21/18* | (2006.01) | |

(52) U.S. Cl.
CPC .............. *G06F 1/182* (2013.01); *G06F 1/183* (2013.01); *G06F 1/185* (2013.01); *G06F 1/188* (2013.01); *G06F 1/20* (2013.01); *G06F 1/206* (2013.01); *G06F 3/00* (2013.01); *G08B 5/36* (2013.01); *G08B 21/18* (2013.01); *H01L 23/4093* (2013.01); *H05K 1/0203* (2013.01); *H05K 5/03* (2013.01); *H05K 7/20009* (2013.01); *H05K 7/2039* (2013.01); *H05K 7/2049* (2013.01); *H05K 7/20145* (2013.01); *H05K 7/20154* (2013.01); *H05K 7/20163* (2013.01); *H05K 7/20172* (2013.01); *H05K 7/20209* (2013.01)

(56) References Cited

U.S. PATENT DOCUMENTS

| | | | |
|---|---|---|---|
| 4,270,023 | A | 5/1981 | Beveridge |
| 4,404,522 | A | 9/1983 | Pucciarello |
| 4,479,383 | A | 10/1984 | Bravenec |
| 4,528,615 | A | 7/1985 | Perry |
| 4,542,442 | A | 9/1985 | Drexler |
| 4,589,712 | A | 5/1986 | Hastings |
| 5,301,089 | A | 4/1994 | Takashima |
| 5,424,915 | A | 6/1995 | Katooka et al. |
| 5,460,571 | A | 10/1995 | Kato et al. |
| 5,848,282 | A | 12/1998 | Kang et al. |
| 5,889,651 | A | 3/1999 | Sasaki et al. |
| 5,903,432 | A | 5/1999 | McMahon |
| 5,912,802 | A | 6/1999 | Nelson |
| 6,336,592 | B1 | 1/2002 | Russell et al. |
| 6,373,697 | B1 | 4/2002 | Lajara et al. |
| 6,459,577 | B1 | 10/2002 | Holmes et al. |
| 6,657,131 | B2 | 12/2003 | Gonzalez et al. |
| 6,665,188 | B1 | 12/2003 | Chen |
| 7,436,665 | B2 | 10/2008 | Chen et al. |
| 7,491,900 | B1 | 2/2009 | Peets et al. |
| 7,633,751 | B2 | 12/2009 | Shinotou et al. |
| 7,640,968 | B2 | 1/2010 | Peng et al. |
| 7,742,298 | B2 | 6/2010 | Kunz |
| 7,957,148 | B1 | 6/2011 | Gallarelli et al. |
| 8,031,454 | B2 | 10/2011 | Muraki |
| 8,164,900 | B2 | 4/2012 | Sun et al. |
| 8,189,345 | B2 | 5/2012 | Rapp et al. |
| 8,189,849 | B2 | 5/2012 | Waddell et al. |
| 8,279,597 | B2 | 10/2012 | El-Essawy et al. |
| 8,576,565 | B2 | 11/2013 | Matsumoto et al. |
| 8,687,363 | B2 | 4/2014 | Moore |
| D714,248 | S | 9/2014 | Chang |
| 8,942,005 | B2 | 1/2015 | Geswender |
| 9,069,535 | B2 | 6/2015 | Degner et al. |
| 9,176,548 | B2 | 11/2015 | Degner et al. |
| 9,207,728 | B2 | 12/2015 | Degner et al. |
| 9,207,729 | B2 | 12/2015 | Degner et al. |
| 9,218,028 | B2 | 12/2015 | Whang et al. |
| 9,285,846 | B2 | 3/2016 | Degner et al. |
| 9,395,772 | B2 | 7/2016 | Degner et al. |
| 9,423,840 | B2 | 8/2016 | Whang et al. |
| 9,644,471 | B2 | 5/2017 | Logan et al. |
| 9,665,134 | B2 | 5/2017 | Degner et al. |
| 9,974,206 | B2 | 5/2018 | Degner et al. |
| 10,254,805 | B2 * | 4/2019 | Degner ............... G06F 1/20 |
| 2002/0114137 | A1 | 8/2002 | Pearson et al. |
| 2002/0170905 | A1 | 11/2002 | Peterson et al. |
| 2003/0002244 | A1 | 1/2003 | Mitev |
| 2003/0002249 | A1 | 1/2003 | Cruz et al. |
| 2004/0000395 | A1 | 1/2004 | Lin |
| 2004/0095719 | A1 | 5/2004 | Rong-Yao |
| 2004/0101152 | A1 | 5/2004 | Fingleton |
| 2005/0286226 | A1 | 12/2005 | Ishii et al. |
| 2006/0037737 | A1 | 2/2006 | Chen et al. |
| 2007/0067119 | A1 | 3/2007 | Loewen et al. |
| 2007/0091578 | A1 | 4/2007 | Chang et al. |
| 2007/0139897 | A1 | 6/2007 | RaghuRam |
| 2007/0149246 | A1 | 6/2007 | Bodley et al. |
| 2007/0177349 | A1 | 8/2007 | Pokharna et al. |
| 2007/0247809 | A1 | 10/2007 | McClure |
| 2008/0019092 | A1 | 1/2008 | Chen et al. |
| 2008/0309511 | A1 | 12/2008 | Kerr et al. |
| 2009/0029566 | A1 | 1/2009 | Lee et al. |
| 2009/0059516 | A1 | 3/2009 | Lai et al. |
| 2009/0067128 | A1 | 3/2009 | Kunz |
| 2009/0139145 | A1 | 6/2009 | Watanabe et al. |
| 2009/0254689 | A1 | 10/2009 | Karamcheti et al. |
| 2010/0002383 | A1 | 1/2010 | Yeh et al. |
| 2010/0046177 | A1 | 2/2010 | Rapp et al. |
| 2010/0172084 | A1 | 7/2010 | Winokur |
| 2011/0022770 | A1 | 1/2011 | Sullivan |
| 2011/0090628 | A1 | 4/2011 | Sullivan |
| 2011/0093729 | A1 | 4/2011 | Mucignat et al. |
| 2011/0102991 | A1 | 5/2011 | Sullivan |
| 2011/0122566 | A1 | 5/2011 | Hsieh et al. |
| 2011/0122576 | A1 | 5/2011 | Kuo et al. |
| 2011/0299239 | A1 | 12/2011 | Santos |
| 2012/0106064 | A1 | 5/2012 | Li et al. |
| 2012/0211211 | A1 | 8/2012 | Shih |
| 2012/0281360 | A1 | 11/2012 | Nicol et al. |
| 2012/0314373 | A1 | 12/2012 | Park |
| 2013/0077328 | A1 | 3/2013 | Hook et al. |
| 2013/0083478 | A1 | 4/2013 | Lin |
| 2013/0083549 | A1 | 4/2013 | Takahara et al. |
| 2013/0088829 | A1 | 4/2013 | Co |
| 2013/0112386 | A1 | 5/2013 | Lai et al. |
| 2013/0128497 | A1 | 5/2013 | Hayden, Sr. et al. |
| 2013/0250537 | A1 | 9/2013 | He et al. |
| 2014/0000165 | A1 | 1/2014 | Patel et al. |
| 2014/0219491 | A1 | 8/2014 | Ludlum et al. |

(56) References Cited

U.S. PATENT DOCUMENTS

| | | | |
|---|---|---|---|
| 2014/0321046 | A1 | 10/2014 | Sinha et al. |
| 2015/0253822 | A1 | 9/2015 | Degner et al. |
| 2016/0349806 | A1 | 12/2016 | Whang et al. |
| 2016/0378147 | A1 | 12/2016 | Degner et al. |
| 2017/0269641 | A1 | 9/2017 | Degner et al. |
| 2017/0300095 | A1 | 10/2017 | Degner et al. |
| 2017/0308134 | A1 | 10/2017 | Degner et al. |
| 2018/0246547 | A1 | 8/2018 | Degner et al. |

FOREIGN PATENT DOCUMENTS

| | | | |
|---|---|---|---|
| CN | 1729734 | A | 2/2006 |
| CN | 2804924 | Y | 8/2006 |
| CN | 2849811 | Y | 12/2006 |
| CN | 101212884 | A | 7/2008 |
| CN | 201229538 | Y | 4/2009 |
| CN | 102012727 | A | 4/2011 |
| CN | 102043446 | A | 5/2011 |
| CN | 201926963 | U | 8/2011 |
| CN | 102238845 | A | 11/2011 |
| CN | 102298424 | A | 12/2011 |
| CN | 102486673 | A | 6/2012 |
| CN | 202486681 | U | 10/2012 |
| CN | 102770005 | A | 11/2012 |
| CN | 102810001 | A | 12/2012 |
| CN | 202748723 | U | 2/2013 |
| CN | 102968163 | A | 3/2013 |
| CN | 103026322 | A | 4/2013 |
| CN | 204189111 | U | 3/2015 |
| CN | 204288046 | U | 4/2015 |
| EP | 394031 | A1 | 10/1990 |
| EP | 1065752 | A1 | 1/2001 |
| EP | 1478020 | A1 | 11/2004 |
| JP | 06177562 | A | 6/1994 |
| JP | 3230459 | B2 | 11/2001 |
| JP | 2006300734 | A | 11/2006 |
| JP | 2007102671 | A | 4/2007 |
| JP | 2007113530 | A | 5/2007 |
| KR | 200325515 | Y1 | 8/2003 |
| TW | 200608179 | A | 3/2006 |
| TW | I266594 | B | 11/2006 |
| TW | M344028 | U | 11/2008 |
| TW | I325159 | B | 5/2010 |
| TW | M379962 | U | 5/2010 |
| TW | I384929 | B | 2/2013 |
| TW | 201314399 | A | 4/2013 |
| WO | 2004038527 | A2 | 5/2004 |
| WO | 2006120627 | A2 | 11/2006 |
| WO | 2011130944 | A1 | 10/2011 |
| WO | 2011146668 | A2 | 11/2011 |
| WO | 2014090182 | A1 | 6/2014 |
| WO | 2014197726 | A1 | 12/2014 |
| WO | 2014197731 | A1 | 12/2014 |

OTHER PUBLICATIONS

PCT Application No. PCT/US2014/041160—International Search Report and Written Opinion dated Oct. 1, 2014, 16 pages.
PCT Application No. PCT/US2014/041165—International Search Report and Written Opinion dated Sep. 29, 2014, 24 pages.
FIC Piston Won Best Choice of Computex Taipei 2005, First International Computers, Inc., http://www.fic.com.tw/press.aspx?prid=146, May 2005.
Dell Precision Workstation M6500 Service Manual, ftp://ftp.dell.com/Manuals/all-products/esuprt_laptop/esuprt_precision_mobile/precision-m6500_service%20manual_en-us.pdf, Mar. 2010.
Shrout, "BFG Technologies GeForce 7900 GT OC Review," BFG Tech, http://www.pcper.com/reviews/Graphics-Cards/BFG-Technologies-GeForce-7900-GT-0C-Review/Card-and-Features, May 2006.
Seguin, "Computer Shaped Like a Tube: a Nettop by CLVE." Tomsguide.com. http://www.tomsguide.com/us/CLVE-TVBE-Nettop.news-2860.html. Oct. 2008.
Chinese Patent for Utility Model No. ZL201420297132.0—Evaluation Report for Utility Model Patent dated Dec. 3, 2014.
Chinese Patent Application No. 201420297903.6—Evaluation Report dated Apr. 22, 2015.
Taiwanese Patent Application No. 103119652—Office Action dated Jul. 20, 2015.
Taiwanese Patent Application No. 103209977—Office Action dated Jan. 8, 2015.
Chinese Patent for Utility Model No. 201420297903.6—Office Action dated Sep. 18, 2014.
PCT Application No. PCT/US2014/041160—International Preliminary Report on Patentability dated Dec. 17, 2015.
Australian Patent Application No. 2014274823—Patent Examination Report No. 1 dated Jan. 15, 2016.
Korean Patent Application No. 10-2015-7034820—Office Action dated Jan. 18, 2016.
Australian Patent Application No. 2014274827—Patent Examination Report No. 1 dated Feb. 3, 2016.
Japanese Patent Application No. 2015-563065—First Office Action dated Jun. 3, 2016.
European Patent Application No. 14807396.8—Supplementary European Search Report dated Oct. 31, 2016.
Taiwanese Patent Application No. 103119653—Search Report dated Sep. 10, 2016.
Australian Patent Application No. 2016203049—Examination Report dated Nov. 21, 2016.
Derek Wilson, "Spotswood Custom Computer Cases", Aug. 27, 2008, URL: http://www.anandtech.com/show/2603/4, retrieved from Internet on Nov. 18, 2016.
European Patent Application No. 14807885.0—Supplementary European Search Report dated Nov. 18, 2016.
Sony VCX-TP1 PC product catalogue, Mar. 28, 2007 (Description, specification and drawings).
Taiwanese Patent Application No. 103119654—Office Action dated Jun. 23, 2016.
Taiwanese Patent Application No. 103119654—Office Action dated Dec. 30, 2016.
Taiwanese Patent Application No. 103209978—Office Action dated Dec. 5, 2016.
Chinese Application for Utility Model No. 201420297126.5—Utility Model Patentability Evaluation Report (UMPER) dated Jun. 10, 2015.
Chinese Application for Utility Model No. 201420297126.5—First Office Action dated Sep. 18, 2014.
Chinese Application for Utility Model No. 201420297126.5—Second Office Action dated Nov. 13, 2014.
Chinese Application for Invention No. 201410247270.2—First Office dated Jan. 22, 2017.
Taiwanese Patent Application No. 103209976—Office Action dated Jan. 20, 2015.
Taiwanese Patent Application No. 103209976—Office Action dated Jun. 15, 2015.
Japanese Patent Application No. 2015-563067—Office Action dated Jun. 3, 2016.
European Patent Application No. 14808192.0—Search Opinion dated Dec. 20, 2016.
European Patent Application No. 14808192.0—Communication pursuant to Rules 70(2) and 70a(2) EPC dated Jan. 9, 2017.
Korean Patent Application No. 10-2015-7034810—Office Action dated Sep. 22, 2016.
Chinese Patent Application No. 201410247194.5—Office Action dated Mar. 22, 2017.
Chinese Application for Invention No. 201410247460.4—Office Action dated Mar. 23, 2017.
Japanese Patent Application No. 2016-159350—Office Action dated May 22, 2017.
Chinese Patent Application No. 201420297903.6—Corrected Evaluation Report for Utility Model Patent dated Jul. 24, 2015.
Korean Patent Application No. 10-2016-7013961—Notice of Preliminary Rejection dated Sep. 6, 2017.
Australian Patent Application No. 2016216799—First Examination Report dated Oct. 30, 2017.

(56) References Cited

OTHER PUBLICATIONS

Chinese Application No. 2014102471945—Second Office Action dated Nov. 8, 2017.
Chinese Patent Application No. 201410247460.4—Second Office Action dated Nov. 8, 2017.
Korean Patent Application No. 10-2018-7010731—Notice of Preliminary Rejection dated Jul. 13, 2018.
European Patent Application No. 18173339.5—Extended European Search Report dated Aug. 16, 2018.
European Patent Application No. 18173337.9—Extended European Search Report dated Aug. 16, 2018.
Korean Patent Application No. 10-2018-7010730—Notice of Allowance dated Oct. 22, 2018.
Korean Patent Application No. 10-2018-7010731—Notice of Allowance dated Feb. 14, 2019.
Chinese Application No. 201710658155.8—First Office Action dated Sep. 18, 2019.

* cited by examiner

DESKTOP ELECTRONIC DEVICE

CROSS REFERENCE TO RELATED APPLICATIONS

This application is a continuation of U.S. patent application Ser. No. 15/964,973, filed Apr. 27, 2018, entitled "DESKTOP ELECTRONIC DEVICE", which is a continuation of U.S. patent application Ser. No. 15/637,940, filed Jun. 29, 2017, entitled "COMPUTER INTERNAL ARCHITECTURE", issued May 8, 2018 as U.S. Pat. No. 9,964,999, which is a continuation of U.S. patent application Ser. No. 15/263,222, filed Sep. 12, 2016, entitled "COMPUTER INTERNAL ARCHITECTURE", issued May 15, 2018 as U.S. Pat. No. 9,974,206, which is a continuation of U.S. patent application Ser. No. 15/173,377, filed Jun. 3, 2016, entitled "COMPUTER INTERNAL ARCHITECTURE", issued May 30, 2017 as U.S. Pat. No. 9,665,134, which is a continuation of U.S. patent application Ser. No. 14/297,574, filed Jun. 5, 2014, entitled "COMPUTER INTERNAL ARCHITECTURE", issued Jul. 19, 2016 as U.S. Pat. No. 9,395,772, which claims the benefit of priority under 35 U.S.C. § 119(e) to:

(i) U.S. Provisional Application No. 61/832,698, filed Jun. 7, 2013, entitled "COMPUTER ARCHITECTURE RESULTING IN IMPROVED COMPONENT DENSITY AND THERMAL CHARACTERISTICS";

(ii) U.S. Provisional Application No. 61/832,709, filed Jun. 7, 2013, entitled "INTERNAL COMPONENT AND EXTERNAL INTERFACE ARRANGEMENT FOR A COMPACT COMPUTING DEVICE";

(iii) U.S. Provisional Application No. 61/832,695, filed Jun. 7, 2013, entitled "ENCLOSURE/HOUSING FEATURES OF A COMPUTER FOR IMPROVED THERMAL PERFORMANCE AND USER EXPERIENCE"; and (iv) U.S. Provisional Application No. 61/832,633, filed Jun. 7, 2013, entitled "THERMAL PERFORMANCE OF A COMPACT COMPUTING DEVICE", each of which is incorporated herein by reference in its entirety for all purposes.

This application is related to:

(i) PCT International Patent Application No. PCT/US2014/041165, filed Jun. 5, 2014, entitled "COMPUTER SYSTEM";

(ii) PCT International Patent Application No. PCT/US2014/041160, filed Jun. 5, 2014, entitled "COMPUTER THERMAL SYSTEM"; and (iii) PCT International Patent Application No. PCT/US2014/041153, filed Jun. 5, 2014, entitled "COMPUTER INTERNAL ARCHITECTURE", each of which is incorporated herein by reference in its entirety for all purposes.

TECHNICAL FIELD

The embodiments described herein relate generally to compact computing systems. More particularly, the present embodiments relate to the structure and organization of internal components and external interfaces for a compact computing system.

BACKGROUND

The form factor of a compact computing system, including its external shape and arrangement of internal components, can determine a density of computing power achievable. A densely packed arrangement of high-speed computational elements can provide significant challenges to maintaining thermal stability under varying environmental conditions. In addition, a user of the compact computing system can expect moderate to low operational sound levels and ready access to replaceable components. With continuous improvements in storage density and other computational support elements, the user can also require expansion capability to provide for customization and upgrades.

One design challenge associated with the manufacture of compact computing systems is the arrangement of structural components and functional components with adequate thermal heat transfer and acceptable sound levels when used in a fully functional operating state. An additional design challenge is to provide for user servicing of select components and ready expansion capabilities to supplement processing and/or storage capabilities of the compact computing system. Commonly available expandable designs, e.g., based around a rectangular box shaped computing tower, can be limited in adequate airflow and/or require complex heat transfer mechanisms for multiple computational units inside. "Tower" based computers can include room for expansion at the expense of an enlarged outer enclosure, with substantial "dead space" throughout. Alternatively, current portable computing systems provide highly compact designs with limited expansion capabilities, complex part replacement, and minimal user customization.

SUMMARY

The present application describes various embodiments regarding systems and methods for providing a lightweight, durable and compact computing system having a cylindrical cross section. This can be accomplished at least in part through a general computing system arrangement of internal components that cooperates with a monolithic housing to provide a compact computing system having a high computing power density in a compact and durable enclosure A rotating and locking memory module mechanism includes a pair of end guides, connected by a supporting member, each end guide including a slot to hold an end of a memory module and direct the memory module to a socket mounted on a circuit board, a lock mechanism configured to provide for rotation of the memory module mechanism between an unlocked position and locked position, an actuator attached to a first end guide in the pair of end guides, wherein a user actuates a rotating and locking function of the memory module mechanism by applying a pressing force to the actuator or to the supporting member, thereby rotating the memory module mechanism between the unlocked position and the locked position and the supporting member configured to provide structural support to transfer a portion of the pressing force applied to the actuator to an end guide opposite the actuator and to resist torsion of the memory module mechanism. The memory module mechanism allows insertion and removal of the memory module while in the unlocked position and restricts insertion and removal of the memory module while in the locked position.

A memory module mechanism includes a pair of end guides comprising a first and second end guides, connected by a supporting member, each end guide including a slot to hold an end of a memory module and direct the memory module to a socket mounted on a circuit board, a lock mechanism configured to provide for rotation of the memory module mechanism between an unlocked position and a locked position, and an actuator attached to a first end guide in the pair of end guides, wherein a user actuates a rotating and locking function of the memory module mechanism by applying a force to the actuator or to the supporting member, thereby rotating the memory module mechanism between the unlocked position and the locked position.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed inventive apparatuses and methods for providing compact computing systems. These drawings in no way limit any changes in form and detail that may be made to the invention by one skilled in the art without departing from the spirit and scope of the invention. The embodiments will be readily understood by the following detailed description in conjunction with the accompanying drawings, wherein like reference numerals designate like structural elements.

DETAILED DESCRIPTION

Figure 1:
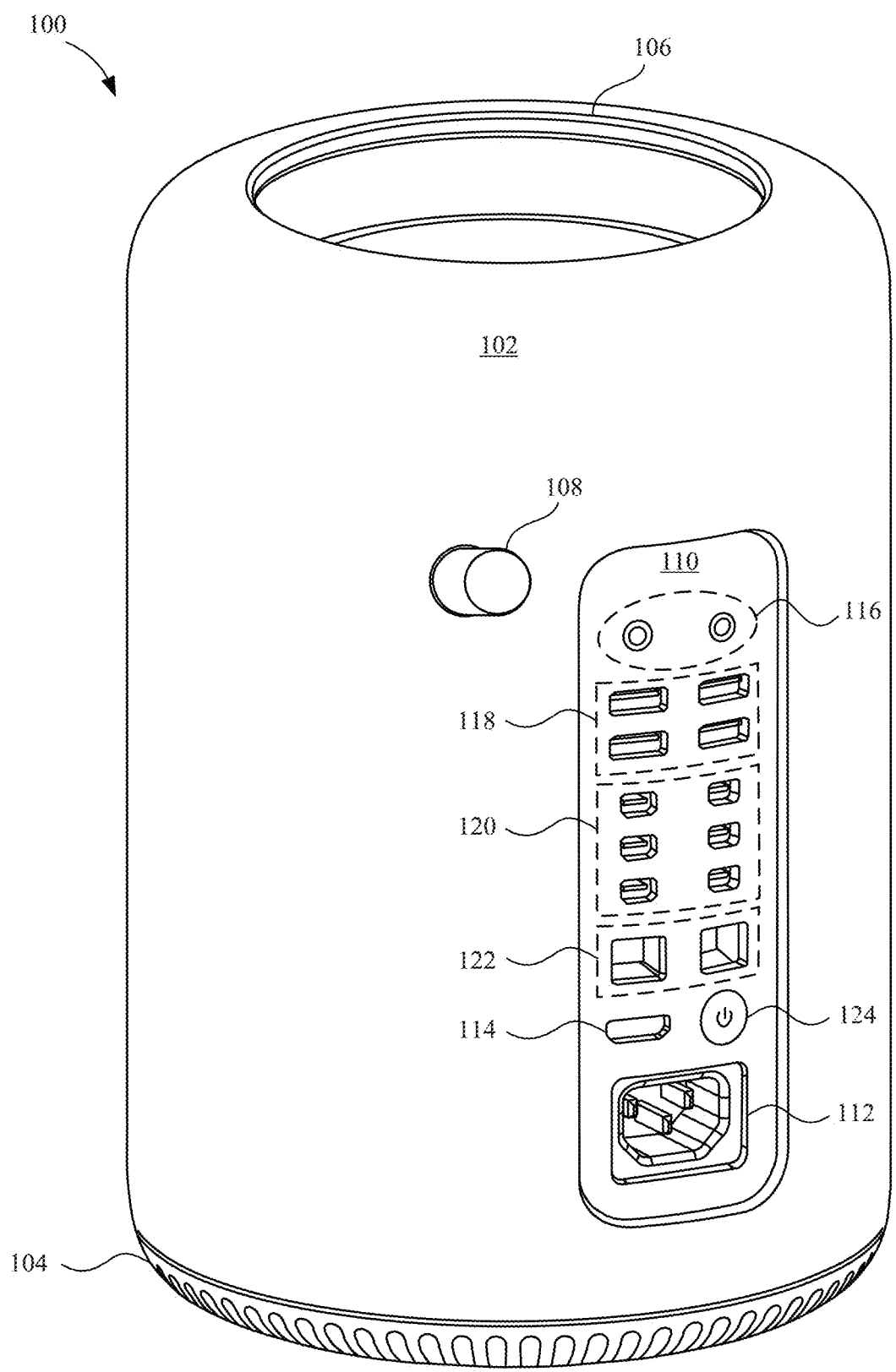
FIG. 1 illustrates a perspective external view of a compact computing system in accordance with some embodiments.

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

The following relates to a compact computing system that can be configured as a stand-alone device for placement upon, underneath, or adjacent to a work surface, e.g., a table or a desk. The compact computing system can be referred to as a desktop computer. The compact computing system can include multiple internal electronic components including at least a central processing unit (CPU) board, one or more graphics processing unit (GPU) boards, and other primary and secondary internal components. Although internal electronic components are generally rectangular in shape, the compact computing system can take on a non-rectangular form. One or more internal electronic component boards can be shaped to match a surface of the outer enclosure of the compact computing system, including for example, a circular shape to match a top or bottom of a cylinder, or a curved shape to match a segment of an arc conforming to a curved exterior surface of the outer enclosure. In representative embodiments as described herein, the compact computing system can be cylindrical in shape and can be configured to arrange a number of rectangular electronic components as a central core providing a form factor characterized as having a high component packing density (a number of components per available volume). The resulting compact computing system can provide a high computing power density in a small, lightweight, transportable form factor. In some embodiments, the compact computing system can also be coupled to other compact computing systems to form a multi-computer system that can be used as a server computer system (such as in a data farm) or as a network computing system having each compact computing system as a node (or nodes).

In a particular embodiment, the compact computing system can include a monolithic housing that can surround and protect the central core. The monolithic housing can be easily removed for user servicing. The monolithic housing can be formed of aluminum having an anodized aluminum oxide layer that both protects the housing and promotes heat transfer for cooling the central core. Aluminum has a number of properties that make it a good choice for the monolithic housing. For example, aluminum is a good electrical conductor that can provide good electrical ground; it can be easily machined and has well known metallurgical properties. The superior electrical conductivity of aluminum provides a chassis ground for internal electrical components arranged to fit and operate within the housing. The aluminum housing also provides a good electromagnetic interference (EMI) shield protecting sensitive electronic components from external electromagnetic energy as well as reducing an amount of electromagnetic energy, emanating from internal components within the compact computing system, from penetrating the housing, thereby contributing to assisting to achieve good electromagnetic compatibility (EMC).

A layer of aluminum oxide can be formed on the surface of aluminum in a process referred to as anodizing. In some cases, the layer of aluminum oxide can be dyed or otherwise imbued with one or more colors to take on a specific color or colors. It should be noted that since aluminum oxide is a good electrical insulator, either the interior surface of the housing is masked during the anodizing process, to preserve the bare metal state of the bulk material in the masked region, or selected portions of the aluminum oxide layer are removed to provide a surface suitable for electrical contacts. As a solid metal structure, the aluminum monolithic housing can provide in part for thermal cooling while the compact computing system is operational. The anodizing process applied to the surface of the housing can improve heat dissipation caused by thermal radiation from external surfaces of the compact computing system by increasing the anodized surface's infrared emissivity.

As noted above, the housing can take on many forms, however, for the remainder of this discussion, without loss of generality, the external housing takes on a cylindrical shape that is separate from an internal cylindrical central core of structural components, internal processing components, internal storage components, internal power regulation components, and interconnect components. To maximize thermal cooling of the central core, the external housing can be conductively coupled to selected portions of an internal structural component that can act as a rigid structural element and as a heat sink. The external housing can have a thickness tuned to promote circumferential and axial thermal conduction that aids in mitigating hot spots on the external surface of the compact computing system.

A thermal management system can utilize an air mover that can be move copious amounts of air axially through an interior volume defined by the housing that can be used to cool a central core of the compact computing system in a manner that is both efficient and quiet. Generally speaking, the air mover can provide a volume of air per unit time in the form of an airflow of about 15-20 cubic feet per minute (CFM) when major components such as a central processing unit (CPU) and/or a graphics processing unit (GPU) are not being heavily utilized. However, when processing demand increases, the air mover can compensate for any increase in heat generated by ramping up the airflow. For example, in response to an increase in demand for processing resources from either or both the CPU and/or GPU, the air mover can increase the airflow from about 15-20 CFM to about 25-30 CFM (at about room temperature of 25° C.) with an acoustic output of about 35 dbA (it should be noted that these acoustic levels are only experienced when the air mover is performing at a higher end of its operating range during a period of high demand and not during more normal operation). It should be noted that at higher ambient temperature (35° C.), the air mover can ramp the airflow even further to compensate for the reduced thermal transfer at the higher ambient temperature. In this situation, the air mover can ramp the airflow to about 35 to 40 CFM or more having a higher acoustic output of 40 dbA or more.

A separation between the central core and the housing can permit an internal, bypass, peripheral airflow to cool a portion of the external housing helping to minimize a touch temperature of the housing. In one embodiment, the external housing can mate to a base unit that provides, in part, a pedestal to support the compact computing system including the internal cylindrical central core when placed upright on a work surface. The external housing can include a first opening having a size and shape in accordance with the base unit. The first opening can provide for a full perimeter air inlet, e.g. through circumferential openings in the base unit, and the circular design can allow for full functionality and adequate air intake even in those situations where the compact computing system is located in a corner or against a wall. In an assembled configuration, the base unit corresponds to a base of a cylinder. The first opening can be used to accept a flow of air from an external environment passing through vents in the base unit. The amount of air that flows into the housing can be related to a pressure differential between the external environment and an interior of the compact computing system created by an air mover assembly. The air mover assembly can be placed next to a second opening axially disposed at an opposite end from the first opening.

In one embodiment, the air mover assembly can take the form of a fan assembly. The fan assembly can be an axial fan assembly configured to axially move air through the housing by creating the abovementioned pressure differential. The fan assembly can also be configured as a combination of an axial and a centrifugal fan assembly. In an embodiment, air can enter the interior of the compact computing system through vents in the base unit. In one embodiment, a baffle arrangement can bifurcate the airflow in such a way that some of the airflow remains within a central column separate from a bypass, peripheral airflow radially disposed outward from the central column. The central column of air (central airflow) can thermally engage a heat sink structure to which one or more internal component boards can be mounted. The internal component boards can include processing units and/or memory, at least some of which can be thermally coupled to the heat sink structure. The bypass, peripheral airflow can pass over portions of one side or both sides of the internal component boards on which high performance processing units, memory, solid state drives, and/or power regulation components can be mounted. In order to optimize thermal transfer, at least some of the components can be configured and mounted axially (in the direction of airflow) and spaced appropriately to maximize an amount of air engaging the components distributed across the internal component boards.

In one embodiment, a vapor chamber in thermal contact with the heat sink structure, being placed adjacent to and/or attached to the heat sink structure, can be used to further increase an amount of heat transferred to the central airflow from the internal component boards. The high performance processing units and/or portions of memory can be thermally coupled through direct contact to the heat sink structure and/or the vapor chamber connected thereto. Both the central airflow through the heat sink structure and the bypass airflow across the internal component boards and other internal components can be used to cool the central core of the compact computing system and maintain the external housing at an acceptable touch temperature.

A good electrical ground (also referred to as a chassis ground) can be used to isolate internal components that can emit significant electromagnetic energy, e.g., a main logic board (MLB), an internal board with higher performance computational units, high throughput interconnects and boards, and/or other internal components with high bandwidth interfaces, from those circuits, such as wireless circuits, that are sensitive to electromagnetic energy. This electromagnetic isolation can be particularly important in the compact computing system due to the close proximity of internal components that emit electromagnetic energy and those nearby components that are sensitive to electromagnetic energy. Moreover, the external housing can include conductive material (such as a gasket infused with conductive particles) or other electrically conductive regions that can be mated to a corresponding attachment feature on the base unit or the top mounted air mover assembly completing the formation of a Faraday cage. The Faraday cage can block electromagnetic energy (both internal and external) effectively shielding the external environment from EMI generated by the compact computing system. In order to complete the Faraday cage, air vents in the base unit can be sized to effectively block and/or attenuate electromagnetic energy having a range of selected wavelengths. More specifically, the wavelength of electromagnetic energy blocked and/or attenuated by the vents can be consistent with that emitted by active internal components operating in the compact computing system.

In one embodiment, the compact computing system can include a sensor configured to detect whether or not the housing is properly in place and aligned with respect to the internal components. Proper placement of the monolithic housing is important due to the key role that both the shape and configuration of the monolithic housing has with respect to thermal management of the compact computing system as well as completing the Faraday cage discussed above. The compact computing system can include an interlock system that detects the presence and proper alignment of the monolithic housing with respect to the internal components. Only when the proper alignment is detected, the interlock system will allow the internal components to power up and operate in a manner consistent with system specification. In one embodiment, the interlock system can include a magnetic element detectable by a Hall effect sensor only when the housing is in a proper position and alignment with respect to the internal components.

Due at least to the strong and resilient nature of the material used to form the housing; the housing can include a large opening having a wide span that do not require additional support structures. Such an opening can be used to provide access to an input/output panel and power supply port. The input/output panel can include, for example, data ports suitable for accommodating data cables configured for connecting external systems that can provide expansion capabilities as input/output data transfer. The opening can also provide access to an audio circuit, video display circuit, power input, etc. In an embodiment, one or more data ports (and/or icons representing the data ports and/or groupings of data ports) can be illuminated to provide easier access to locating and connecting to the one or more data ports in reduced lighting.

FIG. 1 illustrates a perspective external view of a compact computing system 100 in accordance with some embodiments. The compact computing system 100 can be arranged in a shape defined by an external housing 102. An arrangement of internal components of the compact computing system 100 and a thermal management strategy can be selected to provide a computationally dense computing system having sufficient airflow to support high performance computing with the compact computing system 100 placed in a variety of physical positions. In the described embodiments, the external housing 102 can comprise a cylindrical shape having a first circular opening at the base of the external housing 102, which mates to an air intake inlet/base unit 104 that can provide support for constituent components of the compact computing system 100. The external housing 102 can also include a second opening located opposite the first circular opening, and the second opening can function as a combination of an air exhaust outlet and a carrying handle 106.

When operational, an air mover assembly in the compact computing system 100 can cause air to enter through a plurality of circumferential openings located in the inlet/base unit 104, to pass through an internal structural core/heat sink and across a plurality of component boards, and to exit through the outlet/handle 106. The size of the internal structural core/heat sink, the arrangement of multiple internal component boards, the arrangement of computational and memory units on the multiple internal component boards, the design of attached power supplies, and the arrangement of high speed interconnects between various internal component boards can function in concert with the air mover assembly to provide a thermal management system that enables a high performance computing system in a compact, dense geometric arrangement, encased in the external housing 102 with an acceptable touch temperature.

The inlet/base unit 104 of the compact computing system 100 can provide support for the compact computing system 100. Accordingly, the inlet/base unit 104 can be formed of a strong and resilient material, e.g., a metal that can also prevent leakage of electromagnetic (EM) energy from internal components within the compact computing system 100 that can radiate EM energy during operation. Thus, the inlet/base unit 104 can contribute to shielding internal components from electromagnetic interference (EMI) and to blocking and/or attenuating radiant EM energy to support electromagnetic compatibility (EMC) compliance. The inlet/base unit 104 can be formed of non-metallic compounds that can be rendered conductive using, for example, conductive particles embedded therein. In order to assure that minimal electromagnetic energy emitted by internal components within the compact computing system 100 escapes, a conductive seal can be used to complete a Faraday cage formed at least in part by the inlet/base unit 104 and the external housing 102.

The inlet/base unit 104 can also include a series of circumferential vents extending around the entire inlet/base unit 104. The vents can provide a suitable amount of air flowing from an external environment to the internal volume of the compact computing system 100. In an embodiment, the amount of air flowing through the vents can be related to a pressure differential across the vents created by an air mover assembly disposed within the compact computing system 100. In one embodiment, the air mover assembly can be disposed near the second opening of the external housing 102, which forms an outlet/handle 106 for the compact computing system 100, creating a suction effect that reduces an ambient pressure within the external housing 102 of the compact computing system 100. In addition to facilitating airflow, vents in the inlet/base 104 can be sized to prevent transmission of electromagnetic energy into or out of the assembled compact computing system 100. The size of the vents in the inlet/base 104, in some embodiments, can be related to one or more wavelengths of electromagnetic energy emitted by internal components contained within the compact computing system 100.

The compact computing system 100 can further include an opening in the external housing 102 that can have a size and shape in accordance with an interface panel 110. The interface panel 110 can include various ports that can be used to communicate data between the compact computing system 100 and various external systems. For example, the interface panel 110 can include a set of audio ports 116 that can be used to provide an audio stream to an external audio system, such as headphones, speakers, or an audio processor. The set of audio ports 116 can also be used to receive an audio stream from an external audio system, e.g., a microphone or audio recording device. The interface panel 110 can also include a set of data ports, including a set of bus ports 118, a set of high-speed expansion ports 120, a set of networking ports 122, and a set of video ports 114. The set of data ports can be used to transfer data and/or power between one or more external circuits and the compact computing system 100. The set of data ports can be used to accommodate a broad range of data connections according to different wired data communication protocols, e.g., one or more Universal Serial Bus (USB) ports 118, one or more Thunderbolt high speed expansion ports 120, one or more Ethernet networking ports 122, and one or more high definition media interface (HDMI) ports 114.

The compact computing system 100 can be interconnected to other computing systems through one or more of the data ports provided through the interface panel 110, e.g., to data storage devices, portable media players, and/or video equipment, to form a network of computing systems. Accordingly, the interface panel 110 and associated data ports of the compact computing system 100 can be used to form connections from the compact computing system 100 to a large number and variety of external computing systems and circuits, which can prove particularly useful when a large amount of computing resources is required. Moreover, the compact size and shape of the compact computing system 100 can lend itself to space efficient computing networks or data farms, in some representative embodiments and uses.

The interface panel 110 can include a video port 114 that can be used to communicate high-speed video between the compact computing system 100 and an external video monitor or other external video processing circuitry. The interface panel 110 can include a power switch 124 that can be readily available to accept a user touch for initiating a power on sequence (including, for example, a boot up process) as well as a power down sequence. In some embodiments, the power switch 124 can be illuminated and provide an activity indication to a user, e.g., under software control of a processing unit in the compact computing system 100. The interface panel 110 can include an alternating current (AC) power input port 112, which can be sized and shaped to accept a power plug suitable for transferring external power to operational electronic components within the external housing 102. In some embodiments, the compact computing system 100 can include internal power resources (such as a battery) that can be charged and re-charged in accordance with power delivered by way of power input port 112.

The external housing 102 can include a mechanical latch 108 that can be used to couple the external housing 102 of the compact computing system 100 securely to internal structures of the compact computing system 100. The mechanical latch 108 can take the form of a sliding latch or other such operable mechanism that can be manually engaged and disengaged. In this way, the external housing 102 can be easily removed in order to expose internal components and structures of the compact computing system 100 for user maintenance, upgrade, or servicing by a service center. A detection circuit (not shown) of the compact computing system 100 can be used to detect whether the external housing 102 is properly situated in place with respect to internal components and structures. The detection circuit can serve a useful function as the thermal management strategy of compact computing system 100 can rely on the proper placement and use of the external housing 102 in combination with the arrangement of internal components and an air mover assembly inside the compact computing system 100.

In some embodiments, the detection circuit can determine that the external housing 102 is not in proper placement or alignment with respect to internal structures or components of the compact computing system 100, and the detection circuit can prevent the compact computing system 100 from operating, or at least from operating at full capacity. In one embodiment, the detection circuit can include a magnetic sensor (such as a Hall Effect device) located to detect one or more magnets disposed on the external housing 102 when the external housing 102 is properly placed and aligned on the compact computing system 100.

Figure 2:
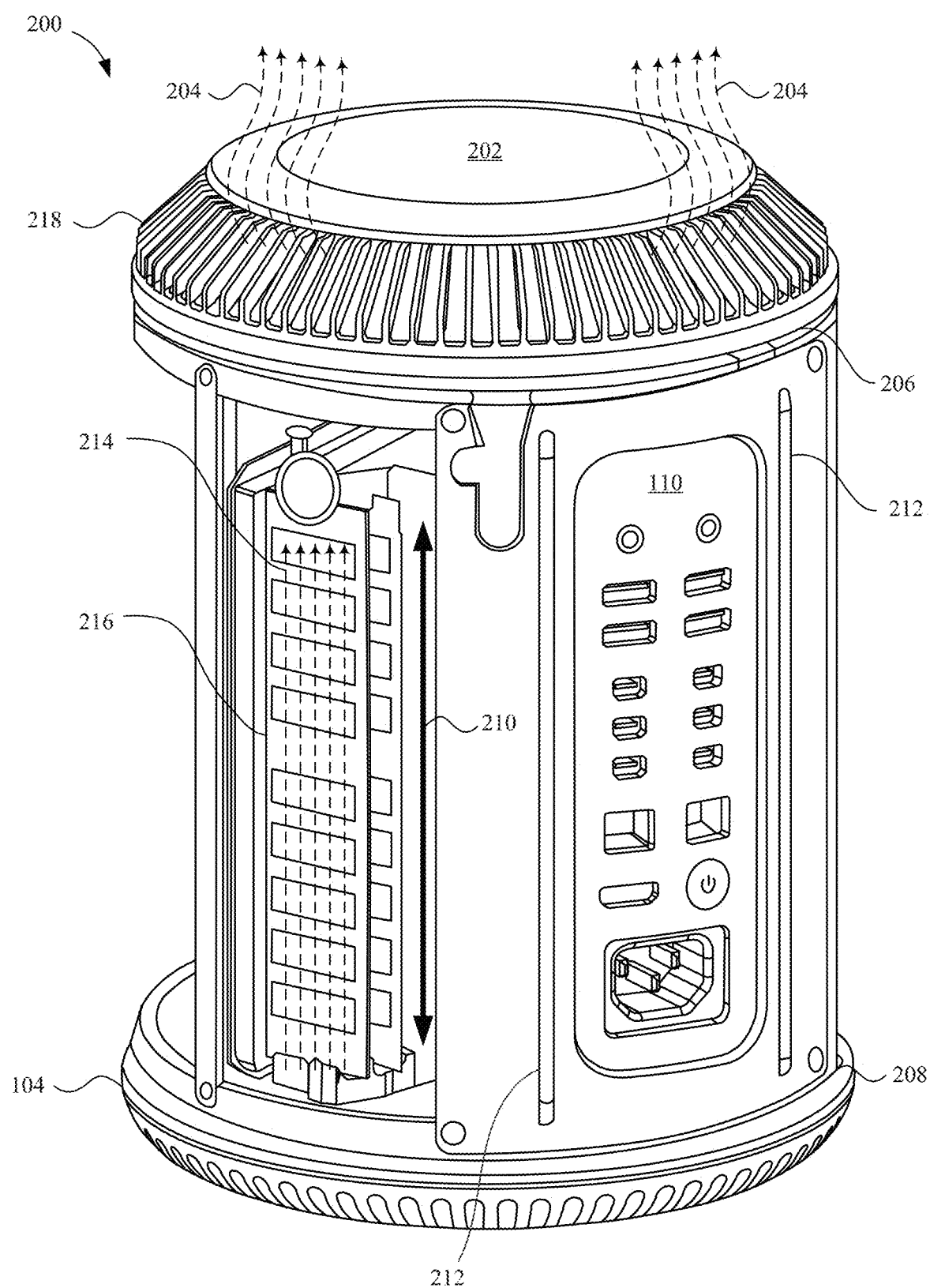
FIG. 2 illustrates a central core of internal components of the compact computing system in accordance with some embodiments.

FIG. 2 illustrates a central core 200 of internal components assembled together and positioned on the inlet/base 104 of the compact computing system 100 with the external housing 102 removed. The cylindrical shape of compact computing system 100 can dictate the arrangement of various internal components as well as set requirements for thermal management. For example, internal components of the compact computing system 100 can be arranged in an axial manner that optimizes both a component packing density (the number of operational components per available volume) and a computing power density (computing power per available volume). Moreover, the axial arrangement of internal components can optimize an amount of heat that can be transferred from the internal components to a central structural heat sink and then to a central airflow (not shown) that passes through the central structural heat sink as well as from internal components to a peripheral airflow 214 that passes across the internal components. For example, one or more memory modules 216, e.g., dual inline memory modules (DIMMs), can be constructed from a substrate on which are mounted multiple memory chips. The memory modules 216 can be arranged along a major axis 210 of the compact computing system 100 parallel to the peripheral airflow 214, which can pass across the multiple memory chips contained thereon. In order to optimize heat transfer from the memory chips to the peripheral airflow 214, the memory chips, in some embodiments, can be mounted onto an underlying substrate in a manner that aligns with the peripheral airflow 214. In this way, an efficient thermal transfer interface can be formed between the peripheral airflow 214, which flows inside the external housing 102, and the memory modules 216.

In an embodiment, the central core 200 of internal components can include an exhaust assembly 218, which can include an air mover assembly (not shown), disposed in close proximity to the outlet/handle 106 of the external housing 102, and which can provide an exit path for an exhaust airflow 204. The air mover assembly of the exhaust assembly 218 can combine a central airflow (not shown), which passes through a central structural heat sink of the central core 200 of internal components, and the peripheral airflow 214, which passes over internal component boards and other internal components, to form the exhaust airflow 204. The exhaust assembly 218 can direct the exhaust airflow 204 toward the outlet/handle 106, and at least part of the outlet/handle 106 can intercept a portion of the exhaust airflow 204 in a manner that facilitates the transfer of thermal energy generated by internal components of the compact computing system 100 to the external housing 102. A cosmetic shield 202 can be used to cover operational components contained in the exhaust assembly 218, such as radio frequency (RF) processing circuitry and one or more antennas located on top of the exhaust assembly 218. The cosmetic shield 202 can be formed of an RF transparent material such as plastic, ceramic, or glass.

Due to the electrically conductive nature of the external housing 102, it can be preferred to use the external housing 102 as a chassis ground to provide a good electrical ground for internal components of the compact computing system 100. Accordingly, a set of vertical touch points 212 on an input/output subassembly cover adjacent to the interface panel 110 can be formed of a conductive material and can be used to form a conductive path between internal components of the compact computing system 100 and a matching set of vertical conductive patches on the interior surface of the external housing 102. To form a good electrical connection, portions of the external housing 102 that contact the vertical touch points 212 can be masked and/or laser etched during a manufacturing process to ensure the portions that contact the vertical touch points 212 are devoid of any non-conductive or insulating material (such as aluminum oxide). When the external housing 102 includes an aluminum oxide layer formed thereon, selected portions of the aluminum oxide can be removed to expose the underlying electrically conductive bulk material in locations that come into contact with the vertical touch points 212.

In addition to providing a chassis ground, the external housing 102 can be used in conjunction with the inlet/base 104 and the exhaust assembly 218 to prevent leakage of electromagnetic energy to and from the internal components of the compact computing system 100 by forming a Faraday cage. A contact surface 206 of the exhaust assembly 218 can be masked or laser etched during a manufacturing process to form an electrically conductive contact surface 206 that can contact an electrically conductive gasket positioned inside of the external housing 102. The electrically conductive gasket of the external housing 102 can contact the electrically conductive contact surface 206 of the exhaust assembly 218 when the external housing 102 is properly placed over the internal components of the compact computing system 100 and positioned to enclose the internal components in a securely latched position. The external housing 102 can also include an electrically conductive region on the bottom surface of the external housing 102, which can contact an electrically conductive bottom gasket 208 mounted on (or formed as an integral part of) the inlet/base 104. In addition, portions of an input/output (I/O) subassembly cover, which can include, embedded within, the interface panel 110, can include bare metal regions that can also contact directly to corresponding bare metal regions of the inlet/base 104 and/or the exhaust assembly 218. Select portions of the internal structural core/heat sink, in some embodiments, can also contact the inlet/base 104 and the exhaust assembly 218 when the internal components of the compact computing system 100 are properly assembled.

An effective Faraday cage for the compact computing system can be formed using a combination of the following: (1) an electrically conductive ring formed between the contact surface 206 of the exhaust assembly 218 and a gasket (not shown) mounted in the interior of the external housing 102, (2) an electrically conductive ring formed between the bottom gasket 208 of the inlet/base 104 and the bottom of the external housing 102, (3) one or more arc shaped electrically conductive regions along the bottom interior surface of an input/output (I/O) subassembly cover in contact with matching electrically conductive arc shaped regions along a surface of the inlet/base 104, (4) one or more electrically conductive arc shaped regions along a surface of the exhaust assembly 218 in contact with matching electrically conductive arc shaped regions along the interior surface of the top of the I/O subassembly cover, and (5) vertical touch points 212 in contact with matching vertical regions along the interior surface of the external housing 102. In addition, mounting points on the central structural core/heat sink can be electrically in contact with the inlet/base 104 and with the exhaust assembly 218.

Figure 3:
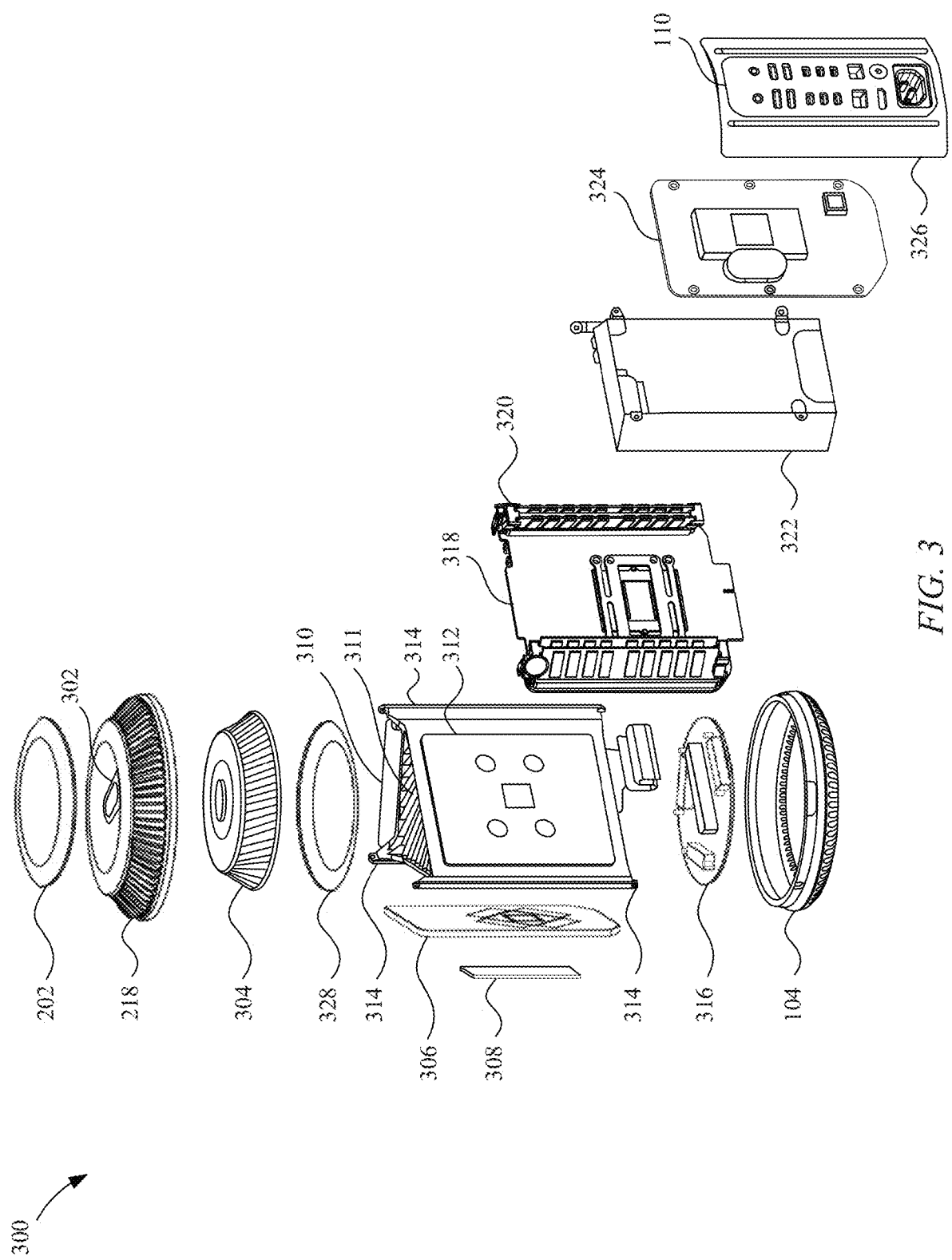
FIG. 3 illustrates an exploded view of the central core of internal components of the compact computing system in accordance with some embodiments.

FIG. 3 illustrates an exploded view 300 of the central core 200 of internal components of the compact computing system 100 in accordance with some embodiments. The central core 200 of internal components can be formed around a structural core/heat sink 310, which can serve as a structural core to which internal component boards can be mounted. In an embodiment, the structural core/heat sink 310 can be shaped as a triangle, e.g., an isosceles triangle having two equal length sides and a third longer side, extended in some embodiments at each corner to form structural standoff elements. Cooling fins 311 can fan out from an inside surface of the longer side to inside surfaces of the two equal sides. In one embodiment, a central cooling fin can bisect the triangular central volume defined by sides of the structural core/heat sink 310 forming two similar triangular regions. In one embodiment, other cooling fins can extend from the longer side to the other sides at an angle related to a distance from the center cooling fin. In this way, the cooling fins can form a symmetric cooling assembly within the triangular central volume. The structural core/heat sink 310 can include three vertical stanchions 314 that vertically span a portion of the interior of the external housing 102 of the compact computing system 100. Between each pair of vertical stanchions 314 a face of the structural core/heat sink 310 can span a portion of a chord that stretches horizontally across the interior of the external housing 102 of the compact computing system 100. On each of the three faces of the triangular structural core/heat sink 310, a vapor chamber assembly 312 can be positioned to contact the surface of the face of the structural core/heat sink 310. In a representative embodiment, a portion of each face of the structural core/heat sink 310 can be removed to form a cavity in which can be inlaid with the vapor chamber assembly 312. In some embodiments, the structural core/heat sink 310 and/or the vapor chamber assembly 312 can include mount points by which to attach internal component boards. The internal component boards can include one or more computational processing units, graphical processing units, and/or memory units which can transfer heat generated therein to the structural core/heat sink 310 through the vapor chamber assembly 312.

In a representative embodiment, two faces of the structural core/heat sink 310 can be sized in accordance with a form factor used for graphics processing unit (GPU) boards 306 that can be mounted thereto. In a representative embodiment, a third face of the structural core/heat sink 310 can be sized in accordance with a form factor used for a central processing unit (CPU) board 318 that can be mounted thereto. In an embodiment, the structural core/heat sink 310 can be formed approximately in the shape of an isosceles triangle having two faces of an equal width on which to mount two GPU boards 306 and a third face having a longer width on which to mount the one CPU board 318. In some embodiments, the longer width of the face of the structural core/heat sink 310 on which mounts the CPU board 318 can determine a diameter of the cylindrical central core 300 of internal components, and thereby substantially determine a diameter for the external housing 102 as well as for the assembled compact computing system 100.

In an embodiment, each GPU board 306 can be mounted to the structural core/heat sink 310 with the GPU and surrounding video memory facing (and in thermal contact with) the structural core/heat sink 310, e.g., through a corresponding vapor chamber assembly 312 mounted on and/or embedded in the structural core/heat sink 310. In an embodiment, a solid state drive 308 can be mounted on an outward facing side of one or both GPU board(s) 306, in a space between the external housing 102 and the GPU board 306. In an embodiment, the solid state drive 308 can be arranged as a vertical set of components along the vertical major axis 210 of the compact computing system and can be positioned centrally along the width of the GPU board 306 in a region having the widest space between the outer housing 102 and the GPU board 306. The arrangement and placement of the solid state drive 308 can be determined to maximize an amount of airflow passing across the solid state drive 308. In an embodiment, a CPU board 318 can be mounted to the structural core/heat sink 310 with the CPU facing (and in thermal contact with) the structural core/heat sink 310, e.g., through direct contact with a vapor chamber assembly 312 mounted on and/or embedded in the face of the structural core/heat sink 310.

In an embodiment, full size dual inline memory modules (DIMMs) that support the CPU can be positioned in DIMM mechanisms 320 mounted on an outward facing side of the CPU board 318 (on the opposite side of the CPU board 318 on which the CPU and CPU socket is placed). The DIMM mechanisms 320 can be tilted into a locked position that angles the DIMMs toward the interior of the central core 200 of components in the direction of the CPU, e.g., toward a vertical centerline of the CPU board 318. The DIMM mechanisms 320 can also be tilted into an unlocked position that angles the DIMMs away from the interior of the central core 200 of internal components, e.g., away from the CPU and in the direction of the external housing 102. In an embodiment, the DIMM mechanisms 320 can restrict a user from inserting and/or removing the DIMMs when in the locked position and permit the user to insert and/or remove the DIMMs when in the unlocked position. The DIMM mechanism 320 can angle the DIMMs within a circle bounded by the exterior housing 102 when in the locked position and position the DIMMs at least partially outside the circle when in the unlocked position to provide access for DIMM insertion and removal by the user of the compact computing system 100.

The CPU board 318 and the GPU boards 306 can be connected to each other and/or to an I/O board 324 through an interconnect board 316, which can also be referred to as a main logic board (MLB) in some embodiments. In an embodiment, the CPU board 318 can be connected to the interconnect board 316 through a double row edge connector to a matching socket mounted centrally on the interconnect board 316. The connection of the CPU board 318 through the double edge row connector can provide a compact arrangement within the central core 200 of components of the compact computing system 100. In an embodiment, the GPU board(s) 306 can be connected to the interconnect board 316 through wide bandwidth flex connectors (e.g., flex cables).

In some embodiments, the wide bandwidth flex connectors can also function as baffles to direct at least a portion of airflow incoming from the inlet/base 104 to bifurcate and spread across the surface of the GPU board(s) 306. Adjacent to the CPU board 306, a power supply unit (PSU) 322 can be positioned between the DIMM mechanisms 320. In and embodiment, a cross section of the PSU is shaped as a trapezoid to fit compactly between the DIMM mechanisms 320, the CPU board 318, and an I/O board 324. In an embodiment, an external AC power source can be connected through the interface panel 110 and through the I/O board 324 to the PSU 322, which can convert the AC power to one or more DC voltages. The DC power from the PSU 322 can be connected to the GPU board(s) 306 and/or the CPU board 318 through thin, flexible, flat, copper bus bars. The I/O board 324 can be mechanically connected to the PSU 322 and/or to the I/O subassembly cover 326 through which the interface panel 110 can connect the internal core 300 of the compact computing system 100 to the external world. The I/O board 326 can provide numerous high-speed interfaces for the compact computing system 100 through a common high bandwidth flex connector connected to the interconnect board 316, which in turn can connect by additional high bandwidth connectors to the CPU board 318 and GPU board(s) 306. The arrangement of component boards and other units illustrated in FIG. 3 provides for a maximally dense computational core of components thermally coupled to a large structural core/heat sink 310 for the compact computing system 100.

In some embodiments, the structural core/heat sink 310 can be connected mechanically to a top mounted exhaust assembly 218, which can include an impeller 304 and a plenum plate 328 connected to exhaust assembly 218 through which the exhaust airflow 204 can be drawn. In an embodiment, the exhaust assembly 218 can include a wireless subsystem 302 mounted within a cavity embedded in a top surface of the exhaust assembly 218 and capped by the cosmetic shield 202. In some embodiments, mount points on the vertical stanchions 314 of the structural core/heat sink 310 can electrically couple the top mounted exhaust assembly 218 to the structural core/heat sink 310. The structural core/heat sink 310 can also be connected mechanically to a bottom-mounted inlet/base 104. In some embodiments, mount points on the vertical stanchions 314 of the structural core/heat sink 310 can electrically couple the inlet/base 104 to the central core/heat sink 310.

Figure 4:
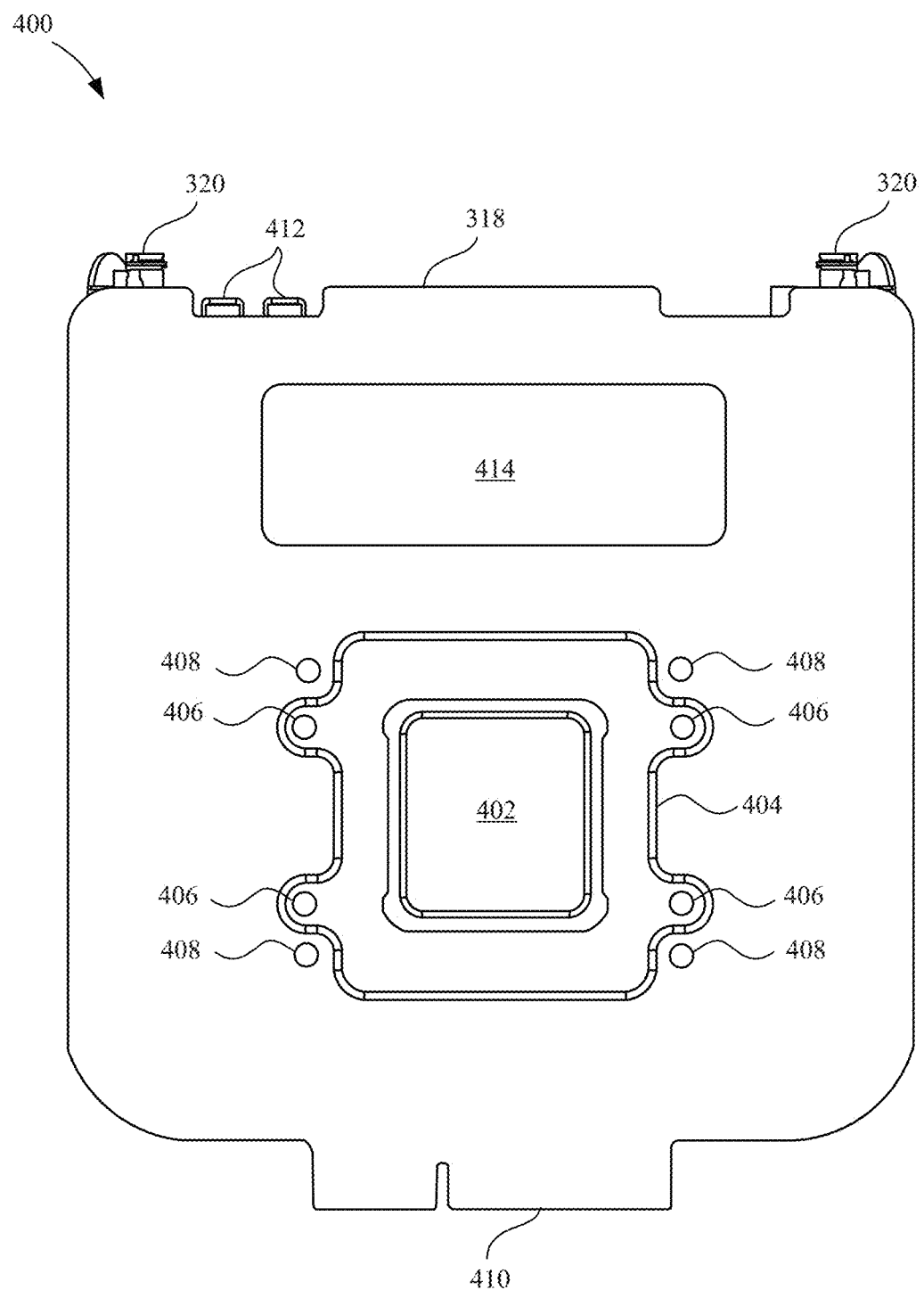
FIG. 4 illustrates a view of a first side of a central processing unit (CPU) board in accordance with some embodiments.

FIG. 4 illustrates a front view of a first side 400 of the CPU board 318 including a centrally mounted CPU 402 flanked on either side by vertical DIMM mechanisms 320 mounted on the opposite side of the CPU board 318. In some embodiments, the CPU 402 is mechanically and electrically coupled to the CPU board 318 by low profile thermal module 404 that cooperates with a flexible high strength spring mechanism (illustrated as spring 502 in FIGS. 5-7) to compress CPU 402 into a socket disposed beneath CPU 402. Fasteners disposed through openings 406 in CPU board 318 and engaged within threaded apertures of low profile thermal module 404 allow the compression of the CPU 402 into the socket. The low profile thermal module 404 is described in more detail in FIG. 7. The spring mechanism can be disposed on the other side of the CPU board 318 opposite of the CPU 402. The CPU board 318 can have one or more openings 408 through which fasteners (illustrated as fasteners 504 in FIG. 5) can engage attachment points disposed on the structural core/heat sink 310 thereby coupling CPU board 318 to the structural core/heat sink 310. As described in more detail in FIG. 5, the spring mechanism can have openings corresponding to openings 408 that allow fasteners to be driven through both the spring mechanism and CPU board 318.

In some embodiments, a layout of the CPU board 318 provides a high bandwidth data path through a double row edge connector at the base of the CPU board 318, e.g., illustrated as CPU board edge connector 410 in FIG. 4. As illustrated in FIG. 4, DC power for the CPU board 318 can be provided through one or more DC inputs 412 arranged on a top edge of the CPU board 318. In an embodiment, one or more flat copper interconnecting bus bars connect the DC inputs 412 of the CPU board 318 to the PSU 322. In an embodiment, a DC/DC regulation section 414 on the CPU board 318 can regulate and/or convert the DC power provided through the DC inputs 412 to provide a set of stable DC voltages as required for the computational components mounted on the CPU board 318, including at least memories mounted in the DIMM mechanisms 320 and the CPU 402. By arranging the layout of the CPU board 318 with the DC power flowing from the top edge and the high-speed digital data input/output from the bottom edge, a compact efficient CPU board 318 can be achieved. In an embodiment, the bottom edge of the CPU board 318 includes a double row CPU board edge connector 410 through which the high-speed digital data input/output flows to a mating socket mounted on the interconnect board 316.

In some embodiments, the DIMM mechanisms 320 include memory module sockets that are press fit connected to the CPU board 318, e.g., in order to not require the use of surface mount technology (SMT) on both sides of the CPU board 318 simultaneously. In an embodiment, some or all of the components of the CPU board 318, e.g., the DC/DC regulation section 414, are arranged to promote airflow in a vertical direction from the CPU board edge connector 410 on the bottom across the CPU 402 and memories in the DIMM mechanisms 320 through the DC/DC regulation section 414 to a top mounted air mover assembly (not shown). As illustrated, the CPU 402 can be mounted on one side of the CPU board 318 oriented to contact the vapor chamber assembly 312 attached to the structural core/heat sink 310. In order for the memory modules to be serviceable without removal of the CPU board 318 from being attached to the structural core/heat sink 310, the DIMM mechanisms 320 can be mounted on the side of the CPU board 318 opposite the CPU 402. As described above, in some embodiments, the DIMM mechanisms 320 can include a tilt and lock feature that angles the memory modules contained therein toward the interior of the compact computing system 100 when in the locked position and angles the memory modules outward to permit user accessibility when in the unlocked position.

Figure 5:
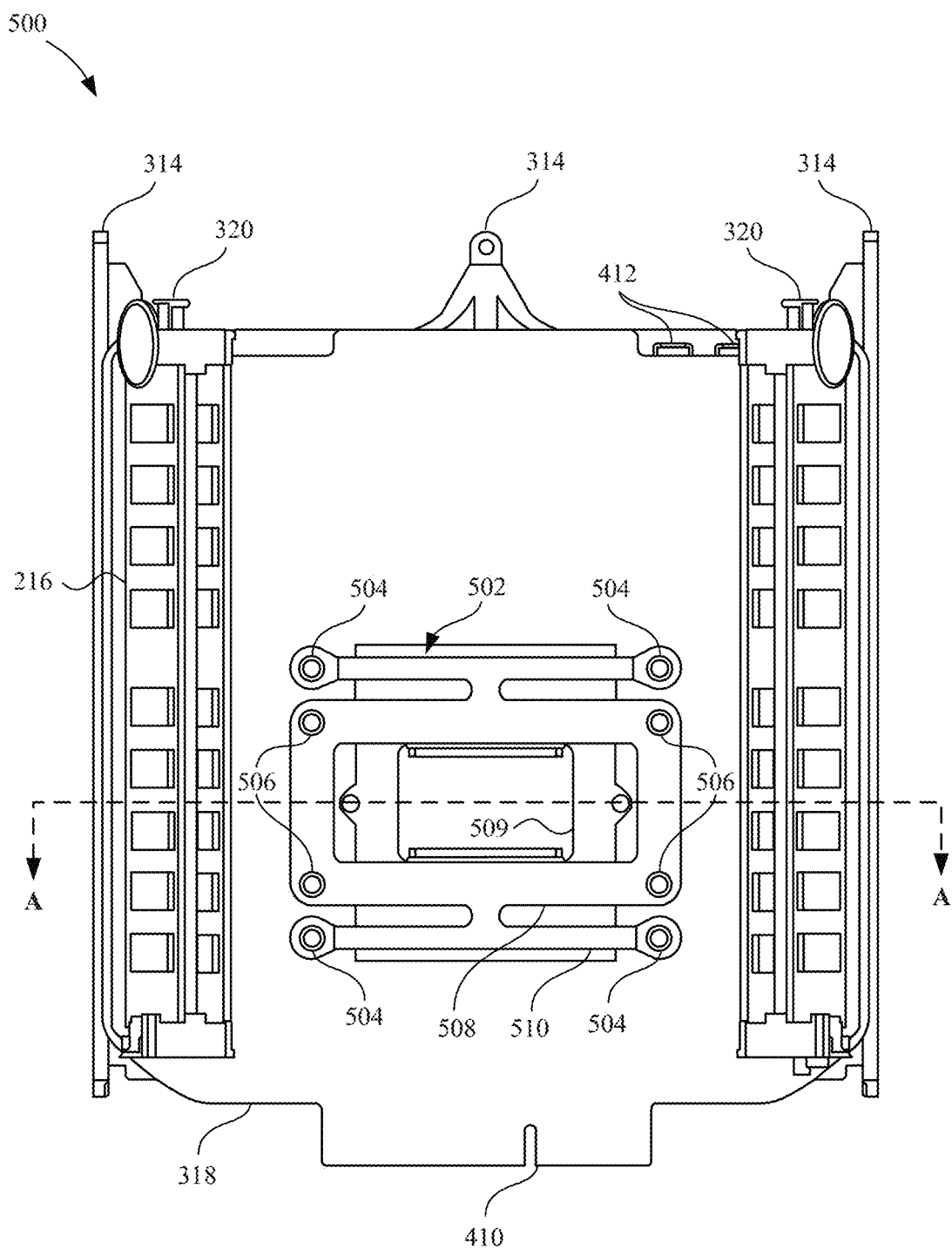
FIG. 5 illustrates a view of a second side of the CPU board attached to a structural core/heat sink in accordance with some embodiments.

FIG. 5 illustrates a front view of a second side 500 of the CPU board 318 including a portion of a CPU spring 502 flanked by DIMM mechanisms 320 on a left side and a right side of the CPU board 318. The CPU spring 502, in some embodiments, can provide for attaching the CPU 402 to the socket and/or to the structural core/heat sink 310 through one or more attachment points, e.g. mounted on and/or integral with the structural core/heat sink 310 and/or the vapor chamber assembly 312 attached thereto. Force can be applied by fasteners 504 and 506 along CPU spring 502 to flatten it against the second side of CPU board 318 as depicted.

In some embodiments, the CPU spring 502 can include flexible metal bands 508 that provide the force for seating the CPU 402 into the socket. The CPU spring 502 can also include flexible metal bands 510 that allow the CPU board 318 to be coupled to the vapor chamber assembly 312, thereby regulating an amount of force that is exerted when mounting the CPU board 318 to the structural core/heat sink 310. In some embodiment, flexible metal bands 510 can cause about 30 pounds of force to be exerted when mounting CPU board 318 to vapor chamber assembly 312. Flexible metal bands 510 can also be used to help keep CPU 402 seated in the socket. When the CPU board 318 is fastened to the vapor chamber assembly 312, a raised portion of the CPU 402 can also be compressed when flexible metal bands exert the force upon the CPU board 318 through backer plate 509, thereby causing the CPU 402 to be pressed directly against a surface of the vapor chamber assembly 312. It should be noted that fasteners 506 can extend only into low profile thermal module 404, allowing the CPU spring 502 to securely seat CPU 402 in the socket prior to installing CPU board 318 to the structural core/heat sink 310 with fasteners 504.

In some embodiments, the CPU spring 502 can be formed as two separate structural units (1) to press the CPU 402 into the socket 604 and (2) to compress the CPU 402 against the vapor chamber assembly 312. In some embodiments, the CPU spring 502 can be formed as a single structure performing both functions, e.g., as illustrated in FIG. 5.

In an embodiment, the CPU board 318 includes one or more DIMM connector sockets mounted on the second side 500 of the CPU board 318 opposite to the first side 400 on which the CPU 402 can be mounted. In an embodiment, the DIMM connector sockets are mounted using press fit connectors (instead of connectors that require surface mount technology). In an embodiment, the DIMM connector sockets accept full size DIMMs. As illustrated in FIG. 5, the DIMMs connector sockets can be mounted along the major axis 210 of the central core 200 of internal components of the compact computing system 100, which can provide for orienting the DIMMs to align with the peripheral airflow 214 substantially along their entire length. In an embodiment, the DIMM mechanisms 320 provide for tilting toward the center of the CPU board 318 into a locked position for use when the compact computing system 100 is operational and for tilting away from the center of the CPU board 318 into an unlocked position for use when a user of the compact computing system (or a service technician) inserts, replaces, and/or removes the DIMMs from the DIMM connector sockets.

Figure 6:
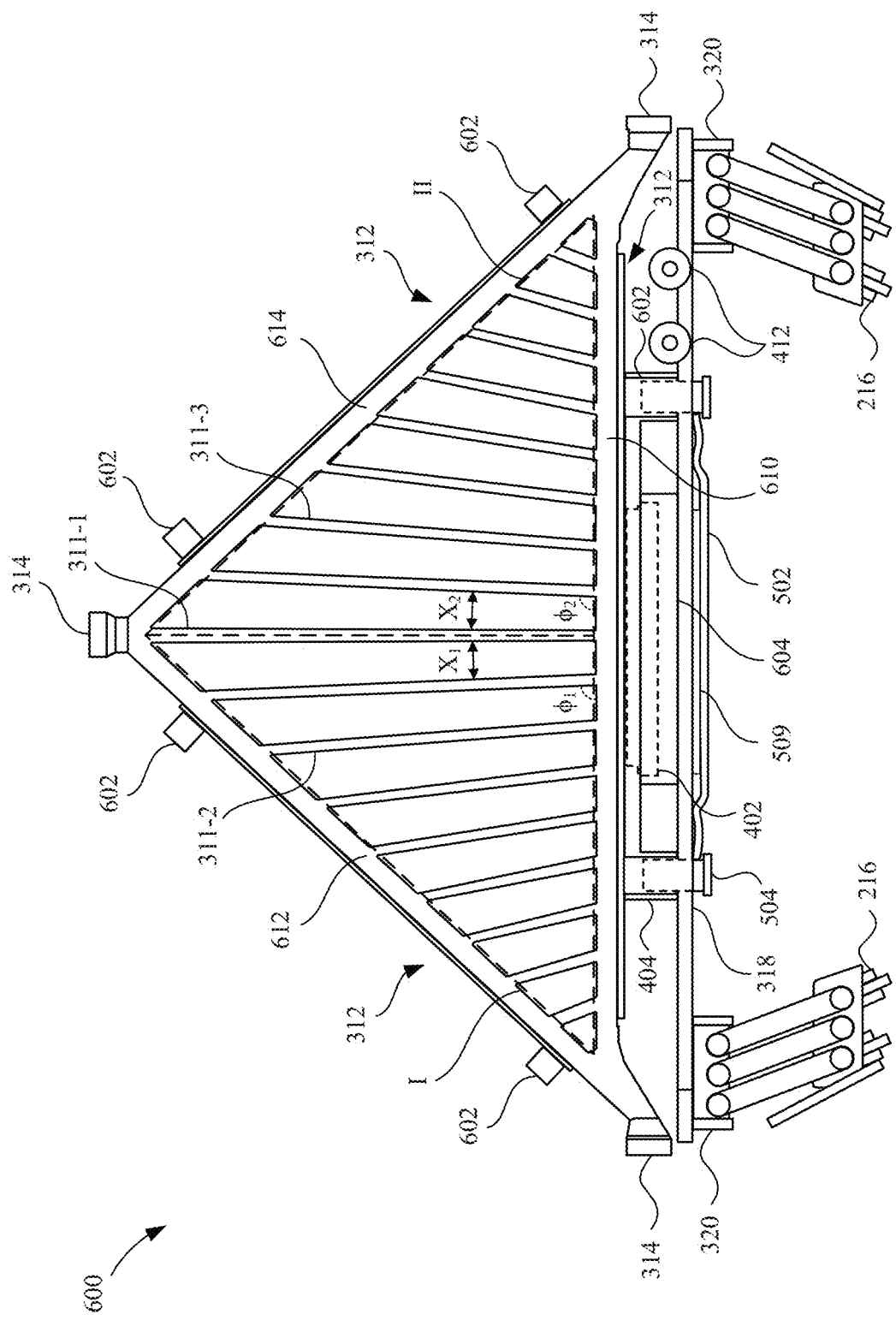
FIG. 6 illustrates a top view of the CPU board mounted to a structural core/heat sink of the compact computing system in accordance with some embodiments.

FIG. 6 illustrates a top view of the CPU board 318 mounted to the structural core/heat sink 310 of the central core 200 of internal components of the compact computing system 100. Between each pair of vertical stanchions 314 of the structural core/heat sink 310, a vapor chamber assembly 312 can be mounted to a face of the structural core/heat sink 310. In a representative embodiment, the CPU board 318 can be attached to the structural core/heat sink 310 through a set of attachment points 602 that project through (and/or are integral with) the vapor chamber assembly 312 along the face of the structural core/heat sink 310. Fasteners 504 can be driven through the CPU spring 502 and openings 408 of CPU board 318 to engage attachment points 602. In conjunction with CPU spring 502, fasteners 504 can apply a force that both establishes a robust thermal contact between a raised portion of the CPU 402 and vapor chamber assembly 312 and securely attaches the CPU board 318 to the structural core/heat sink 310.

As described above, DC power can be supplied to the CPU board 318 through one or more connectors (DC inputs 412) located at the top edge of the CPU board 318. In an embodiment, the DC inputs 412 can be located on the top edge of the CPU board 318 opposite to the bottom edge of the CPU board 318 that can include a high-speed edge connector through which high-speed data can be communicated to the interconnect board 316. On the left and right edges of the CPU board 318, two DIMM mechanisms 320 can be mounted on the side of the CPU board 318 facing away from the structural core/heat sink 310 (and therefore on the opposite side of the board from the CPU 402.) The DIMM mechanisms 320 can provide for guiding and holding in place one or more memory modules 216, e.g., full size DIMMs. In an embodiment, the DIMM mechanisms 320 can be tilted inward toward the center of the CPU board 318 when in a locked position (e.g., when the compact computing system 100 is assembled and operational) and can be tilted outward away from the center of the CPU board 318 in an unlocked position (e.g., when providing for insertion and/or removal of the memory modules 216 from the DIMM sockets and DIMM mechanisms 320).

In one embodiment, a cooling fin (referred to as center cooling fin 311-1) can extend from first planar face 610 to a junction of second planar face 612 and third planar face 614. In this way, the triangular central volume defined by heat sink 310 is bisected into first region I and second region II each having similar right triangular cross sections. In one embodiment, first cooling fin 311-2 spanning region I can be at first angle Ø1 with respect to first planar face 610. First angle Ø1 can have an angular value that varies in accordance with a distance $X_1$ between first cooling fin 311-2 and central cooling fin 311-1. Similarly, second cooling fin 311-3 spanning region II can be at first angle Ø2 with respect to first planar face 610. Second angle Ø2 can have an angular value that also varies in accordance with a distance $X_2$ between second cooling fin 311-3 and central cooling fin 311-1. Generally speaking, distance $X_1$ and distance $X_2$ are about equal, however, the number of cooling fins actually implemented in either regions I or II can vary as required for a particular design as can the various geometric relationships. In one embodiment, a summation of first angle Ø1 and second angle Ø2 can be about 180°.

Figure 7:
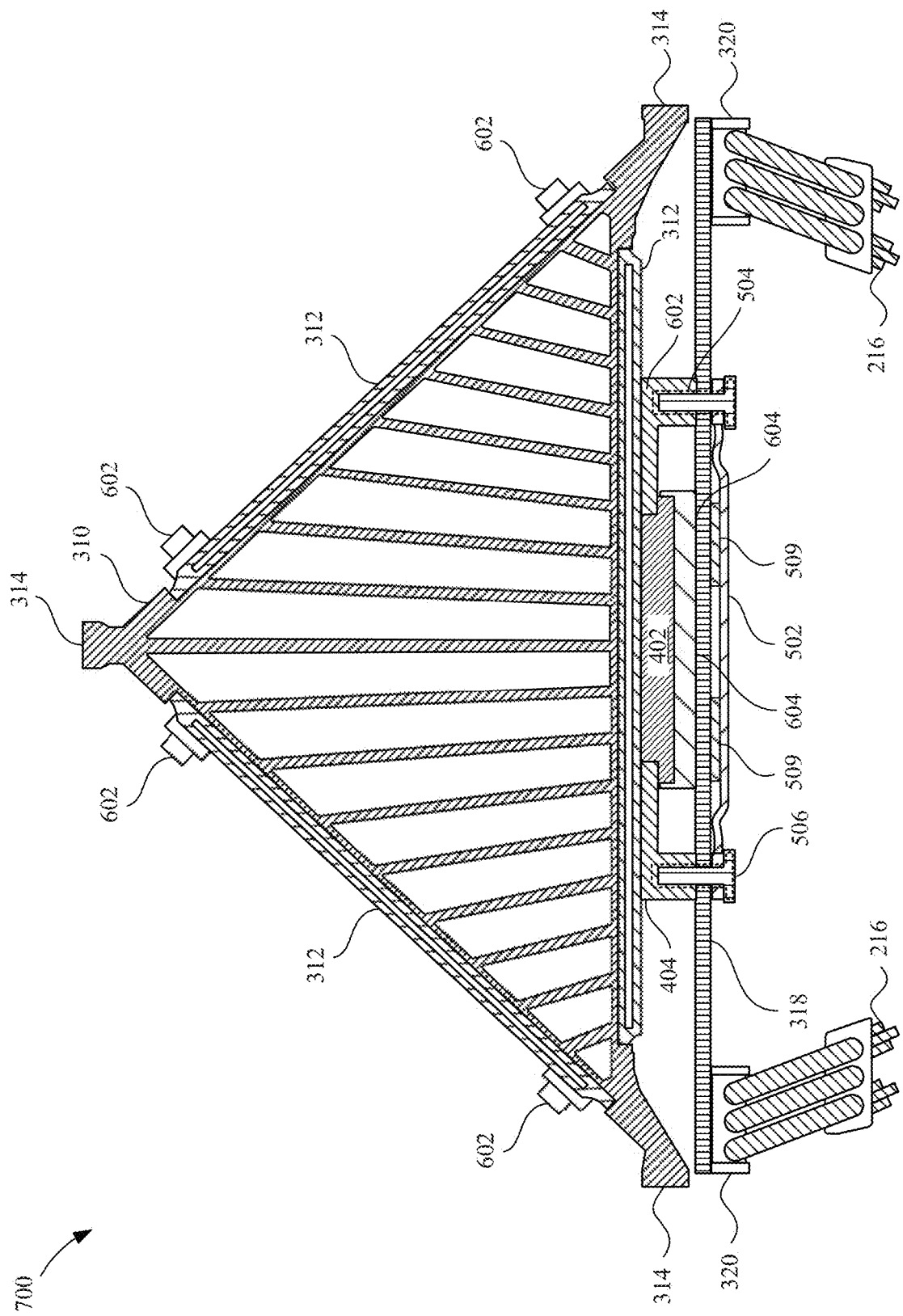
FIG. 7 illustrates a cross sectional view of the CPU board mounted to the structural core/heat sink of the compact computing system in accordance with some embodiments.

FIG. 7 illustrates a cross sectional view 700 of the CPU board 318 mounted to the structural core/heat sink 310 of the compact computing system 100 in accordance with some embodiments. The cross-sectional view 700 of the CPU board 318 can correspond to a section line A-A depicted in FIG. 5 through at least a portion of the central core 200 of components of the compact computing system 100. FIG. 7 depicts how the CPU 402 can be secured to socket 604 using low profile thermal module 404. In some embodiments, low profile thermal module 404 can have an opening having a size in accordance with a raised portion of the CPU 402. In this regard, the raised portion can pass through the opening of low profile thermal module 404 so that it can be in direct thermal contact with the vapor chamber assembly 312.

In this regard, in addition to seating CPU 402, low profile thermal module 404 can have threaded apertures into which fasteners 506 can be engaged. Fasteners 506 can pass through openings 406 of CPU board 318, openings in spring 502 to engage the threaded apertures in low profile thermal module 404.

Figure 8:
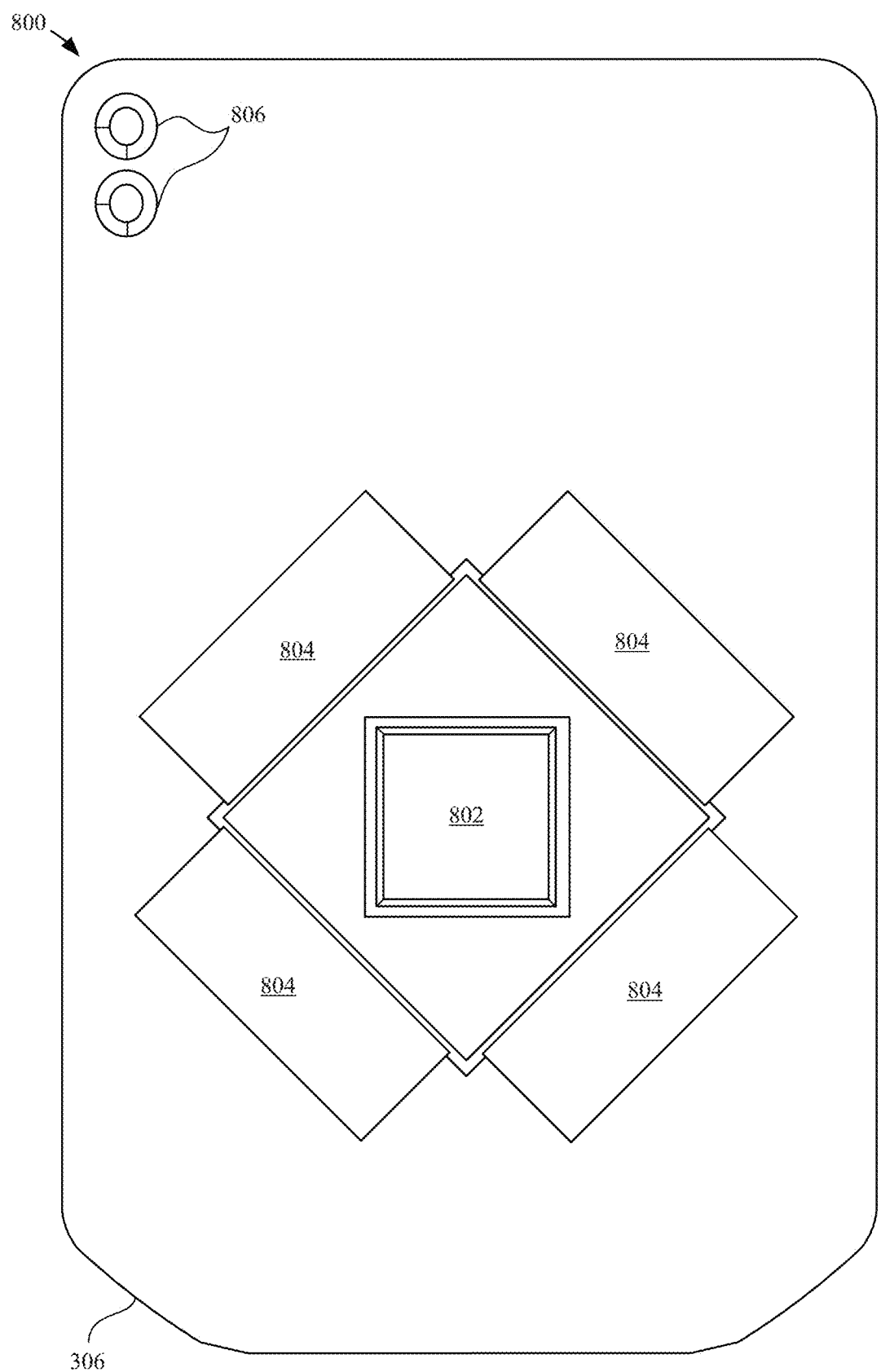
FIG. 8 illustrates a view of a first side of a graphics processing unit (GPU) board in accordance with some embodiments.

FIG. 8 illustrates a view of a first side 800 of a graphics processing unit (GPU) board in accordance with some embodiments. A GPU 802 can be centrally mounted on the GPU board 306, and one or more video random access memory (VRAM) 804 units can be positioned symmetrically about the GPU 802. In a representative embodiment, the GPU 802 and the VRAM 804 can be mounted on the same side of the GPU board 306, which can be placed in contact with the vapor chamber assembly 312 embedded within a face of the structural core/heat sink 310. In an embodiment, a GPU thermal module spring can compress the GPU 802 against the vapor chamber assembly 312, providing thermal coupling of the GPU 802 to the structural core/heat sink 310, when the GPU board 306 is mounted to the structural core/heat sink 310 through a set of attachment points 602. In some embodiments, the VRAM 804 can also contact the vapor chamber assembly 312 to provide a thermal conduction path to the structural core/heat sink 310 when the GPU board 306 is attached thereto. In an embodiment, the layout of VRAM 804 around the GPU 802 can arrange the VRAM 804 to permit approximately equal airflow across and/or adjacent to the VRAM 804 when the GPU board 306 is attached to the structural core/heat sink 310.

In an embodiment, the GPU board 306 can include one or more power connection points (indicated in FIG. 8 as GPU DC inputs 806) at the top edge of the GPU board 306 through which DC power can be supplied from the PSU 322. As described above for the CPU board 318, the GPU board 306 can include DC/DC power regulation at a top edge of the GPU board 306 and a high-speed digital data connection from the bottom edge of the GPU board 306. In an embodiment, the GPU board 306 can connect to the interconnect board 316 through a high-speed flex connector. In some embodiments, the high-speed flex connector also provides an air baffle to bifurcate airflow from the inlet/base 104 into a central airflow through the structural core/heat sink 310 and the peripheral airflow 214 across the surface of the internal component boards. In an embodiment, the high-speed flex connector also spreads the peripheral airflow 214 to provide airflow along the outer sections of the GPU board 306, e.g., across and/or adjacent to the VRAM 804.

Figure 9:
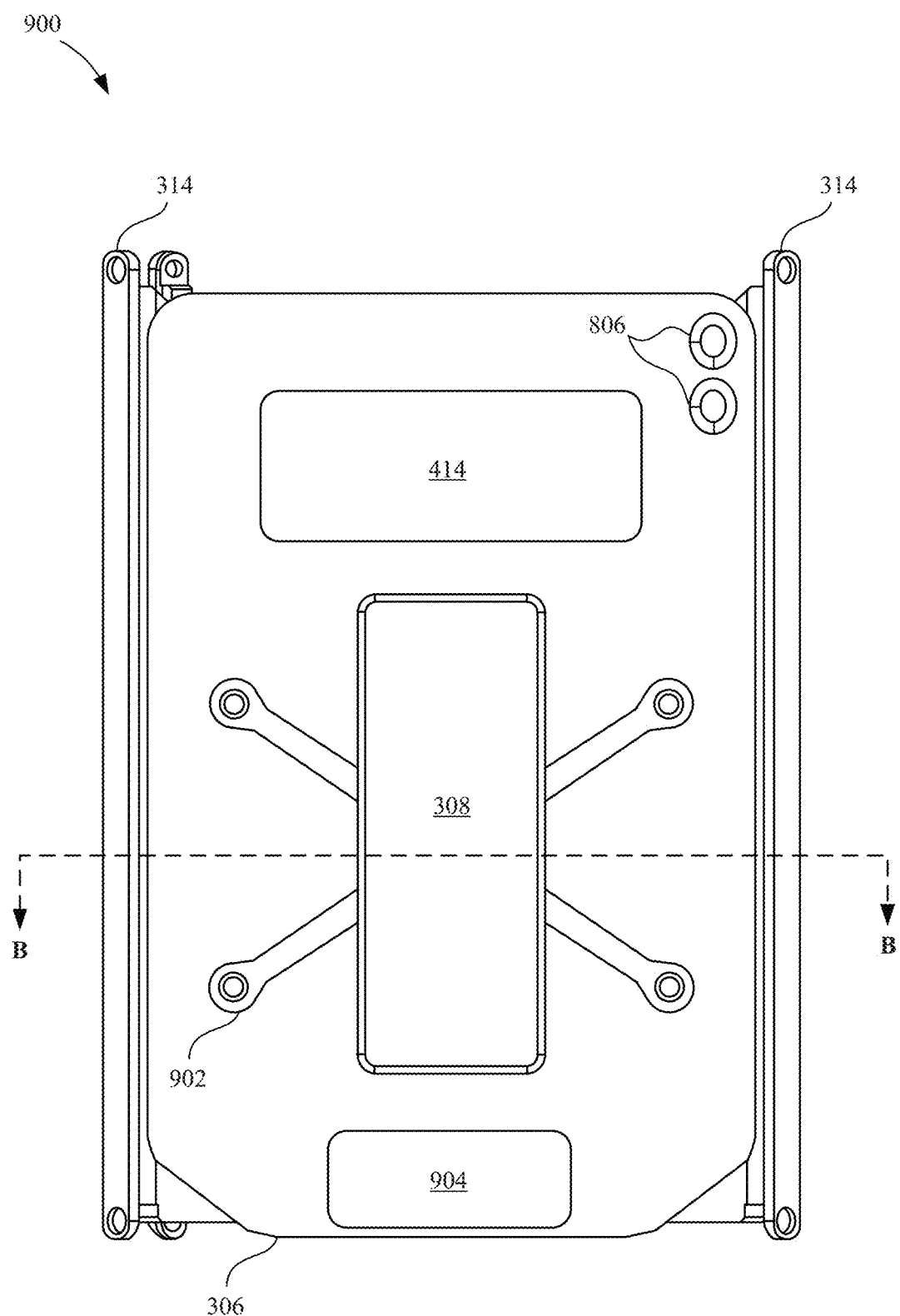
FIG. 9 illustrates a view of a second side of the GPU board in accordance with some embodiments.

FIG. 9 illustrates a second side 900 of the GPU board 306 in accordance with some embodiments. As described above, the GPU board 306 can be mounted with the GPU 802 and VRAM 804 facing toward and in thermal contact with the structural core/heat sink 310, e.g., using attachment points 602 that are connected to and/or an integral part of the structural core/heat sink 310 and/or the vapor chamber assembly 312. In an embodiment, a GPU thermal module spring 902 can be used at least in part to attach the GPU board 306 to the structural core/heat sink 310 by the attachment points 602. In an embodiment, the GPU thermal module spring 902 can compress the GPU 802 against the vapor chamber assembly 312 to provide positive thermal contact between the GPU 802 and the structural core/heat sink 310, e.g., through the vapor chamber assembly 312 mounted on and/or embedded in the face of the structural core/heat sink 310.

In some embodiments, the GPU thermal module spring 902 can also cause all or a portion of the VRAM 804 adjacent to the GPU 802 to contact the vapor chamber assembly 312, thereby providing thermal contact for cooling of the VRAM 804. In some embodiments, the GPU board 306 can be provided one or more DC voltages through one or more GPU DC inputs 806 located at a top edge of the GPU board 306. In some embodiments, a DC/DC regulation section 414 can regulate and convert the one or more DC voltages to provide DC power to the components of the GPU board 306. In an embodiment, the GPU board 306 can include a GPU rigid flex connector socket 904 located along a bottom edge, (opposite of the top edge to which the DC power can be supplied), through which a high-speed flex connector can communicate data to the interconnect board 316. In some embodiments, a solid state drive (SSD) 308 can be mounted along the major axis 210 of the GPU board 306 in the center (side to side) of the GPU board 306 across the back side of the GPU 802 and spanning the GPU thermal module spring 902, as illustrated in FIG. 9. In an embodiment, a layout of components on the GPU board 306 can place taller components toward a central middle line (top to bottom) of the GPU board 306 and shorter components toward the outer sides of the GPU board 306.

In some embodiments, multiple components of the GPU board 306 can be stacked along a central major axis 210 of the GPU board 306 (e.g., GPU 802, GPU thermal module spring 902, and SSD 308) in a region of the interior of the compact computing system that can accommodate a greater height of components than adjacent regions. In some embodiments, the GPU board 306, when mounted to the structural core/heat sink 310 and placed on the inlet/base 104 within the external housing 102, can form a segment of a chord across the interior of the external housing 102, with a larger volume available for component placement along the middle of the segment of the chord and a smaller volume available for component placement along the outer portions of the segment of the chord. In some embodiments, component placement on the GPU board 306 can be arranged to accommodate the volume constraints imposed by the position of the GPU board 306 relative to the external housing 102.

Figure 10:
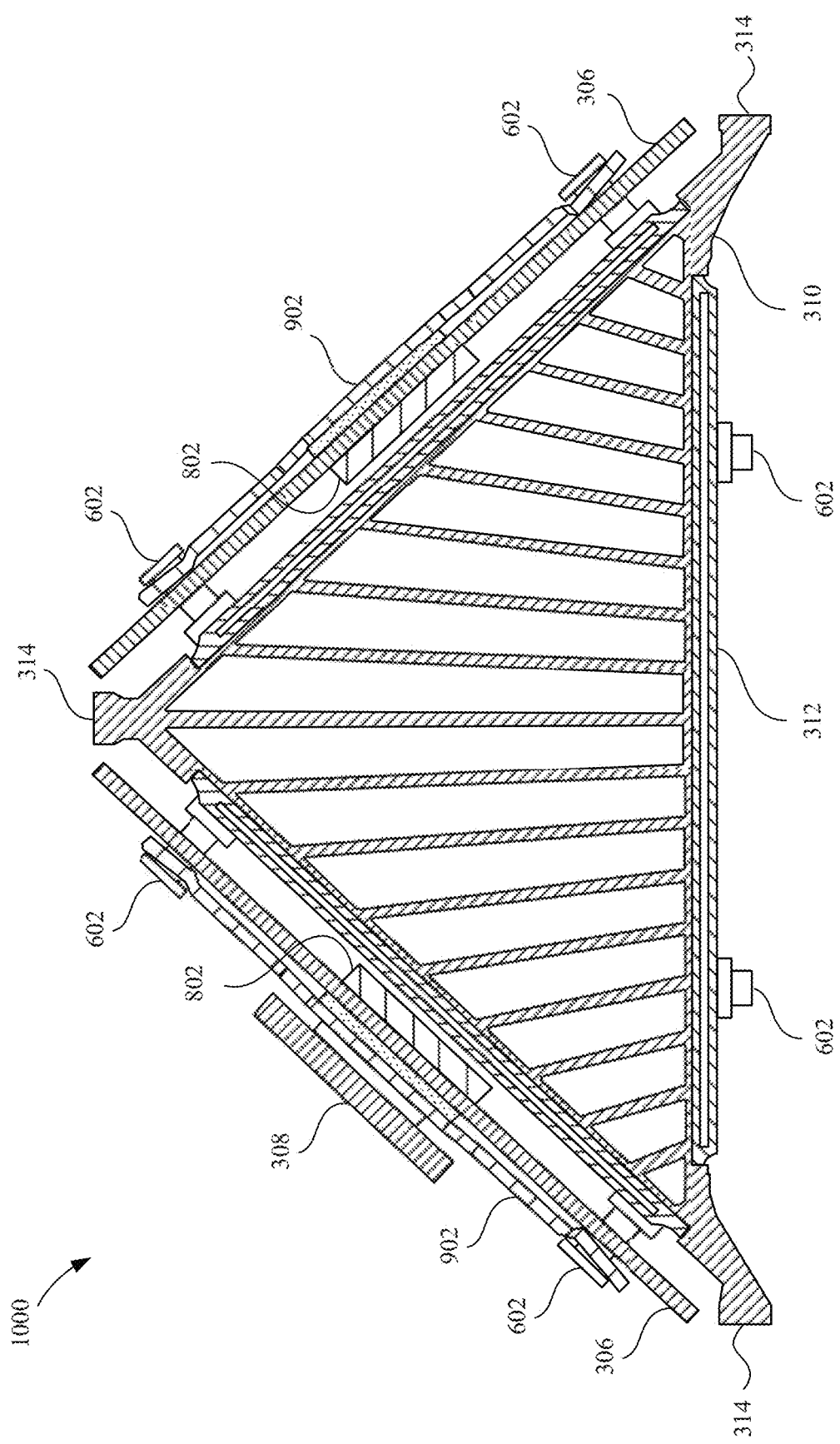
FIG. 10 illustrates a cross sectional view of the GPU board mounted to the structural core/heat sink of the compact computing system in accordance with some embodiments.

FIG. 10 illustrates a cross sectional view 1000 of the GPU board 306 mounted to the structural core/heat sink 310 of the compact computing system 100 in accordance with some embodiments. The cross sectional view 1000 can correspond in some embodiments, to a view that cuts along line B indicated in FIG. 9 through at least a portion of the central core 200 of components of the compact computing system 100. The GPU board 306 can be mounted to a face of the structural core/heat sink 310 with the GPU 802 contacting a surface of the vapor chamber assembly 312, which can be attached to and/or embedded in the face of the structural core/heat sink 310. The GPU thermal module spring 902, in an embodiment, can compress the GPU 802 against the vapor chamber assembly 312. In an embodiment, the GPU board 306 can attach to the structural core/heat sink 310 through a set of attachment points 602 that protrude from the structural core/heat sink. In an embodiment, separate GPU boards 306 can be mounted to each of two faces of the structural core/heat sink 310, and the CPU board 318 can mount to a third face of the structural core/heat sink 310. In an embodiment, the solid state drive 308 can mount across the GPU thermal module spring 902 on side of the GPU board 306 opposite to the side on which the GPU 802 can be mounted.

Figure 11:
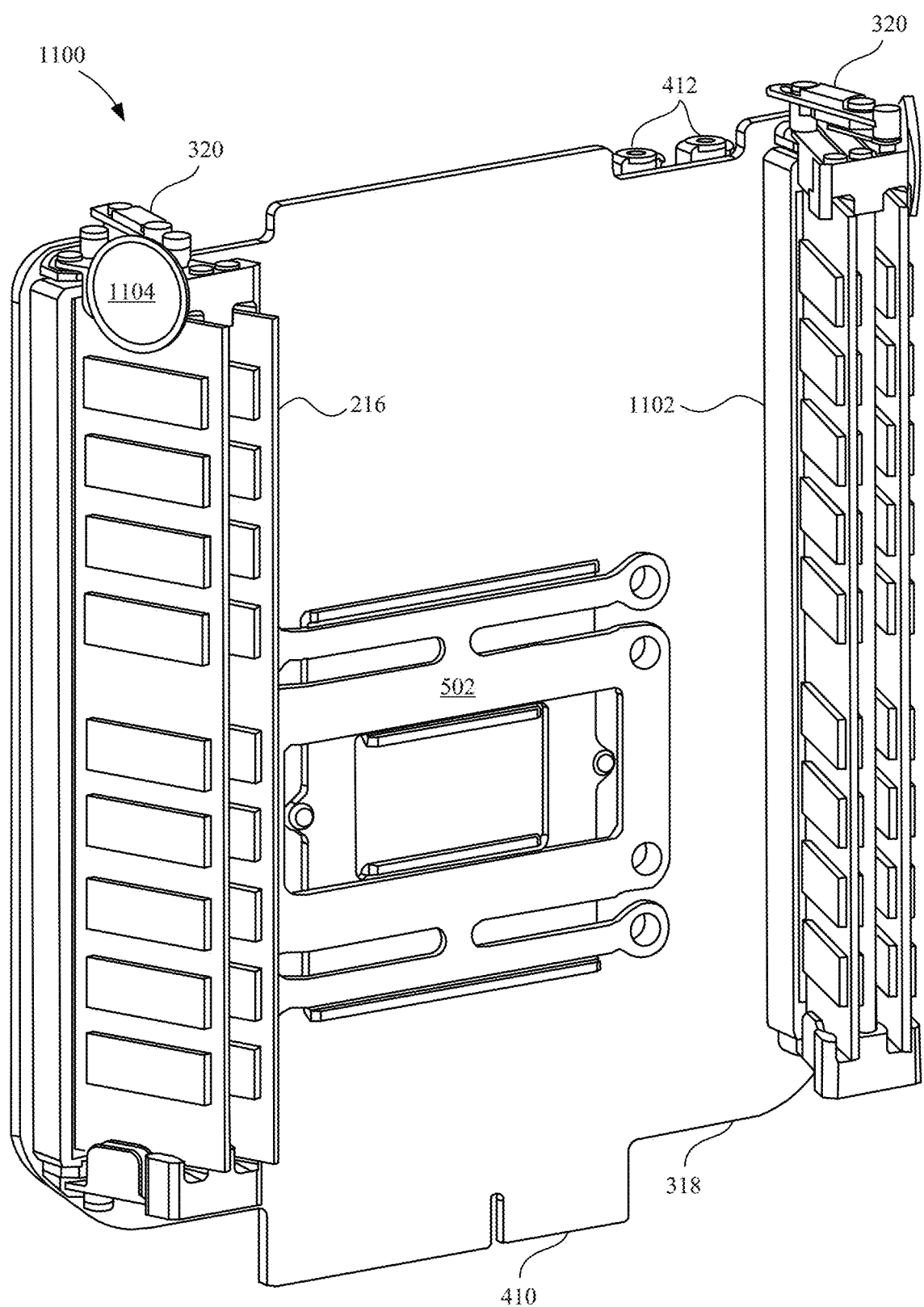
FIG. 11 illustrates a perspective view of the CPU board that includes DIMM mechanisms attached thereto in accordance with some embodiments.

FIG. 11 illustrates a perspective view 1100 of the CPU board 318 that includes DIMM mechanisms 320 attached thereto in accordance with some embodiments. In an embodiment, the CPU board 318 includes a CPU 402 mounted on a side opposite the CPU spring 502 illustrated in FIG. 11. In an embodiment, the DIMM mechanisms 320 and the CPU 402 are mounted on opposite sides of the CPU board 318. In an embodiment, DC power is supplied through one or more DC inputs 412 at a top edge of the board above the CPU 402, and high-speed digital signals are communicated through a bottom edge of the board below the CPU 402, e.g., through the CPU board edge connector 410. In an embodiment, the DIMM mechanism 320 provides a guide, torsional support, a tilting function, and a lock/unlock function for memory modules 216 installed therein. In an embodiment, the DIMM mechanism 320 includes a DIMM mechanism actuator 1104, which the user can engage to tilt, to lock, and to unlock the DIMM mechanism 320. It should be noted that although actuator 1104 is hereinafter referred to as button 1104, it is contemplated that any type of mechanism suitable for actuating DIMM mechanism 320 is possible.

In an embodiment, the DIMM mechanism 320 includes guides to seat the memory modules 216 into a DIMM connector base 1102 mounted to the CPU board 318. In an embodiment, the DIMM connector base 1102 is mounted to the CPU board 318 as a press fit connector. In an embodiment, the user can engage the DIMM mechanism 320 by pushing on the DIMM mechanism button 1104 to switch the DIMM mechanism 320 from an unlocked (tilted outward) position to a locked (tilted inward) position, e.g., to lock the memory securely in sockets in the DIMM connector base 1102. The user can also engage the DIMM mechanism 320 by pushing on the DIMM mechanism button 1104 to switch the DIMM mechanism 320 from the locked position to an unlocked position, e.g., in order to remove, replace, or install memory modules 216 in the DIMM mechanism 320. In an embodiment, the DIMM mechanism 320 provides for a short over-travel distance when a user presses the DIMM mechanism button 1104 and the DIMM mechanism 320 is in the locked position. In an embodiment, the DIMM mechanism 320 provides for a spring-loaded action to tilt the DIMM mechanism 320 from the inward locked position to an outward unlocked position after the user presses the DIMM mechanism button 1104.

Figure 12:
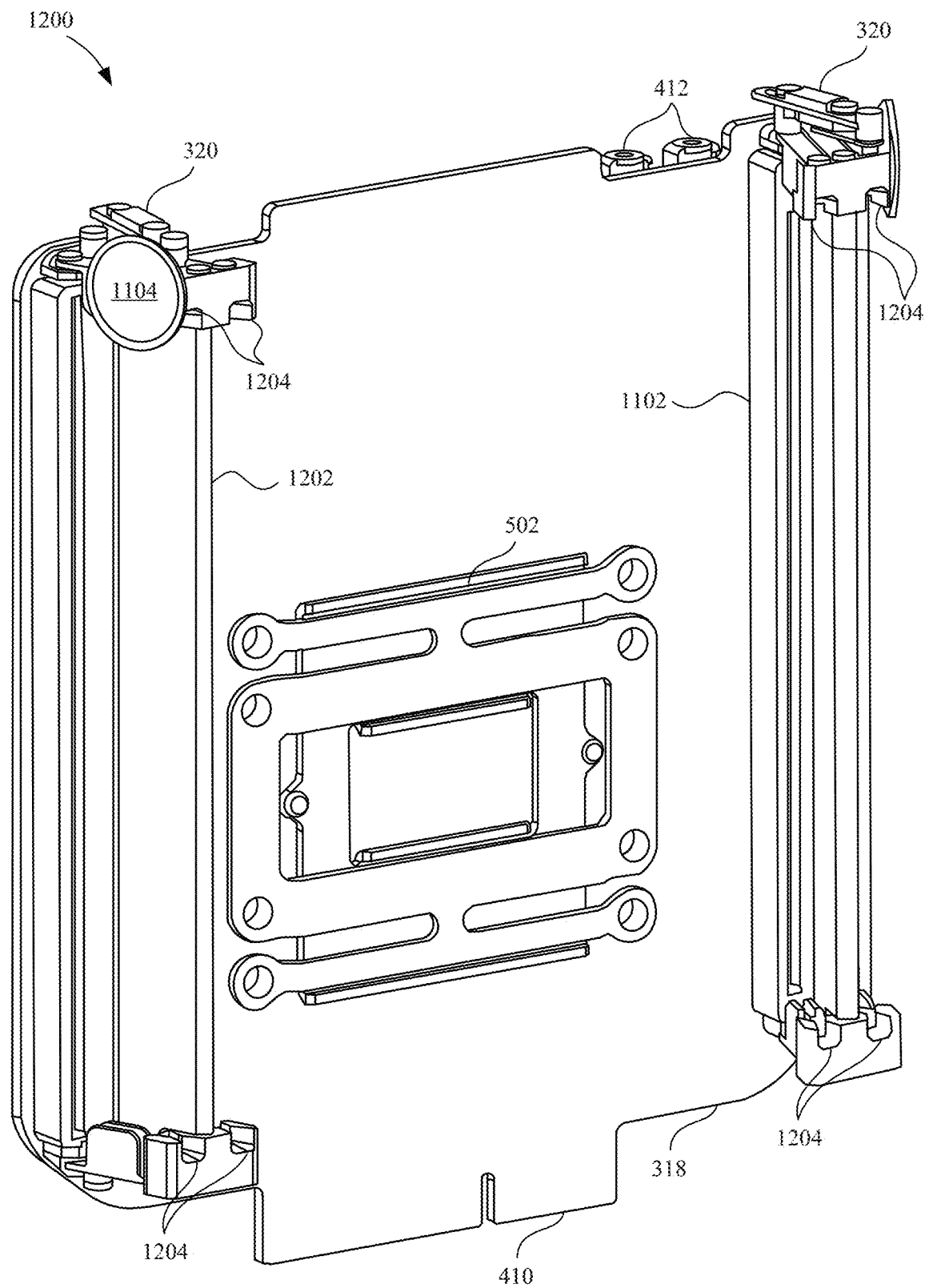
FIG. 12 illustrates another perspective view of the CPU board that includes DIMM mechanisms attached thereto in accordance with some embodiments.

FIG. 12 illustrates another perspective view 1200 of the CPU board 318 that includes DIMM mechanisms 320 attached thereto in accordance with some embodiments. The DIMM mechanisms 320 illustrated in FIG. 11 are populated with memory modules 216 installed, while the DIMM mechanisms 320 illustrated in FIG. 12 are empty, with no memory modules 216 installed. The DIMM mechanism 320 can include a torsion bar 1202 that links the two ends of the DIMM mechanism 320 together and provides for force applied to one end of the DIMM mechanism 320, e.g., to the DIMM mechanism button 1104, to transfer and apply to the other end of the DIMM mechanism 320. The DIMM mechanism 320 can also include DIMM guides 1204 that assist the user to properly align and seat the memory modules 216 when inserting into the DIMM mechanism 320 to connect with the DIMM connector base 1102. In some embodiments, the DIMM mechanism 320 can accommodate memory modules 216 that are "full size" DIMMs having a length of approximately 133 mm, (e.g., as used in desktop personal computers).

In an embodiment, the DIMM mechanism 320 can accept insertion of the memory modules 216 at an acute angle (not perpendicular) to the DIMM connector base 1102. In some embodiments, a user can insert a memory module 216 into the DIMM mechanism 320 at an acute angle in an unlocked position and rotate the DIMM mechanism 320 into a locked position by pressing at one side of the DIMM mechanism 320, e.g., on the DIMM mechanism button 1104. In some embodiments, the torsion bar 1202 of the DIMM mechanism 320 transfers at least a portion of a force exerted by the user on one end of the DIMM mechanism 320, e.g., by pressing the DIMM mechanism button 1104, to an opposite end of the DIMM mechanism 320, e.g., to assist in rotating, locking, positioning, and/or actuating the full length DIMM in a socket of the DIMM connector base 1102.

Figure 13A:
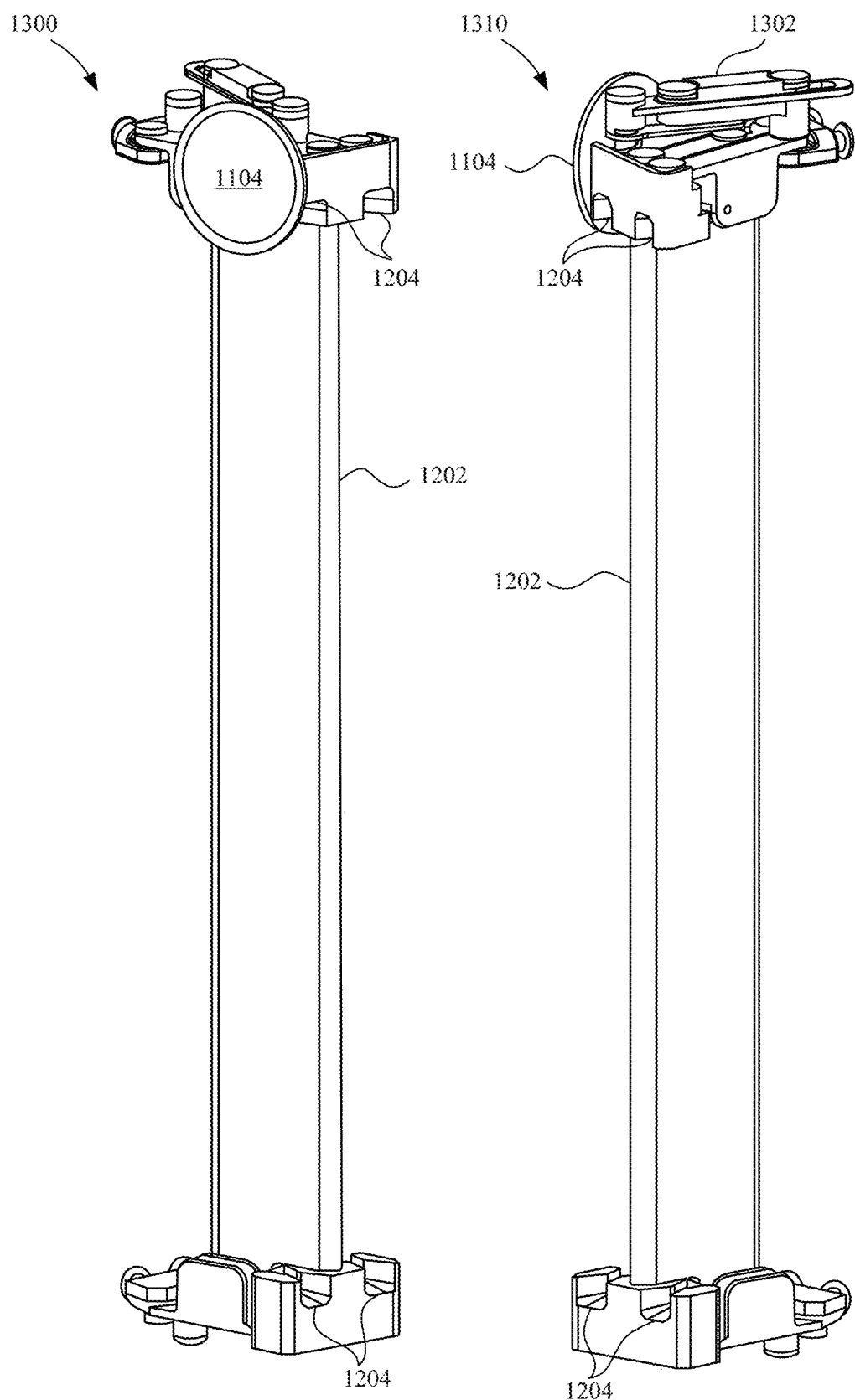
FIGS. 13A-13C illustrates perspective views of various embodiments of a DIMM mechanism.

FIG. 13A illustrates a front perspective view 1300 and a back perspective view 1310 of the DIMM mechanism 320 in accordance with some embodiments. Each end of the DIMM mechanism 320 can include a push/push DIMM lock mechanism 1302 that provides for angling the DIMM mechanism 320 (including the memory modules 216 installed therein) into an interior of the compact computing system 100 when in a locked, operational position and angling at least a portion of the DIMM mechanism 320 outside a circular region bounded by the external housing 102 when in an unlocked position for installation and removal of the memory modules 216. Each end of the DIMM mechanism 320 connects to an opposing end of the DIMM mechanism 320 by the torsion bar 1202.

One end of the DIMM mechanism 320 can include the DIMM mechanism button 1104, through which the user can press to tilt the DIMM mechanism 320 into a locked position or to release the DIMM mechanism 320 from a locked position into an unlocked position. In an embodiment, as the DIMM mechanism 320 tilts, the memory modules 216 contained therein also tilt. In some embodiments, a user can press on one or multiple surfaces of the DIMM mechanism 320 to tilt the memory modules 216 into a locked position or into an unlocked position. In some embodiments, a user can press on a surface of the memory module 216 to tilt the DIMM mechanism 320 (and the memory modules 216 contained therein) into a locked position or to release a latch and tilt the DIMM mechanism 320 (and the memory modules 216 contained therein) into an unlocked position. In some embodiments, "lock" and "unlock" (and other forms of these words) can also be referred to as "latch" and "unlatch" (as well as other synonymous words).

Figure 13B:
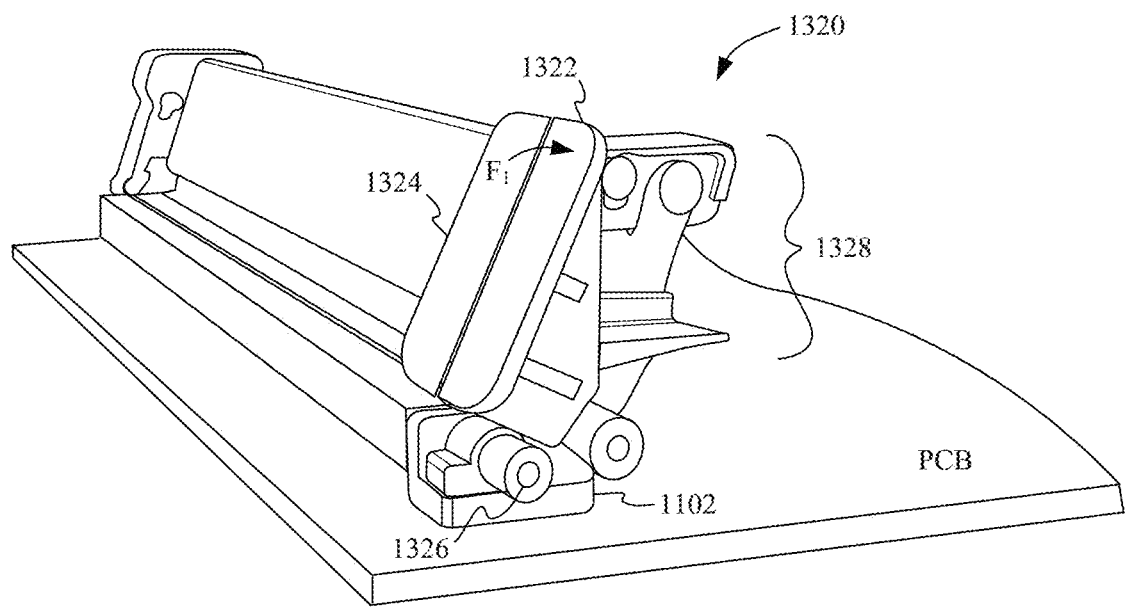
Figure 13C:
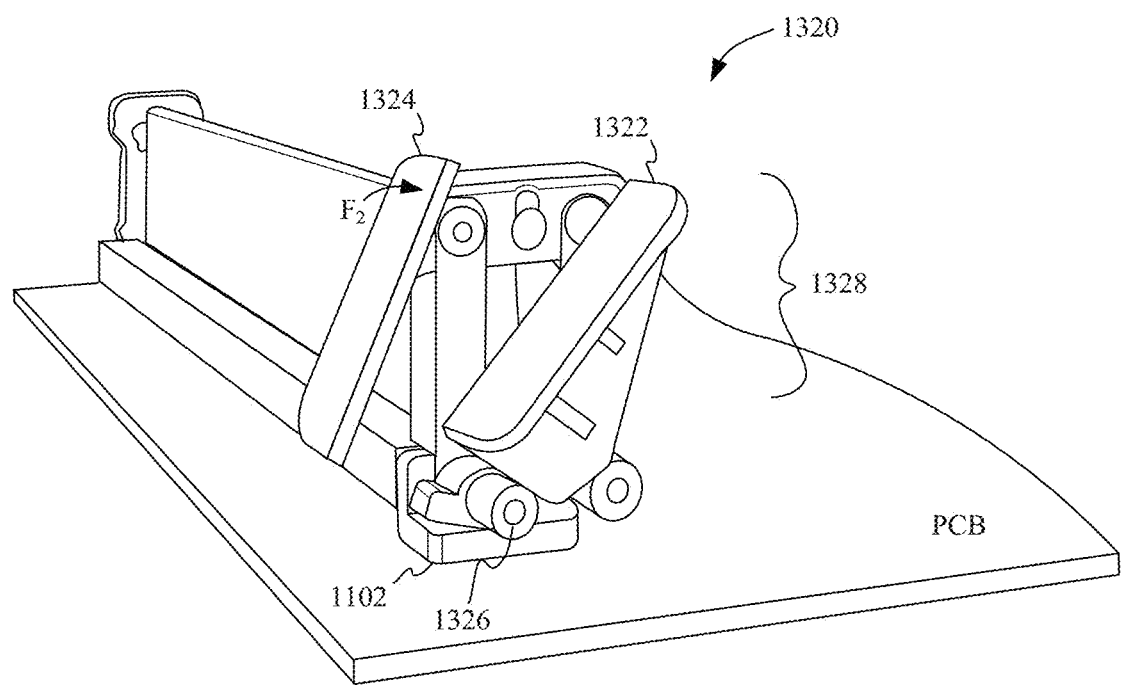

FIGS. 13B and 13C illustrates another embodiment of a dual inline memory module (DIMM) mechanism. More specifically, FIG. 13B shows front perspective view of DIMM mechanism 1320 in a closed, or latched, configuration whereas FIG. 13C shows DIMM mechanism 1320 in an open, or unlatched, configuration. In an embodiment, in the unlocked position, the memory modules 216 positioned within the DIMM mechanism 1320 are substantially perpendicular to the printed circuit board to which the DIMM mechanism 1320 can be attached through the DIMM connector base 1102. In this embodiment, DIMM mechanism 1320 can include first actuator 1322 and second actuator 1324. In an embodiment, first actuator 1322 and second actuator 1324 are configured to present an appearance of a single piece in keeping with presenting a clean and aesthetically pleasing appearance. In any case, first actuator 1322 and second actuator 1324 are designed in such a way as to resist opening (unlatching) of DIMM mechanism 1320 in spite of a high shock load applied to housing 102. More specifically, unless acted upon in a specific manner, DIMM mechanism 1320 remains in the latched configuration thereby securing dual inline memory module (DIMM) 216 within. Accordingly, DIMM mechanism 1320 can secure DIMM 216 in the latched configuration whereas DIMM mechanism 1320 can render DIMM 216 accessible and available for removal (or replacement) in the unlatched configuration.

As shown in FIG. 13B, first actuator 1322 and second actuator 1324 are co-planar with respect to each other presenting a compact, well defined, and aesthetically pleasing structure. In order to access and release DIMM 216 secured by DIMM mechanism 1320 (or make DIMM mechanism 1320 available to receive a new or replacement DIMM), first force F1 can be applied directly to actuator 1322. In an embodiment, first force F1 must overcome a biasing force applied by a biasing member (shown in more detail in FIG. 15B) that causes first actuator 1322 to move about pivot 1326 causing DIMM locking mechanism 1328 to tilt from a locked position as shown in FIG. 13B to an unlocked position shown in FIG. 13C. In an embodiment, as DIMM mechanism 1320 tilts, the DIMM 216 contained therein also tilt providing easy user access that facilitates removal or insertion of memory DIMM 216. It should also be noted, that as locking mechanism 1328 tilts from the latched to the unlatched position (and vice versa), second actuator 1324 moves in such a way that an orientation of second actuator 1324 in the latched and unlatched configuration remain essentially unchanged with respect to DIMM base 1102. In this way, second actuator 1324 is well position for the user to apply latching force F2 to second actuator 1324 causing locking mechanism 1328 to tilt back to the latched position and first actuator 1322 to undergo a second movement around pivot 1326.

Figure 14:
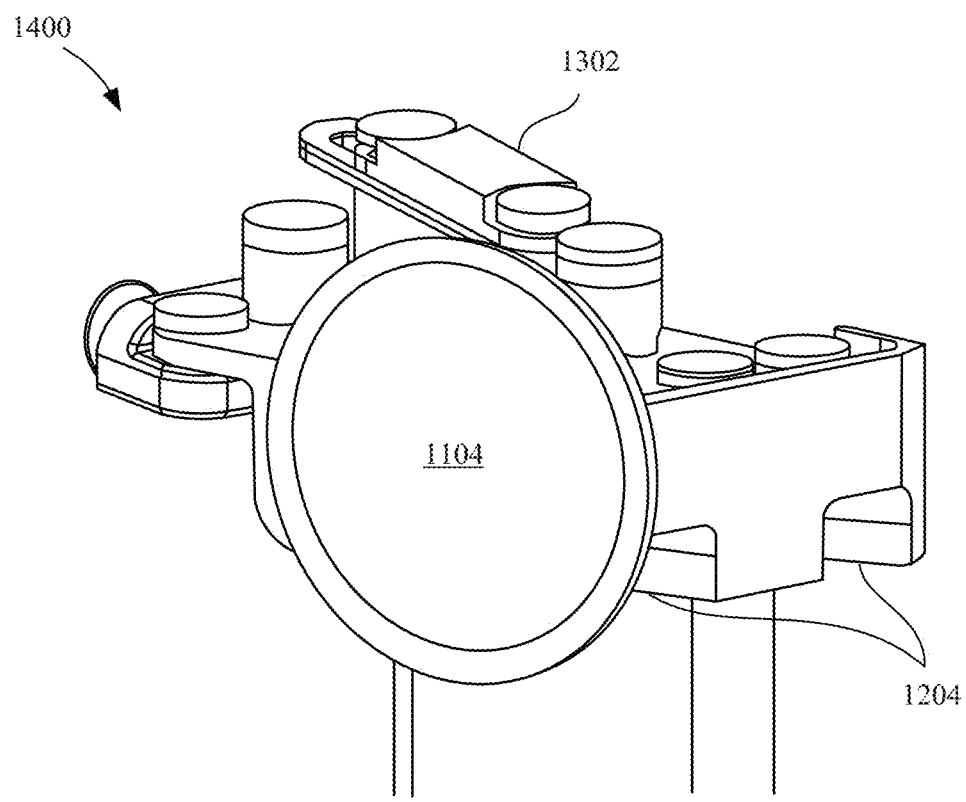
FIG. 14 illustrates a front perspective view and a back perspective view of an end of the DIMM mechanism in accordance with some embodiments.
Figure 14:
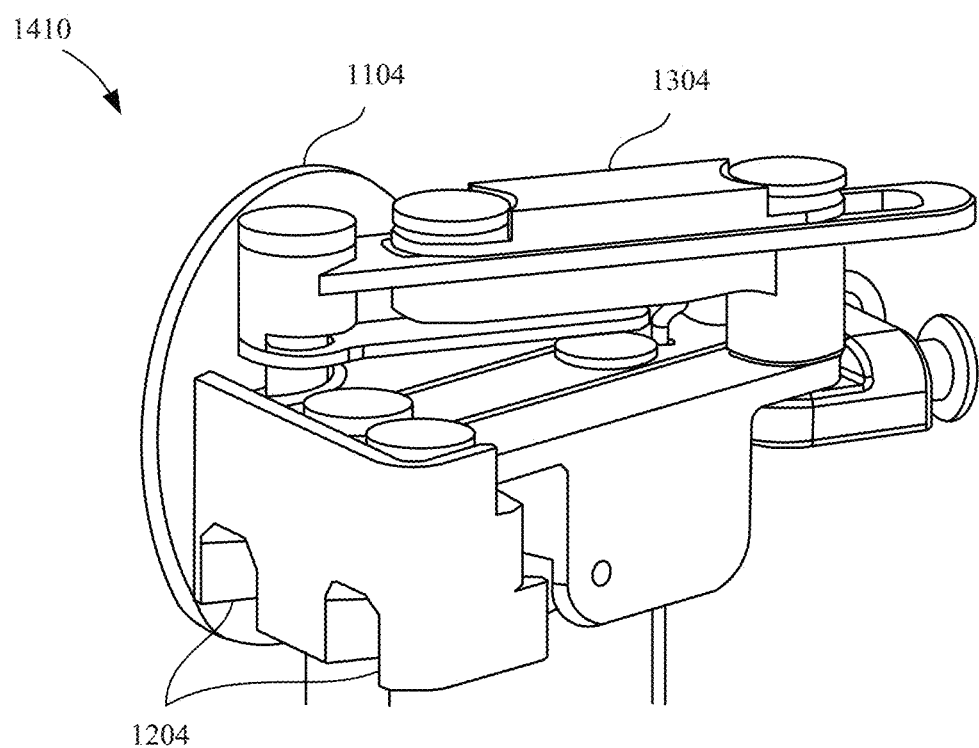

FIG. 14 illustrates a front perspective view 1400 and a back perspective view 1410 of an end of the DIMM mechanism 320 that includes the DIMM mechanism button 1104 in accordance with some embodiments. The DIMM mechanism 320 at each end can include a push/push DIMM lock mechanism 1302 that includes multiple interconnected bars that form a movable linkage assembly. One end of the DIMM mechanism 320 can include the DIMM mechanism button 1104, and each end of the DIMM mechanism 320 can include DIMM guides 1204 to align the memory modules 216 upon insertion. In some embodiments, the DIMM mechanism 320 can block an improperly inserted memory module 216 from engaging with a socket in the DIMM connector base 1102.

In some embodiments, the DIMM mechanism 320 can reject an improperly inserted memory module 216. In some embodiments, the DIMM mechanism 320 can prevent a user from latching an improperly inserted memory module 216 into a locked position. In some embodiments, the DIMM mechanism 320 can be not capable of latching into a locked position when a memory module 216 is improperly inserted therein. In some embodiments, the DIMM guides 1204 can assist, at least in part, a user to insert a memory module 216 in a correct orientation for properly engaging the DIMM mechanism 320. In some embodiments, the DIMM mechanism 320 includes retention features that hold the memory module 216 in a correct position when in the locked position. In some embodiments, one or more "hold down" features can translate into a position that retains the memory module 216 in a proper position in the DIMM mechanism 320 when in a locked position.

Figure 15A:
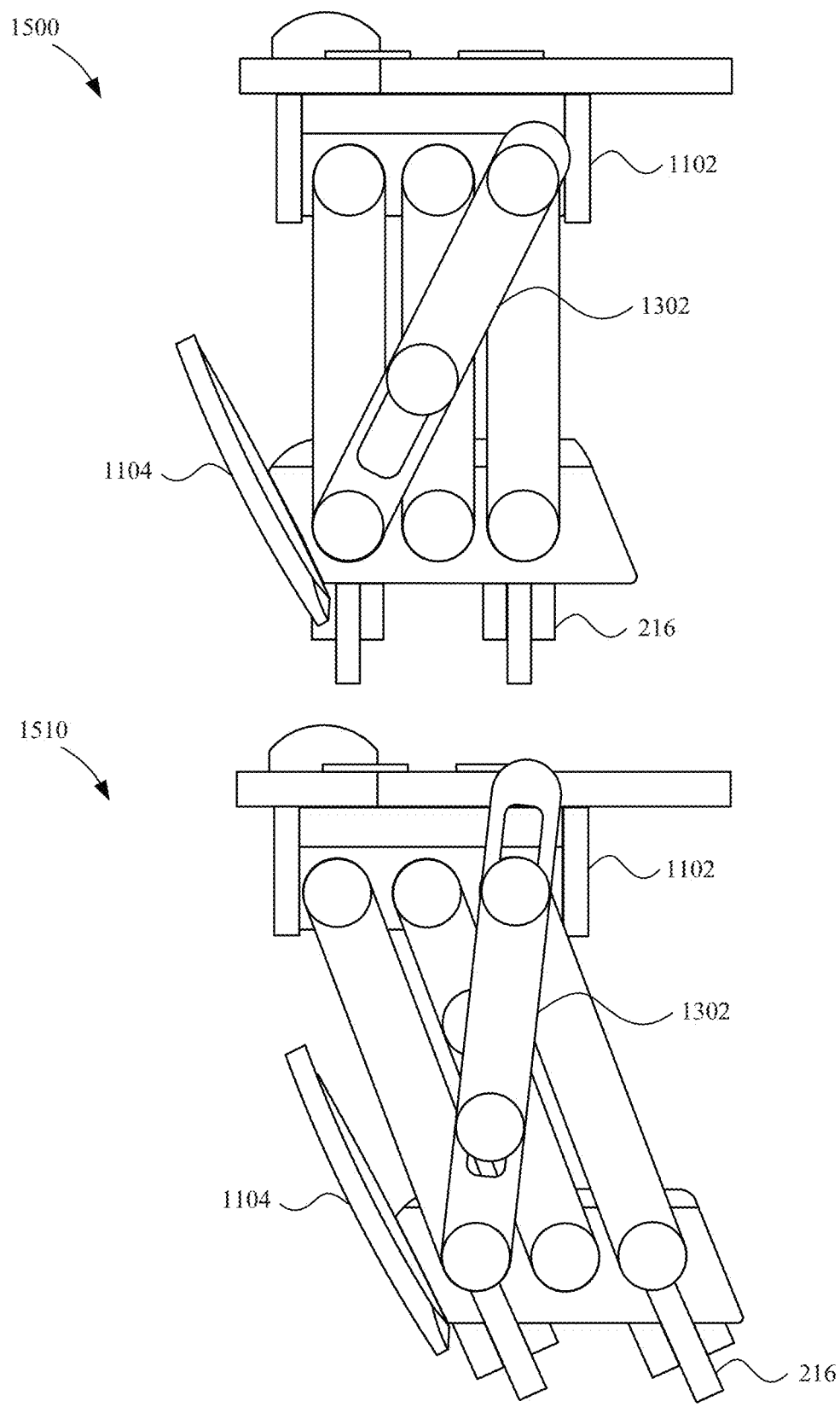
FIGS. 15A-15D illustrates a view of embodiments of a DIMM mechanism in an unlocked position and in a locked position.

FIG. 15A illustrates a first end view 1500 of the DIMM mechanism 320 in which the push/push DIMM lock mechanism 1302 is oriented in an unlocked position and a second end view 1510 of the DIMM mechanism 320 in which the push/push DIMM lock mechanism 1302 is oriented in a locked position. In an embodiment, in the unlocked position, the memory modules 216 positioned within the DIMM mechanism 320 are substantially perpendicular to the printed circuit board to which the DIMM mechanism 320 can be attached through the DIMM connector base 1102. In an embodiment, in the locked position, the memory modules 216 positioned within the DIMM mechanism 320 are tilted away from perpendicular and angled toward a central area of the printed circuit board to which the DIMM mechanism 320 can be attached. In an embodiment, a user can push the DIMM mechanism button 1104 to tilt the DIMM mechanism 320 from the unlocked position 1500 into the locked position 1510.

In an embodiment, the push/push DIMM lock mechanism 1302 includes three parallel bars, each parallel bar connected to a fourth bar that crosses the three parallel bars. In an embodiment, the fourth crossing bar can be connected to one end of a first outside parallel bar and to an opposite end of a second outside parallel bar of the push/push DIMM lock mechanism 1302. In an embodiment, the fourth crossing bar also connects to an inside parallel bar, which is positioned between the two outside parallel bars. In an embodiment, the fourth crossing bar includes an open region that allows the fourth crossing bar to travel with respect to the underlying three parallel bars as the push/push DIMM lock mechanism 1302 is engaged and disengaged, e.g., when changing from a locked position to an unlocked position. In an embodiment, the size of the open region of the fourth crossing bar can determine at least in part an amount of movement between the unlocked position and the locked position of the DIMM mechanism 320. In an embodiment, a spring latch (not indicated) can engage the push/push DIMM lock mechanism 1302 when in the locked position, and a user can push the DIMM mechanism button 1104 to unlock the push/push DIMM lock mechanism, which can "over travel" a short distance further inward, thereby disengaging the spring latch and forcing the push/push DIMM lock mechanism 1302 to rotate outward as the fourth crossing bar rotates and slides until reaching an end of the open region. In an embodiment, an amount of "over travel" inward and an amount of travel outward by the push/push DIMM lock mechanism 1302 can be determined at least in part by the length of the open region of the fourth crossing bar.

Figure 15B:
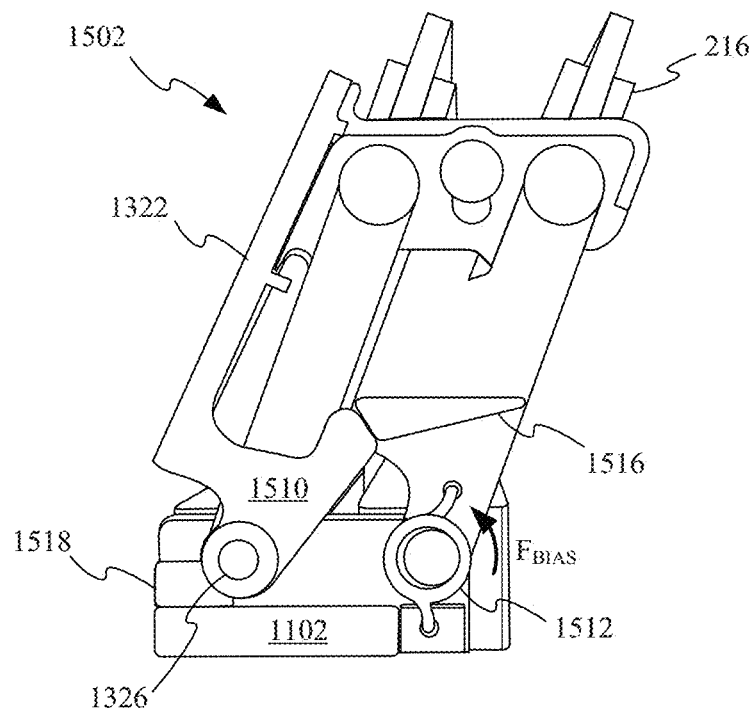
Figure 15C:
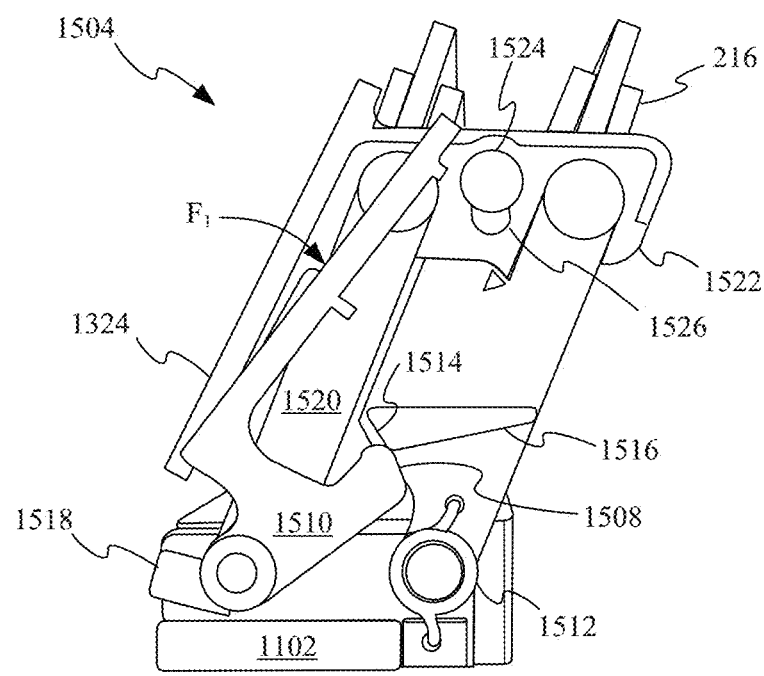
Figure 15D:
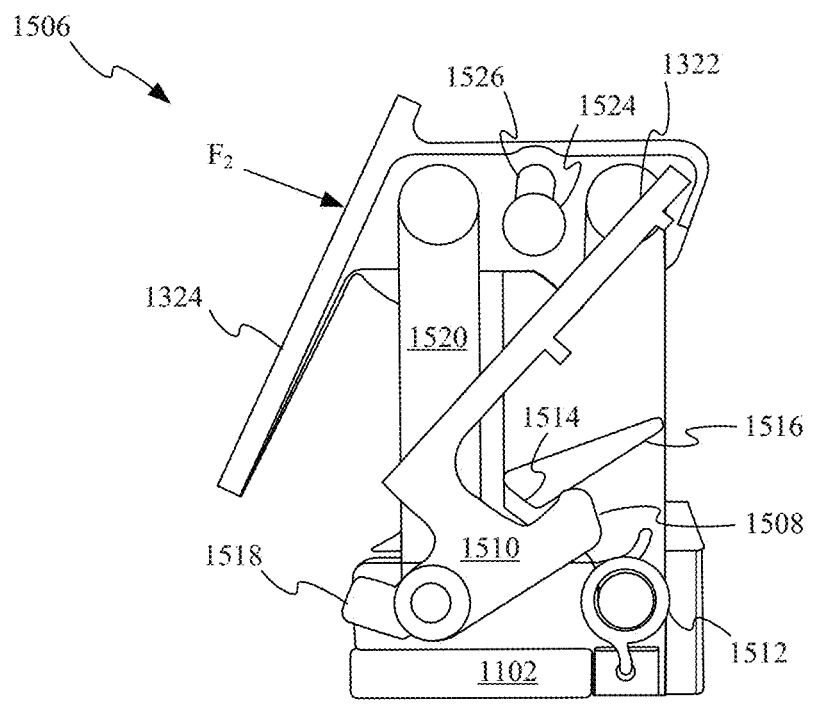

FIGS. 15B-15D are views of DIMM mechanism 1320 illustrating a manner in which (push/push) DIMM lock mechanism 1328 transitions from the latched (locked) orientation to the unlatched (unlocked) orientation. More specifically, FIG. 15B shows DIMM mechanism 1320 in latched orientation 1502, whereas FIG. 15C shows DIMM mechanism 1320 in a transitional orientation 1504 to better illustrate the kinematics of DIMM mechanism 1320 and finally FIG. 15D illustrating DIMM mechanism 1320 in an unlatched (or unlocked) orientation 1506. In an embodiment shown in FIG. 15B, DIMM locking mechanism 1328 is oriented in the latched position 1502 whereby surface 1508 of arm 1510 integrally formed with first actuator 1322 is held in place against biasing force $F_{bias}$ provided by biasing mechanism 1512. In an embodiment, biasing mechanism 1512 can take the form of a spring. More specifically, biasing mechanism 1512 can take the form of a torsional spring configured to provide a torsional biasing force to DIMM locking mechanism 1328. More specifically, biasing force $F_{bias}$ can be create a frictional coupling between surface 1508 of arm 1510 and surface 1514 of locking feature 1516 that is part of DIMM latching mechanism 1328. It should be noted that the spatial relationship between surface 1508 and surface 1514 could be adjusted to customize a "feel" of DIMM mechanism 1320. It should be noted that foot 1516 could limit the pivoting movement of first actuator about pivot 1326. In this way, first actuator 1322 can be aligned with second actuator 1324 in such a way as to provide the appearance of a single part effected by first actuator 1322 and second actuator 1324 in the latched orientation.

As shown in FIG. 15C, as force F1 is applied to first actuator 1322, both first actuator 1322 and first member 1518 move about pivot 1326. The movement of first member 1518 about pivot 1326 causes second member 1520 to translate both horizontally and vertically (by way of pin 1522 moving through slot 1524) resulting in second actuator 1324 translating horizontally and maintaining essentially an original orientation throughout the unlatching process. In other words, as shown in FIG. 15D, a final position of second actuator 1324 is parallel to an initial position of second actuator 1324 with respect to DIMM base 1102. In this way, a user interaction with second actuator 1324 also remains essentially unchanged regardless of a current orientation (latched or unlatched) of DIMM mechanism 1320. It should also be noted that a spatial relationship between edges of surface 1508 and surface 1514 can be adjusted in manner to customize a "snap" feeling when DIMM mechanism 1320 moves from transitional orientation 1506 to unlatched orientation 1508 shown in FIG. 15D.

It should be noted that the relative contours or surface 1504 and 1510 can be used to adjust a "feel" of DIMM mechanism 1302 during the unlatching process. In the unlatched orientation, the memory modules 216 positioned within the DIMM mechanism 1320 are substantially perpendicular to the printed circuit board to which the DIMM mechanism 1320 can be attached through the DIMM connector base 1102. In an embodiment, in the locked position, the memory modules 216 positioned within the DIMM mechanism 1320 are tilted away from perpendicular and angled toward a central area of the printed circuit board to which the DIMM mechanism 1320 can be attached.

Figure 16:
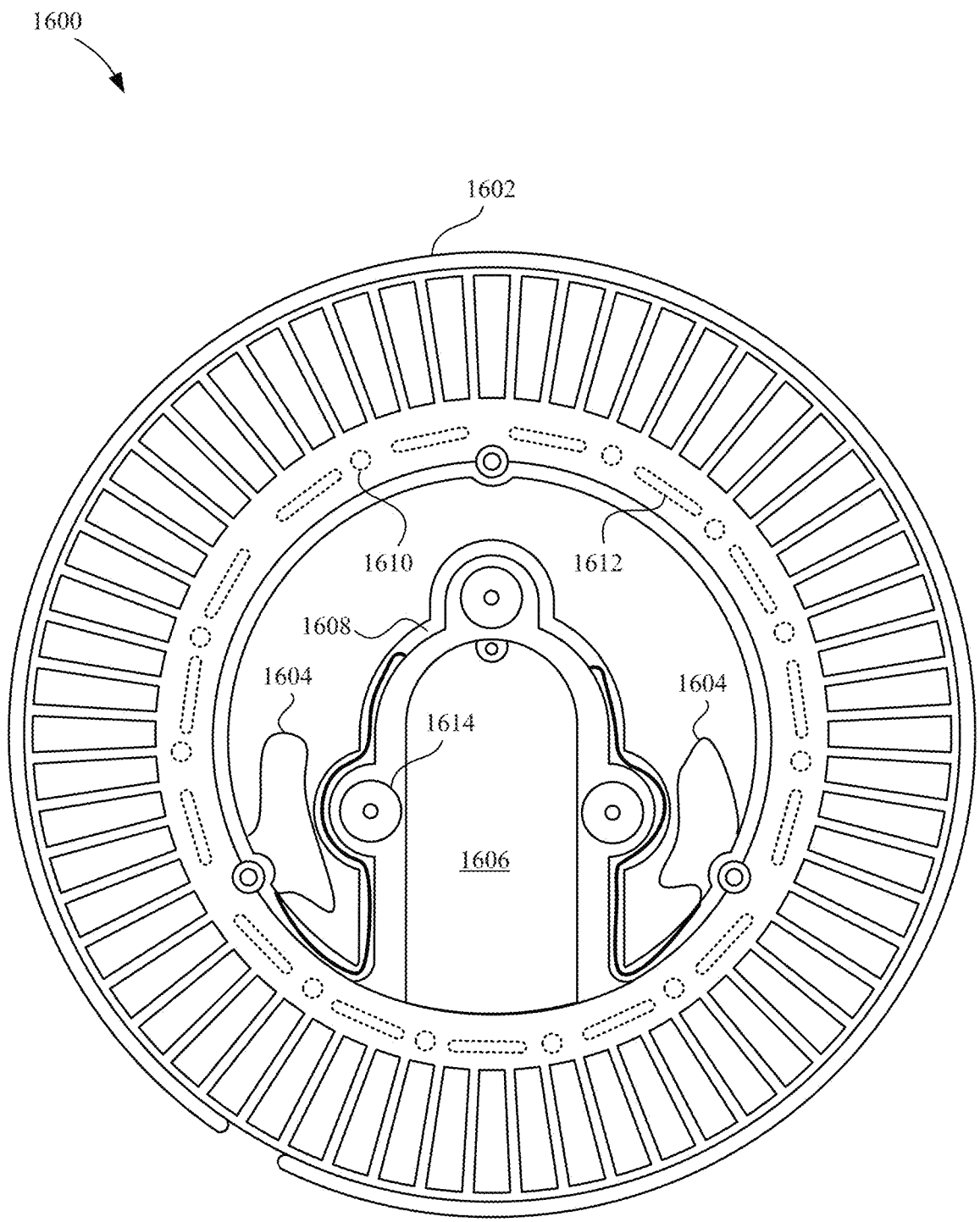
FIG. 16 illustrates a top view of a wireless subsystem of the compact computing system in accordance with some embodiments.

FIG. 16 illustrates a top view 1600 of the wireless subsystem 302 of the compact computing system 100 in accordance with some embodiments. In an embodiment one or more antennas 1604 are mounted inside air exhaust vents of the exhaust assembly housing 1602. In an embodiment, the one or more antennas 1604 are arranged symmetrically about a center point of the exhaust assembly housing 1602. Each antenna 1604 can be connected a corresponding antenna cable 1608 to wireless processing circuitry (not shown) mounted beneath a wireless processing circuitry top cover 1606. In some embodiments, the wireless processing circuitry top cover 1606 is formed of an electrically conductive metal and can form in part a Faraday cage to shield the wireless processing circuitry from extraneous radio frequency interference or noise.

In some embodiments, a radio frequency transparent cosmetic shield 202 can cover the antenna assembly and wireless processing circuitry. In an embodiment, a ring of magnets embedded in the exhaust assembly housing 1602 can surround the antenna assembly and provide a magnetic attraction for a metallic ring mounted inside the radio frequency transparent cosmetic shield 202. In an embodiment, a number of conductive gaskets 1612 can be placed between the magnets 1610 to provide a conductive path for radio frequency interference signals. The magnets 1610 and conductive gaskets 1612 can be omitted in some embodiments, and the radio frequency transparent cosmetic shield 202 can be mechanically attached to the exhaust assembly housing 1602, e.g., formed of a pliable material that can be shaped to grip a portion of the exhaust assembly housing 1602 when assembled on the compact computing system 100. In an embodiment, the antennas 1604 can be positioned outside a set of impeller mount points 1614 to which the impeller 304 attaches to the exhaust assembly housing 1602. In an embodiment, at least a portion of the impeller mount points and/or attachment mechanisms can be electrically conductive to ensure the impeller mount points 1614 are not freely floating metal pieces in proximity to the radio frequency antennas 1604 of the wireless subsystem 302.

Figure 17:
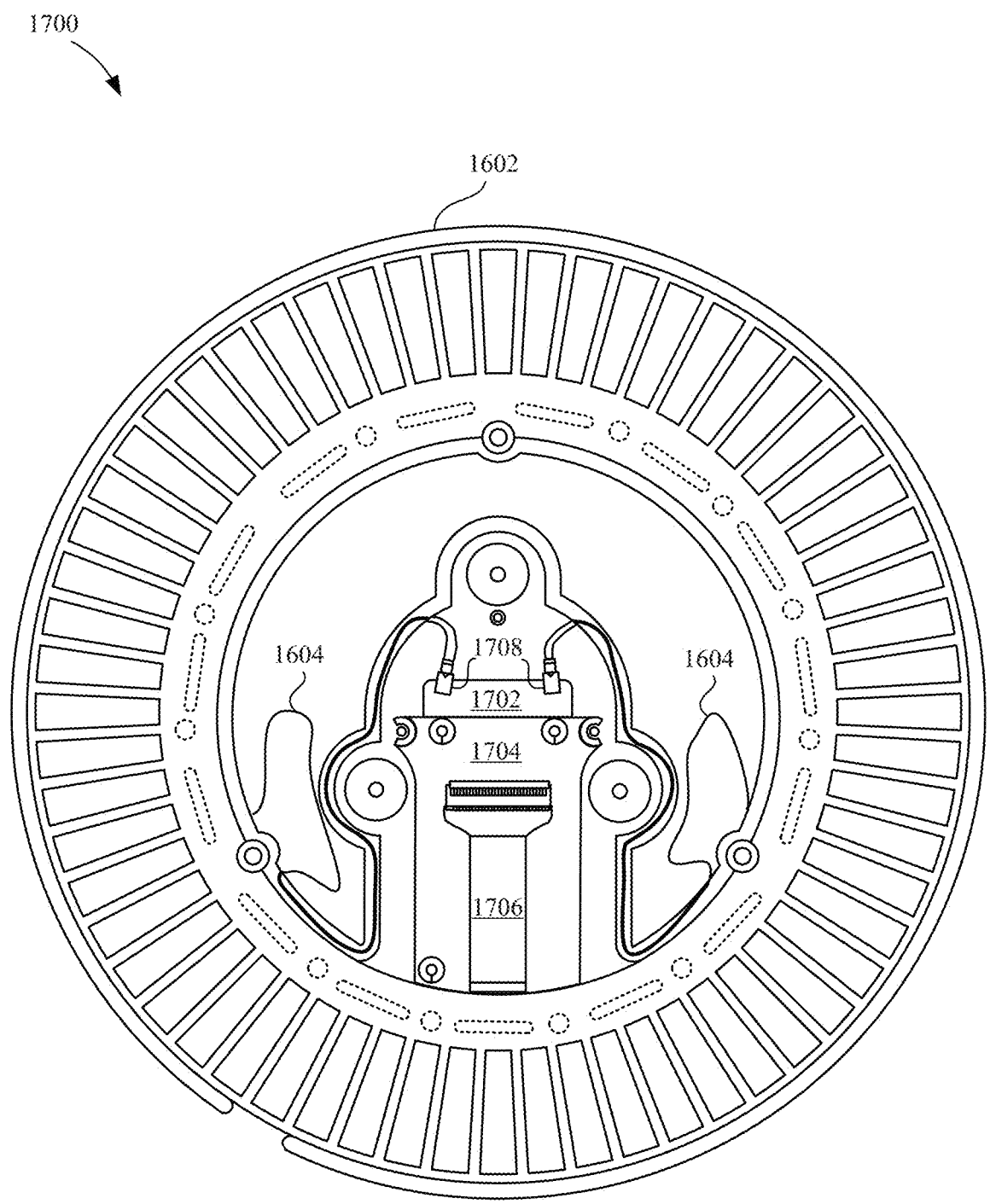
FIG. 17 illustrates another top view of the wireless subsystem of the compact computing system in accordance with some embodiments.

FIG. 17 illustrates another top view 1700 of the wireless subsystem 302 of the compact computing system 100 in accordance with some embodiments. The top view 1700 in FIG. 17 illustrates wireless processing circuitry situated between the impeller mount points 1614, which attach the impeller 304 within the exhaust assembly housing 1602. The top view 1700 in FIG. 17 resembles the top view 1600 of FIG. 16 with the wireless processing circuitry top cover 1606 removed. In an embodiment, one or more antennas 1604 can connect through associated antenna cables 1608 to individual wireless antenna connection points 1708 on a wireless processing circuitry board 1702, which can be sandwiched to a wireless interposer board 1704 between the impeller mount points 1614.

A wireless processing circuitry interconnect 1706 can include a flat, flexible cable that can communicate digital (and/or analog) signals from the wireless processing circuitry board 1702 to another circuit board (not shown) of the compact computing system 100 for further processing. The wireless processing circuitry interconnect 1706 can also communicate signals from other processing circuitry in the compact computing system 100 to the wireless processing circuitry board 1702, e.g., for modulation and transmission through one or more of the antennas 1604. In some embodiments, analog radio frequency processing circuitry and/or digital radio frequency processing circuitry can be mounted on the wireless processing circuitry board 1702. The analog and digital radio frequency processing circuitry on the wireless processing circuitry board 1702 can provide, at least in part, for transmission and reception of protocol data units according to one or more wireless communication protocols. In some embodiments, multiple antennas 1604 can be used for transmission and/or reception of radio frequency signals between the compact computing system 100 and additional wireless communication devices.

Figure 18:
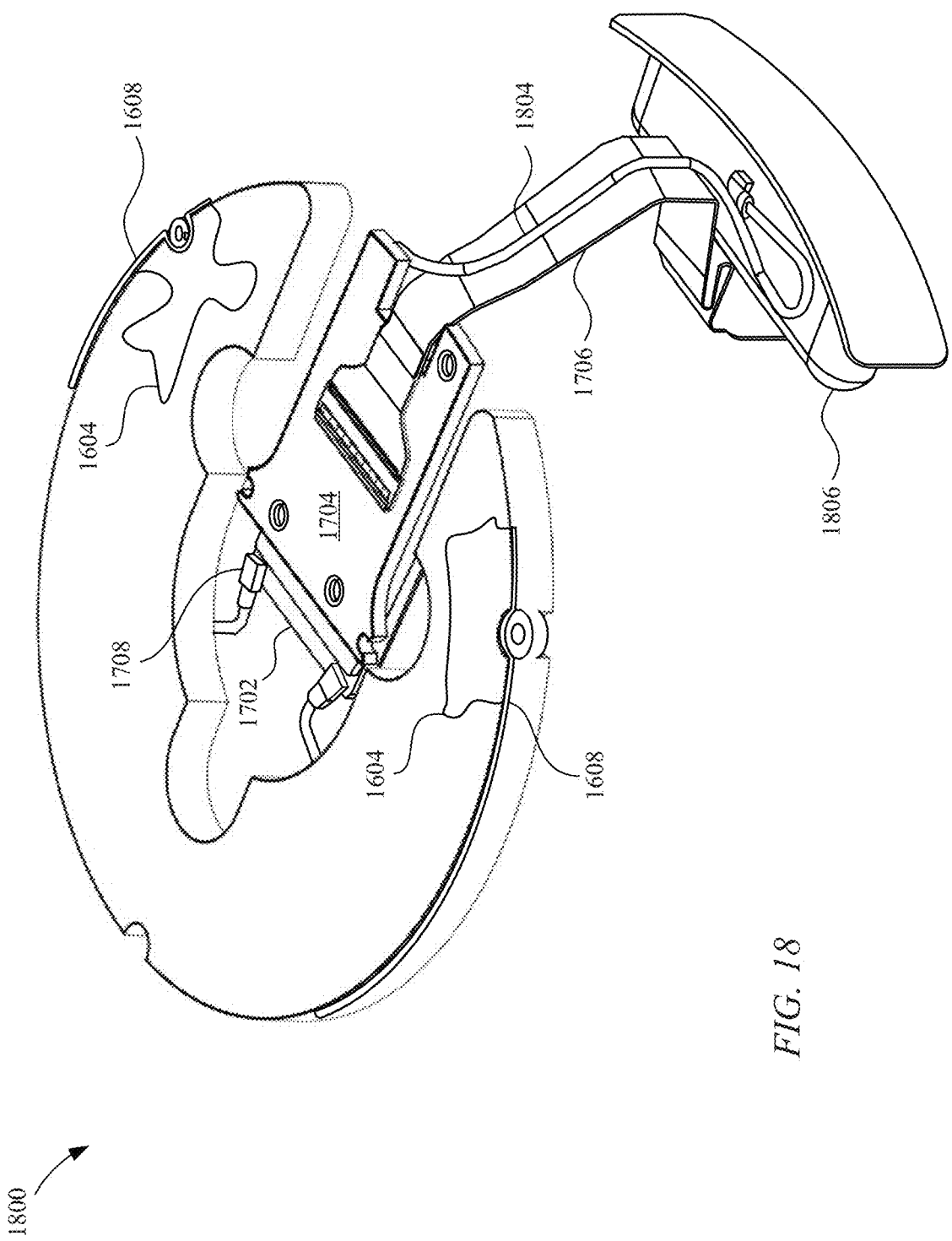
FIG. 18 illustrates a top perspective view of the components of the wireless subsystem of the compact computing system in accordance with some embodiments.

FIG. 18 illustrates a top perspective view 1800 of the antenna assembly and wireless processing circuitry for the compact computing system 100 in accordance with some embodiments. In an embodiment, three symmetrically positioned antennas 1604 each can connect through separate antenna cables 1608 to the wireless processing circuitry board 1702. An additional secondary antenna housing 1806 can include a fourth antenna that connects through a secondary antenna cable 1804 to the wireless processing circuitry board 1702. In an embodiment, the three top antennas 1604 can be used to communicate according to a first wireless communication protocol, while the fourth front mounted (secondary) antenna can be used to communicate according to a second wireless communication protocol. In an embodiment, the four antennas 1604 (including the front mounted secondary antenna) can be used together to communicate according to a wireless communication protocol, e.g., in a multiple-input multiple-output (MIMO) mode.

In an embodiment, wireless signal processing circuitry on the wireless processing circuitry board 1702 can select among the different antennas 1604 (including in some embodiments the front mounted secondary antenna) to transmit and/or receive radio frequency signals based on measured radio frequency signal quality conditions, using one or more of the antennas 1604 alone or together. In an embodiment, the wireless processing circuitry board 1702 includes radio frequency processing circuitry that can communicate according to a wireless local area network (WLAN) communication protocol, e.g., a Wi-Fi protocol, and/or according to a wireless personal area network (WPAN) communication protocol, e.g., a Bluetooth protocol. In an embodiment, digital signals from the wireless processing circuitry board 1702 can be communicated through the wireless processing circuitry interconnect 1706 cable to another circuit board (not shown) of the compact computing system for further processing. In some embodiments, the digital signals of the wireless processing circuitry board 1702 can pass through the wireless interposer board 1704 to which the wireless processing circuitry interconnect 1706 can be attached.

Figure 19:
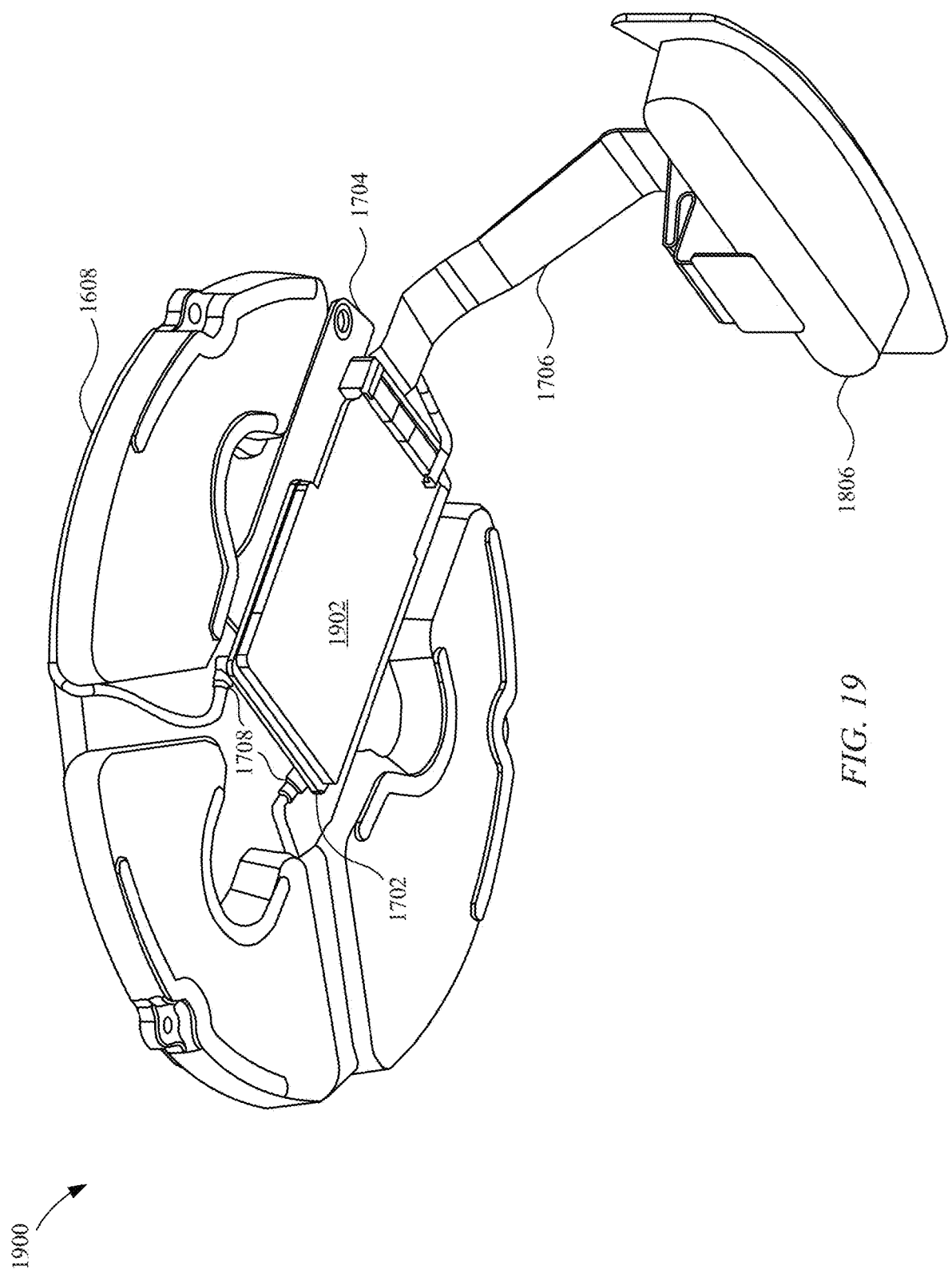
FIG. 19 illustrates a bottom perspective view of the wireless subsystem of the compact computing system in accordance with some embodiments.

FIG. 19 illustrates a bottom perspective view 1900 of the wireless subsystem 302 of the compact computing system 100 in accordance with some embodiments. In an embodiment, wireless processing circuitry 1902 can be mounted on the wireless processing circuitry board 1702 and can receive and/or transmit radio frequency signals through one or more antennas 1604 connected by antenna cables 1608 and/or a front mounted antenna in the secondary antenna housing 1806. The wireless processing circuitry board 1702 can communicate digital data (e.g., protocol data units) through the wireless processing circuitry interconnect 1706 cable which can mount to another circuitry board (not shown) of the compact computing system, e.g., to communicate with a "higher layer" applications processor, e.g., the CPU 402 or other digital chip provided for digital communication formatting and processing. In some embodiments, the wireless processing circuitry interconnect 1706 can connect to the wireless interposer board 1704 which then can connect to the wireless processing circuitry board 1702.

Figure 20:
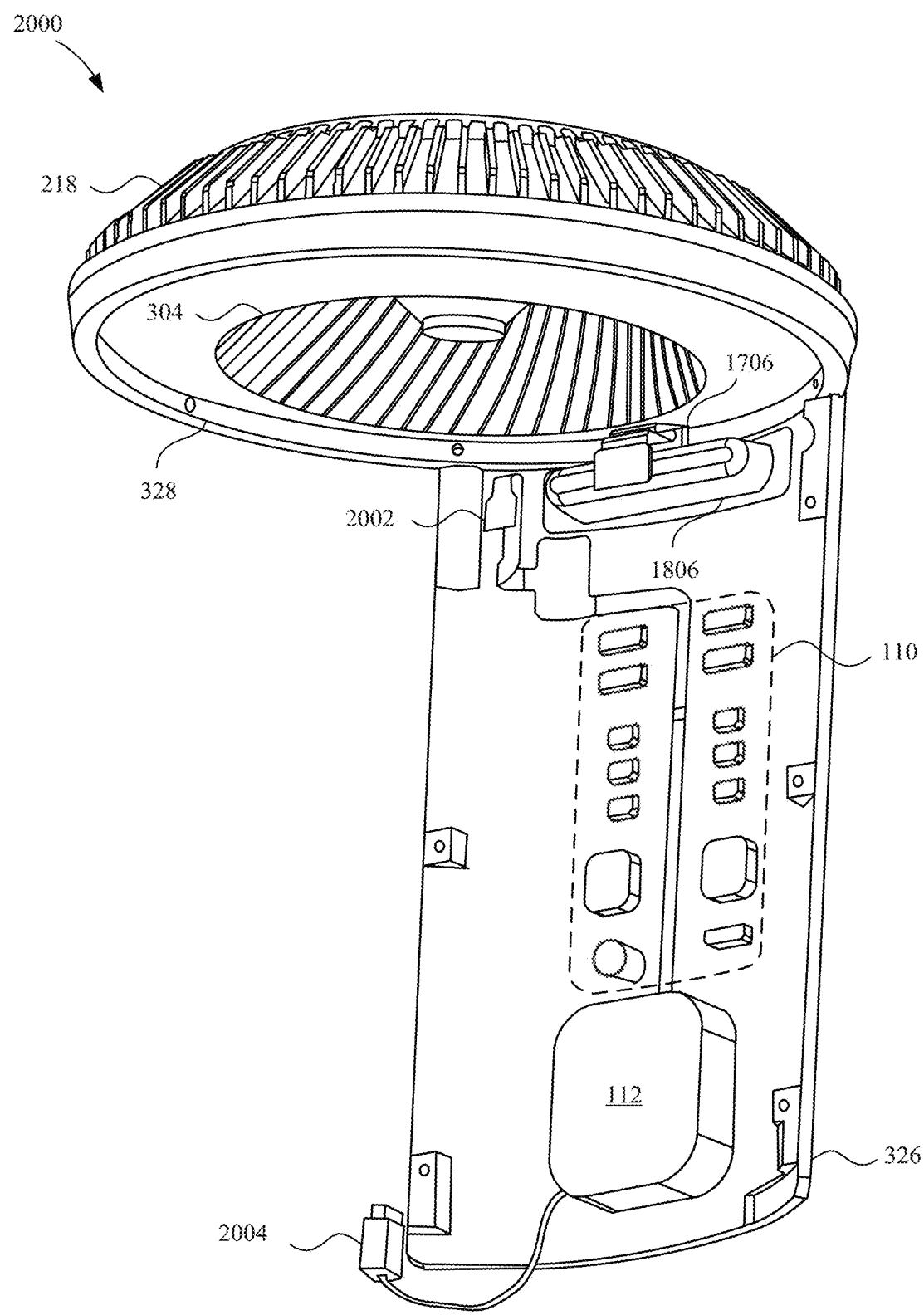
FIG. 20 illustrates a perspective view of an input/output assembly coupled to a top mounted air mover assembly in accordance with some embodiments.

FIG. 20 illustrates a perspective view 2000 of an input/output (I/O) assembly coupled to a top mounted air mover assembly in accordance with some embodiments. The top mounted air mover assembly can include, in some embodiments, the impeller 304 coupled to the exhaust assembly 218 and covered by the plenum plate 328 that can draw an airflow through the central core 200 of components of the compact computing system 100. The external housing 102 of the compact computing system 100 can include an opening through which an interface panel 110 can be located, e.g., as illustrated in FIG. 1. The interface panel 110 can be attached to the I/O subassembly cover 326, which can complete at least in part a portion of a Faraday cage that blocks and/or attenuates electromagnetic energy from entering or exiting the external housing 102. In an embodiment, the interface panel 110 can be formed of a radio frequency transparent material, e.g., a hardened plastic, and a separate perforated wire mesh panel (not shown) can line portions of the interior of the interface panel 110 to limit electromagnetic energy from passing through the interface panel 110.

As illustrated in FIG. 20, a number of openings for I/O ports can be accommodated. In addition, in some embodiments, the secondary antenna housing 1806 can be mounted inside of the I/O subassembly cover 326 containing a secondary antenna (not shown) to communicate radio frequency signals through a radio frequency transparent window in the interface panel 110 (and/or the I/O subassembly cover 326). In some embodiments, wireless processing circuitry 1902 (not shown) can communicate digital signals through the wireless processing circuitry interconnect 1706 cable, which can attach to a circuit board (not shown) placed along the back of the I/O assembly. In an embodiment, one or more individual icons and/or grouping icons for the I/O ports of the interface panel 110, e.g., can be illuminated under computer control of light emitting diodes (LEDs) as described further herein. In some embodiments, signals to control the illumination of one or more of the individual icons and/or grouping icons for the I/O ports can be communicated through an LED flex cable 2002 mounted on the rear of the interface panel 110 (and or to the I/O subassembly cover 326). In an embodiment, the interface panel 110 includes an opening for AC power connection 112, and AC power cable 2004 can transmit received AC power from AC power connector 112 to the power supply unit 322 (not shown).

Figure 21:
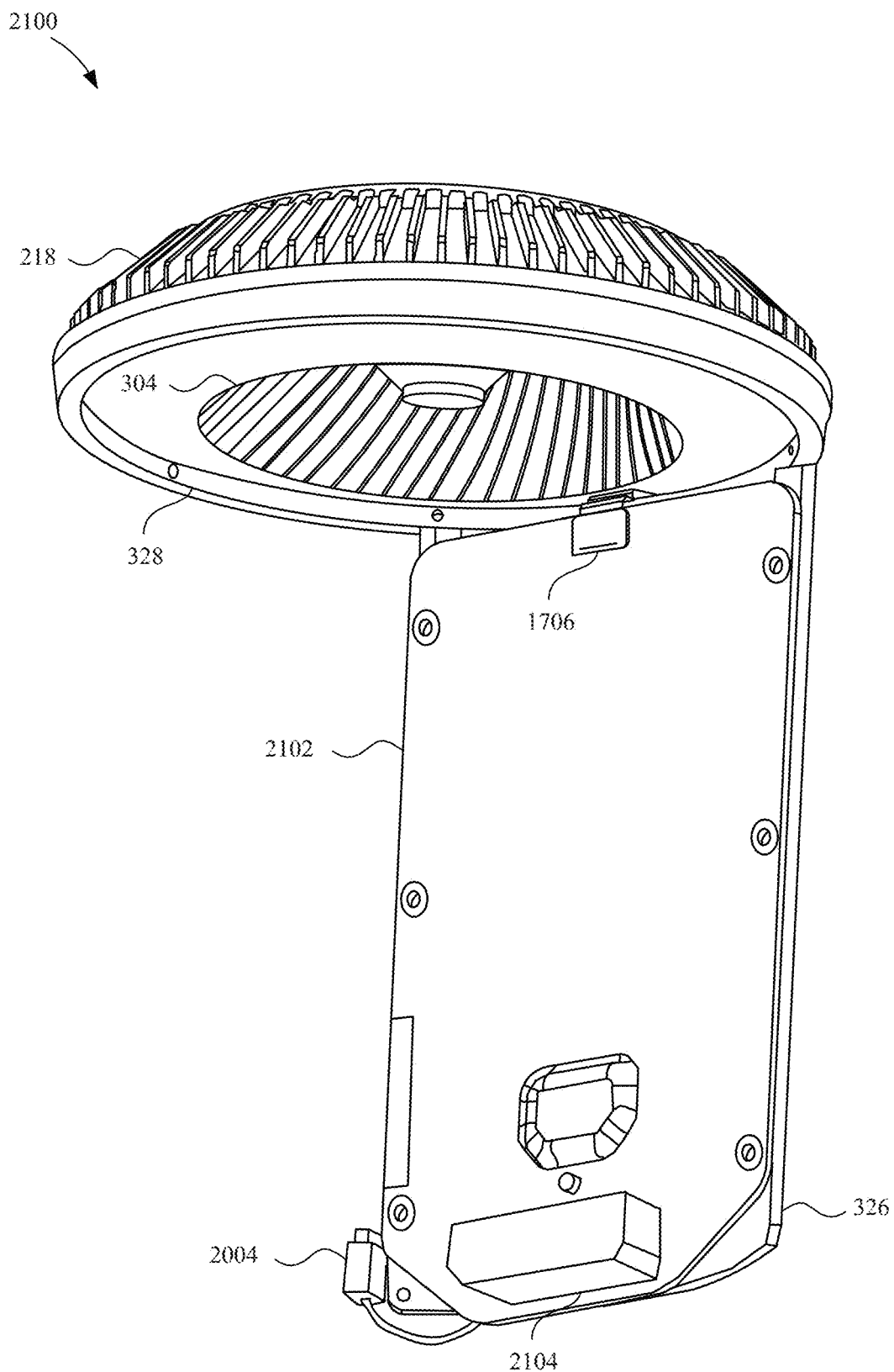
FIG. 21 illustrates another perspective view of the input/output assembly coupled to the top mounted air mover assembly in accordance with some embodiments.

FIG. 21 illustrates another perspective view 2100 of the input/output assembly coupled to the top mounted air mover assembly in accordance with some embodiments. FIG. 21 illustrates an input/output (I/O) board 2102 mounted on the interior face of the I/O subassembly cover. In some embodiments, the I/O board 2102 illustrated in FIG. 21 substantially corresponds to the I/O board 324 illustrated in FIG. 3. The I/O board 2102 can include multiple I/O connectors that can project through the interface panel 110. The I/O board can provide a high speed data connection through an I/O rigid flex connector 2104 for the set of I/O ports of the compact computing system 100. In an embodiment, the I/O rigid flex connector 2104 can terminate a flex cable (not shown) that connects to the interconnect board 316, thereby providing a high bandwidth connection between the set of I/O ports on the I/O board 2102 and the CPU board 318 and GPU board(s) 306, which also connect to the interconnect board 316.

The wireless processing circuitry interconnect 1706 can also connect to the I/O board 2102 providing at least a portion of a data path between the wireless processing circuitry 1902 mounted in the top portion of the air mover assembly and one or more processing chips on the interconnect board 316, the CPU board 318, and/or the GPU boards 306. In an embodiment, high speed connections through flex connectors to the GPU board(s) 306 and/or through edge connectors to the CPU board 318 can include multiple lanes of a peripheral component interconnect express (PCIe) interface, e.g., 32 lanes of a PCIe 2.X/3.X/4.X interface. In some embodiments, the high bandwidth connection between the I/O board 2102 and the interconnect board 316 can utilize multiple lanes of one or more peripheral component interconnect express (PCIe) interfaces, e.g., 32 lanes of a PCIe interface, 2×16 lanes of two parallel PCIe interfaces, n×32 lanes of multiple PCIe interfaces, or other combinations of one or more PCIe interfaces.

Figure 22:
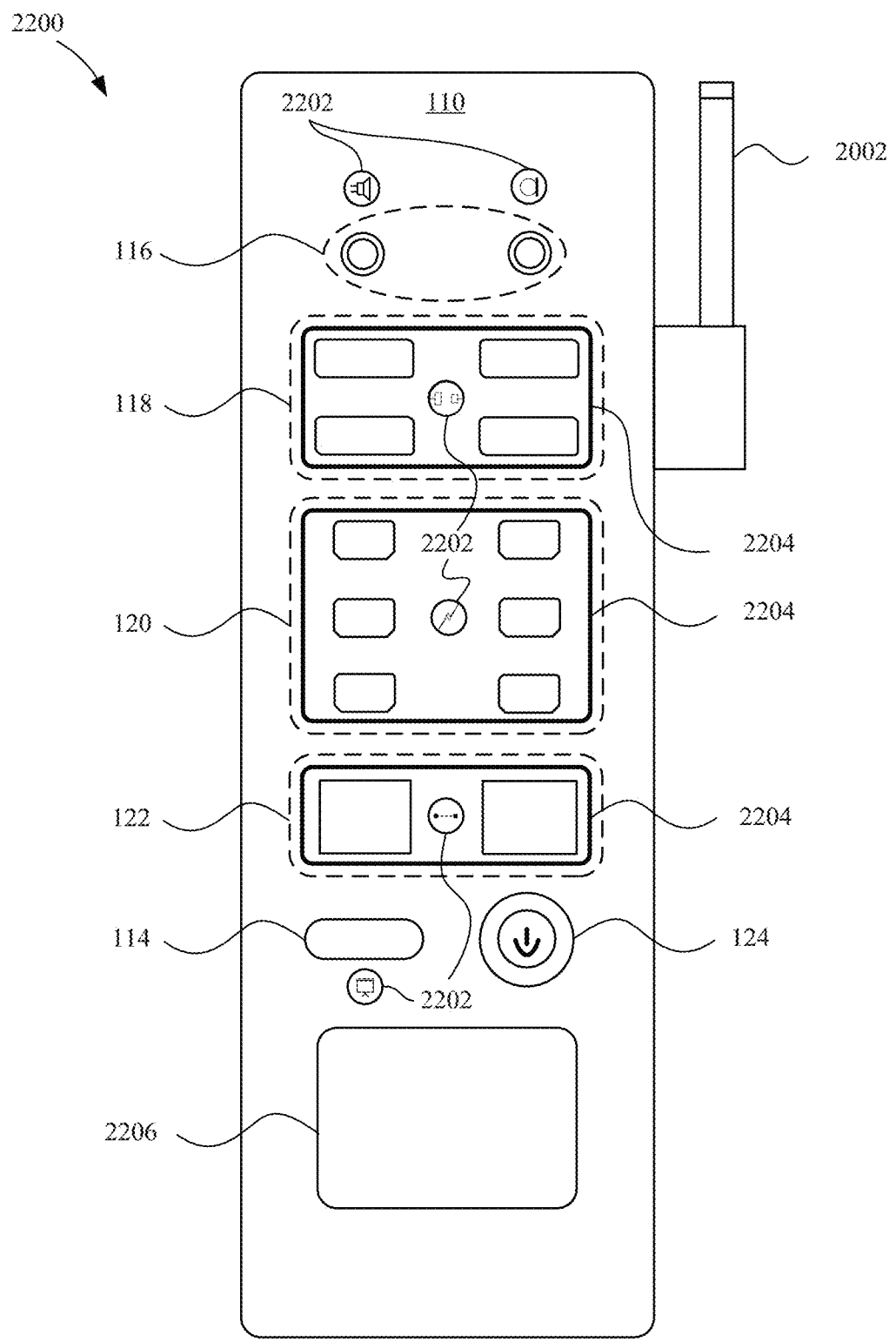
FIG. 22 illustrates a front view of the interface panel of the compact computing system in accordance with some embodiments.

FIG. 22 illustrates a front view 2200 of the interface panel 110 of the compact computing system 100 in accordance with some embodiments. In embodiment, the interface panel 110 can be formed at least in part using a transparent material covered with one or more layers of paint on its surface. In an embodiment, a portion of the one or more layers of paint can be laser etched to reveal a portion of a surface layer beneath. In an embodiment, one or more icons and/or groupings can be formed using a process that includes painting and laser etching a surface of the interface panel 110. As illustrated in FIG. 22, icons on the interface panel 110 can indicate individual ports and/or groups of ports. In an embodiment, an illuminable icon 2202 can be formed adjacent to an individual port and/or centered among a group of ports on the interface panel 110. The illuminable icon 2202 can provide a graphical indication of a function of the port with which the illuminable icon 2202 can be related. In an embodiment, a set of audio ports 116 can be labeled using one or more illuminable icons 2202, e.g., a first illuminable icon 2202 to indicate a speaker (audio output) port and a second illuminable icon 2202 to indicate a microphone (audio input) port. In an embodiment, a set of bus ports 118 can be labeled using an illuminable icon 2202, e.g., centrally placed among the set of bus ports 118, and also can be labeled using an illumination pattern 2204, which can circumferentially delineate the set of bus ports 118 from adjacent ports on the interface panel 110.

In an embodiment, as illustrated in FIG. 22, the illumination pattern 2204 can include a rounded edge rectangle that surrounds the set of bus ports 118. Similarly, in an embodiment, the set of high-speed expansion ports 120 can be labeled using a combination of a centrally placed illuminable icon 2202 and a perimeter bounded illumination pattern 2204. In an embodiment, a set of networking ports 122 can be labeled with an illuminable icon 2202 and by an illumination pattern 2204 surrounding the set of networking ports 122. In an embodiment, an adjacent illuminable icon 2202 can label the video port 114. In some embodiments, the power switch 124 can be illuminated and provide one or more activity indications through flashing (or other changes) to the illumination. The interface panel 110 can also include an AC power inlet opening 2206 through which an AC power input port 112 can be accessed.

Figure 23:
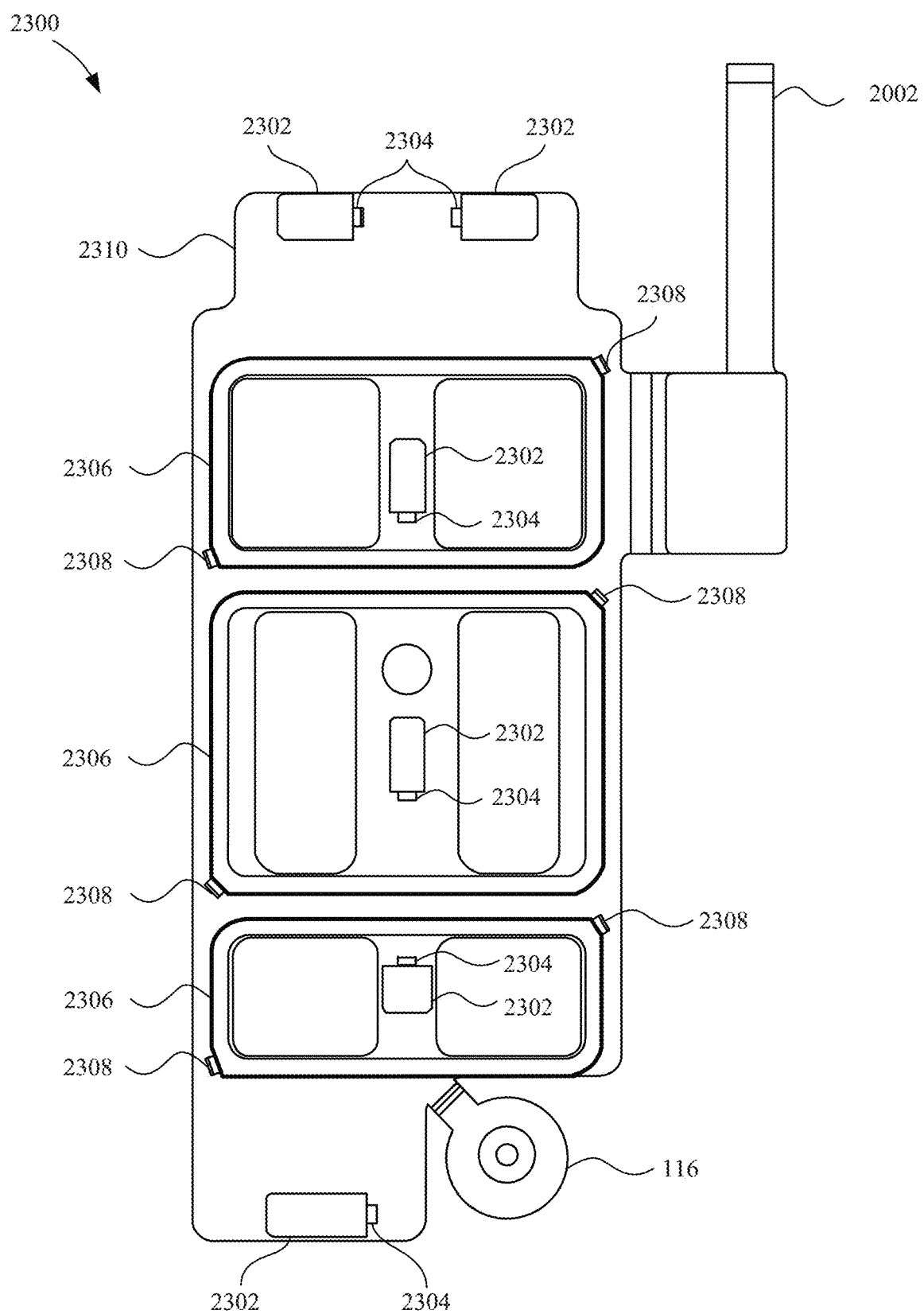
FIG. 23 illustrates a front view of an input/output flexible wall assembly for the interface panel of the compact computing system in accordance with some embodiments.

FIG. 23 illustrates a front view 2300 of an input/output (I/O) flexible wall assembly 2310 that can be mounted on the interior of the interface panel 110 for the compact computing system 100 in accordance with some embodiments. The I/O flexible wall assembly 2310 can include one or more icon light emitting diodes (LEDs) 2304 that can be positioned adjacent to one or more icon light guides 2302. The icon LEDs 2304 can transmit light through the icon light guides 2302 which can be placed behind corresponding illuminable icons 2202. In an embodiment, each illuminable icon 2202 can be paired with a corresponding icon light guide 2302 and icon LED 2304, which can be controlled to illuminate the corresponding illuminable icon 2202, e.g., through control signals received over the LED flex cable 2002 from control processing circuitry in the compact computing system 100. In some embodiments, one or more grouping LEDs 2308 can be positioned adjacent to one or more grouping light guides 2306 which can be placed about a grouping of ports, e.g., behind a corresponding illumination pattern 2204. The one or more grouping LEDs 2308 can transmit light through the grouping light guides 2306. In an embodiment, each illumination pattern 2204 can be paired with a corresponding grouping light guide 2306 which can transmit light around a set of ports of the interface panel 110. In a representative embodiment, a pair of grouping LEDs 2308 can be placed at corners of each grouping light guide 2306.

Figure 24:
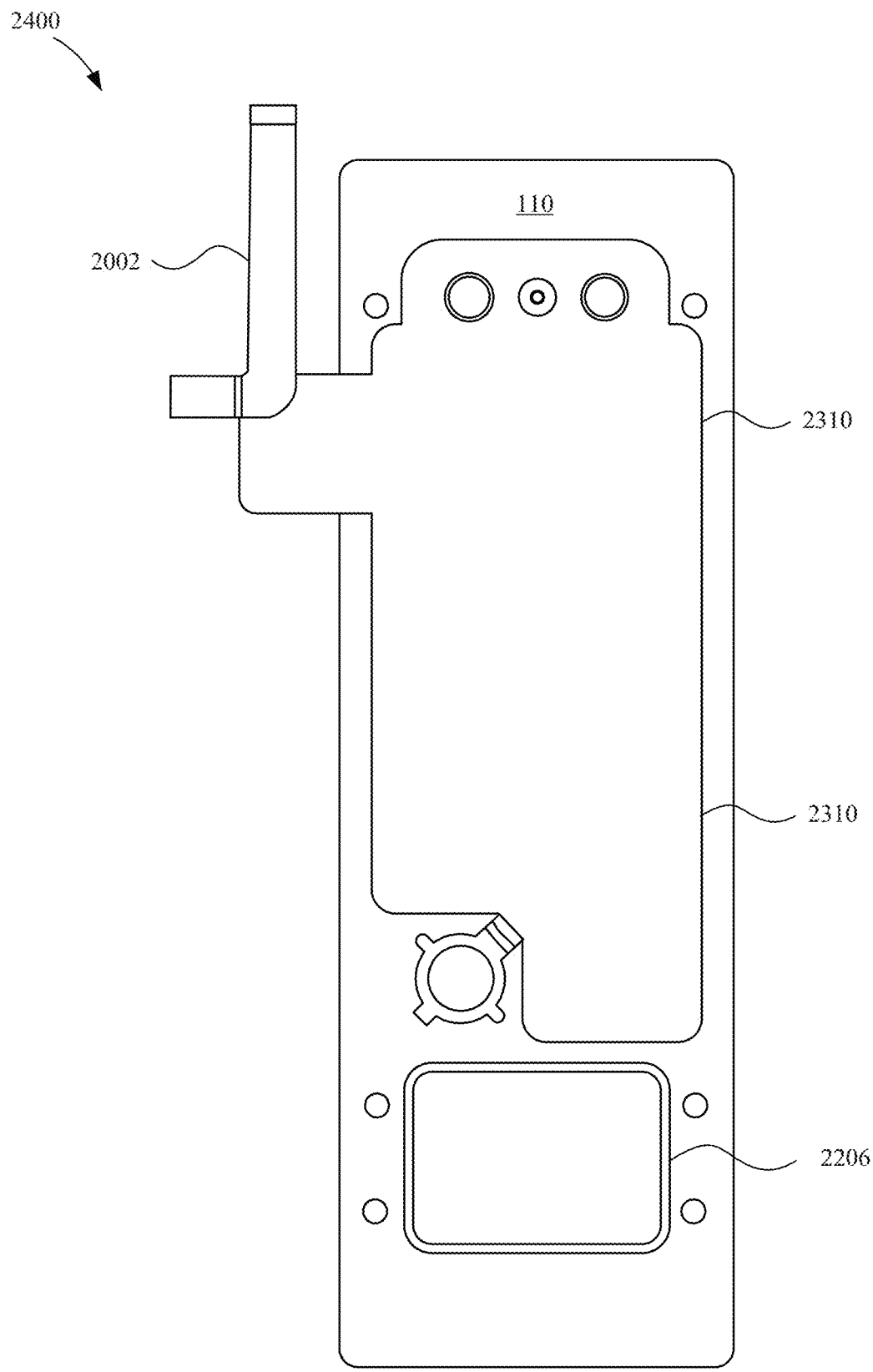
FIG. 24 illustrates a back view of the input/output flexible wall assembly attached to the back of the interface panel of the compact computing system in accordance with some embodiments.

FIG. 24 illustrates a back view 2400 of the input/output flexible wall assembly 2310 attached to the back of the interface panel 110 of the compact computing system 100 in accordance with some embodiments. The I/O flexible wall assembly 2310 can be attached to position lone or more icon light guides 2302 and/or grouping light guides 2306 to provide light from one or more LEDs 2304/2308 to a region behind illuminable icons 2202 and/or illumination pattern 2204. The illuminable icons 2202 and/or the illumination pattern 2204 can be lit under control of one or more processors in the compact computing system 100. In an embodiment, one or more sensors, e.g., accelerometers, can sense movement of the compact computing system and illuminate one or more illuminable icons 2202 and/or illumination pattern 2204 to assist a user of the compact computing system to locate a particular port or set of ports on the interface panel 110.

Figure 25:
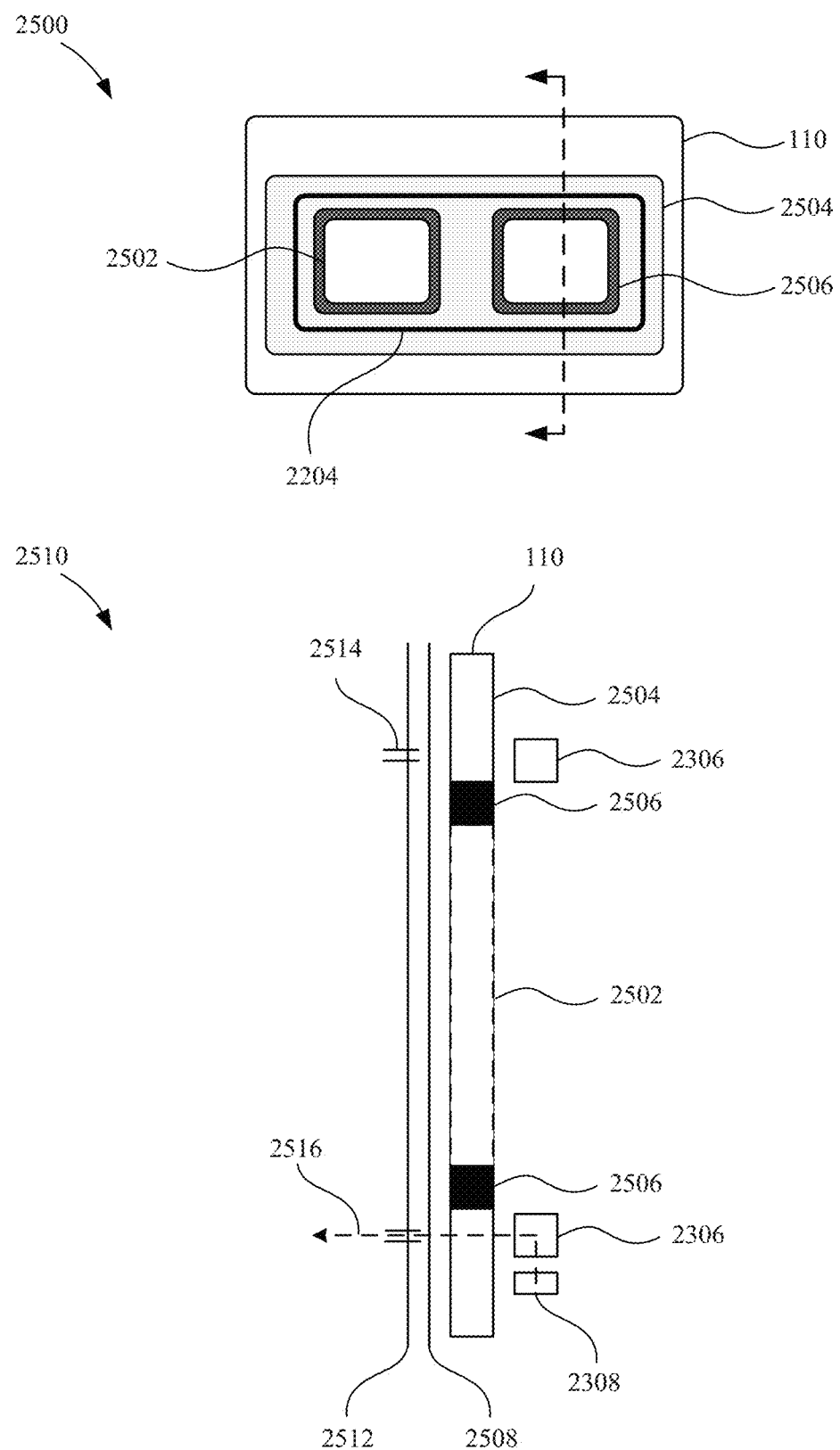
FIG. 25 illustrates a back view and a cross sectional view of a portion of the interface panel of the compact computing system in accordance with some embodiments.

FIG. 25 illustrates a back view 2500 and a cross sectional view 2510 of a portion of the interface panel 110 of the compact computing system 100 in accordance with some embodiments. As described above for FIGS. 22-24, one or more illuminable icons 2202 and/or illumination pattern 2204 can be formed on (and/or through) the interface panel 110 and can be illuminated from behind using a corresponding light guide and LED. The interface panel 110, in some embodiments, can be formed of a translucent and/or light transparent material that can be dyed and/or painted in various regions and/or areas. In an embodiment, a light blocking region 2504 can be formed around the periphery of one or more port opening(s) 2502 through which an I/O port of the interface panel 110 can project. In an embodiment, the light blocking region 2506 can be formed by infusing a penetrating dye into regions adjacent to one or more port openings 2502 in the interface panel 110. In an embodiment, a light transparent region 1504 can abut the light blocking region 2506 that surrounds each of the port openings 2502.

In an embodiment, the interface panel 110 can be initially formed substantially entirely of a light transparent material (such as plastic) and select regions surrounding each port opening 2502 in the interface panel 110 can be transformed to be light blocking regions 2506. In an embodiment each light transparent region 2504 adjacent to one or more light blocking regions can encompass an area that includes at least an illumination pattern 2204 for a set of ports. The illumination pattern can be formed by laser etching away one or more layers of paint applied to a surface of the interface panel 110. As illustrated by the cross section view 2510, the interface panel 110 can include a port opening 2502 surrounded by a light blocking region 2506, which in turn is adjacent to a light transparent region 2504. In a manufacturing process, one or more layers of paint can be applied to an outer facing surface of the interface panel 110. In an embodiment, a white paint layer 2508 followed by a black paint layer 2512 can be applied to the outer facing surface of the interface panel 110. Subsequently, a portion of the black paint layer 2512 can be laser etched to remove black paint forming a laser etched opening 2514 in the black paint layer 2512 (e.g., in the shape of an illuminable icon 2202 and/or an illumination pattern 2204) to reveal the white paint layer 2508 beneath.

In some embodiment, the white paint layer is transparent to a portion of light provided by a grouping LED 2308 transmitted by a grouping light guide 2306 placed adjacent to the read facing side of the interface panel 110. As illustrated in FIG. 25, LED light 2516 from the grouping LED 2308 can be guided by the grouping light guide 2306 through a portion of the light transparent region 2504 behind the laser etched opening 2514, thereby providing back illumination for the illumination pattern 2204 (or equivalently for an illuminable icon 2202). The light blocking region 2506, situated between the light transparent region 2504 through which the LED light 2516 passes and the port opening 2502, can block the LED light 2516 from emanating from the port opening.

Figure 26:
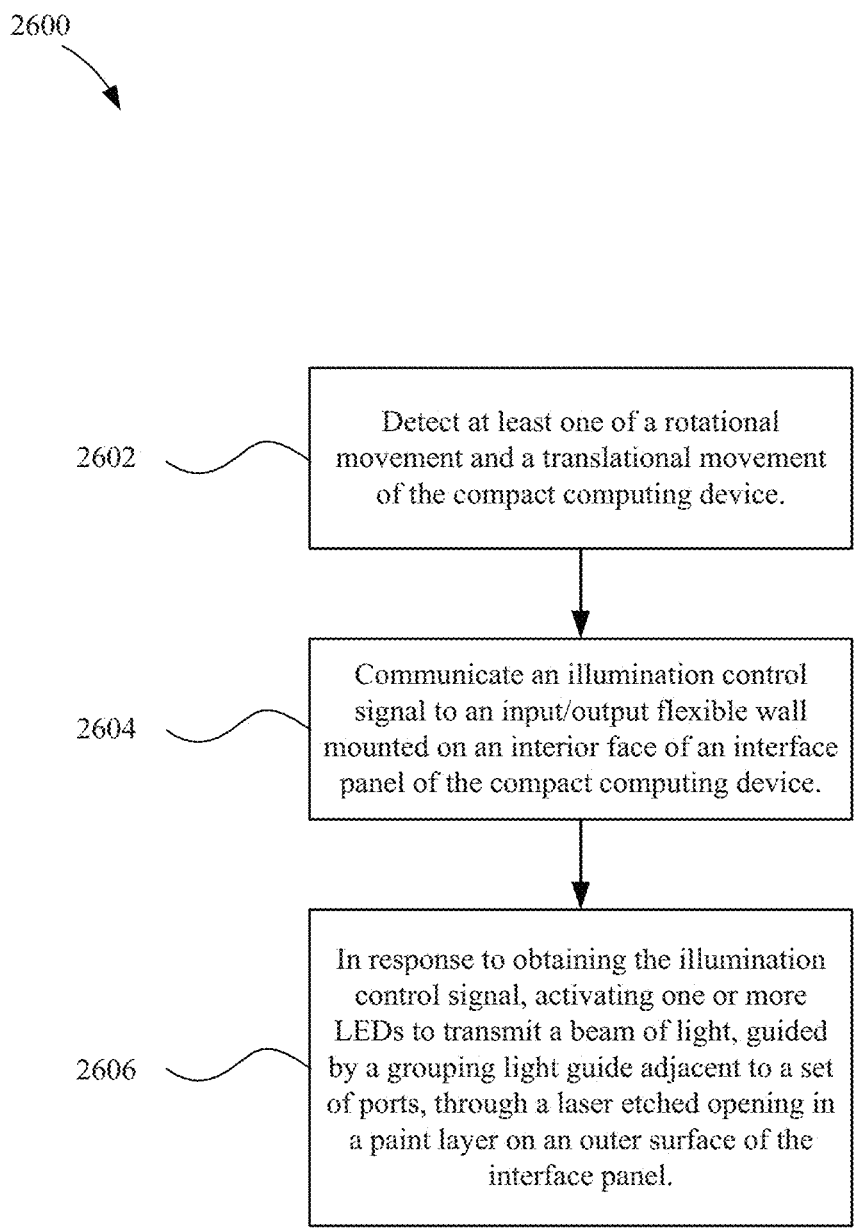
FIG. 26 illustrates a method for illuminating an illumination pattern in response to detecting movement of the compact computing system in accordance with some embodiments.

FIG. 26 illustrates a method 2600 for illuminating the illumination pattern 2204 of a set of ports on the interface panel 110 in response to detecting movement of the compact computing system 100 in accordance with some embodiments. The method includes at least the following steps. In a first step 2602, a processing element in the compact computing system 100 detects at least one of a rotational movement and a translational movement of the compact computing system 100. In a second step 2604, the processing element communicates an illumination control signal to the input/output flexible wall 2310 mounted on an interior face of the interface panel 110 of the compact computing system 100. In a third step 2606, in response to obtaining the illumination control signal, one or more light emitting diodes (LEDs) associated with the set of ports, e.g., one or more grouping LEDs 2308, are activated to transmit a beam of LED light 2516, guided by a grouping light guide 2306 adjacent to the set of ports, through a laser etched opening 2514 in a paint layer 2512 on an outer surface of the interface panel 110. The laser etched opening 2514 surrounds the set of ports, wherein a first portion of the interface panel 110 adjacent to the grouping light guide 2306 is at least partially transparent to the beam of LED light 2516 (e.g., light transparent region 2504) and wherein a second portion of the interface panel 110, adjacent to the first portion of the interface panel 110 and adjacent to at least one port in the set of ports, is opaque to the beam of light, e.g., light blocking region 2506.

Figure 27:
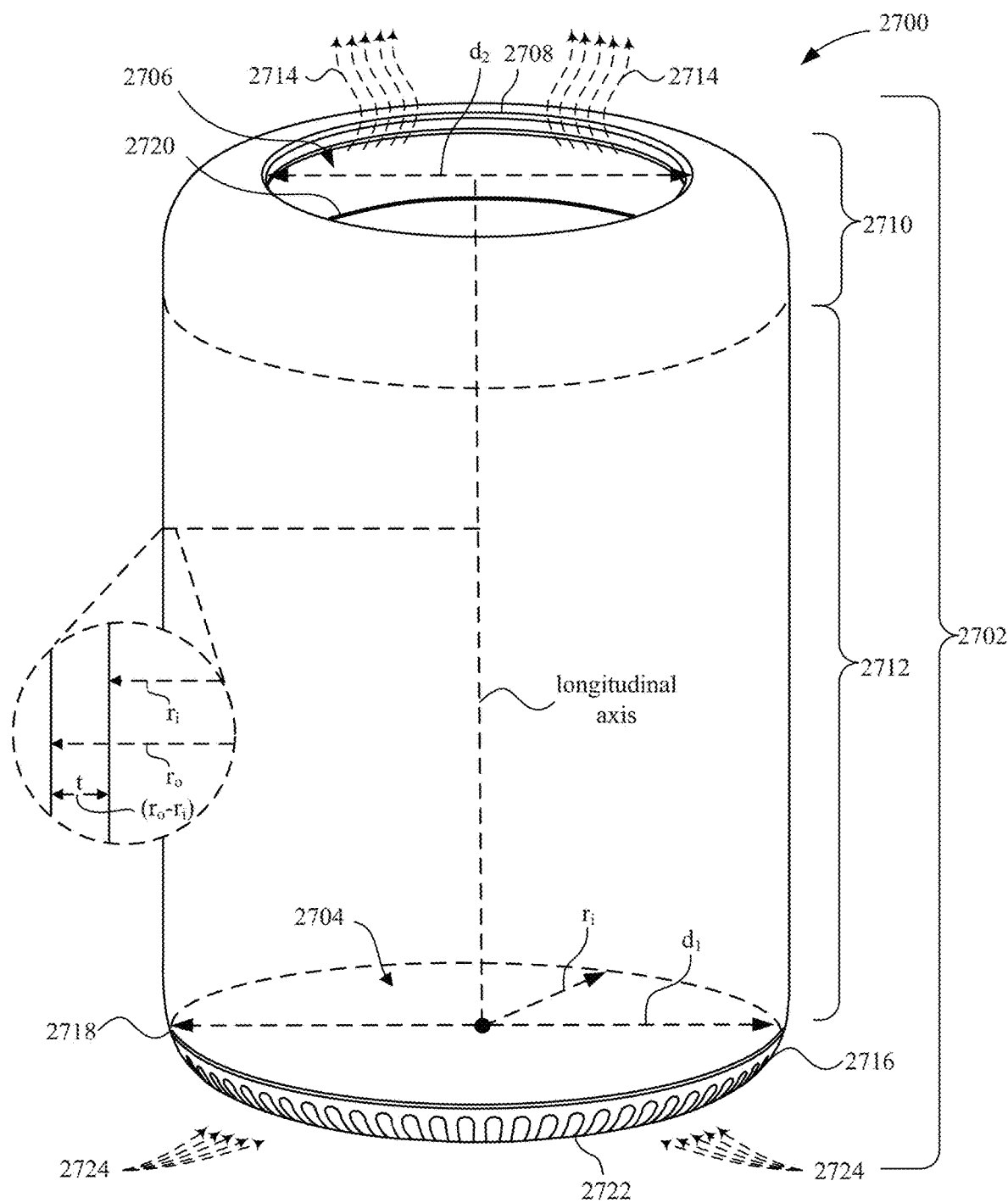
FIG. 27 shows a perspective view of an embodiment of a compact computing system in a stand-alone and upright configuration.

FIG. 27 shows a perspective view of compact computing system 2700. Compact computing system 2700 can have a shape defined by housing 2702. In the described embodiments, housing 2702 can be cylindrical in shape having a first opening 2704 characterized as having diameter $d_1$. More specifically, housing 2702 can take the form of a circular right cylinder having a longitudinal axis that extends long a centerline of a central volume enclosed by housing 2702. Housing 2702 can be characterized as having a circular cross section having a center point coincident with a corresponding point on the longitudinal axis. The circular cross section has a radius that is perpendicular to the longitudinal axis and extends outwardly therefrom. Accordingly, thickness t of housing 2702 (more specifically a housing wall) can be defined as a difference between an outer radius $r_o$ associated with an exterior of housing 2702 and inner radius $r_i$ associated with an interior surface of housing 2702. Moreover, housing 2702 can include second opening 2706 axially disposed from first opening 2704 having diameter d2 defined in part by exhaust lip 2708 where d1 is at least equal to or greater than d2. Housing 2702 can be formed from a single billet of aluminum in the form of a disk that can be extruded in a manner forming exhaust lip 2708. Thickness t of housing 2702 can be tuned to mitigate hot spots. In this regard, housing 2702 can have a non-uniform thickness t. In particular, portion 2710 near exhaust lip 2708 can have a first thickness of about 4-6 mm that then changes to a second thickness associated with portion 2712 that is reduced from the first thickness and located away from exhaust lip 2708. In this way, portion 2710 can act as both an integrated handle used to grasp compact computing system 2700 and as a feature that absorbs and conducts thermal energy transferred from a portion of exhaust airflow 2714 that engages exhaust lip

2708. Through radiative and conductive heat transfer and by limiting the amount of heat transferred to portion 2712, the formation of local hot spots in housing 2702 can be mitigated. Tuning the thickness of housing 2702 can be accomplished using, for example, an impact extrusion process using a metal disk that is then machined to the desired thickness profile. The metal disk may be made of aluminum, titanium, and any other metallic material that provides the strength, thermal conductivity, and RF-isolation desired. The extrusion process forms a cylinder that is machined in the exterior portion and in the interior portion to acquire the desired cross sectional profile and also the desired visual appeal from the exterior.

Compact computing system 2700 can further include base unit 2716. Base unit 2716 can be used to provide support for compact computing system 2700. Accordingly, base unit 2716 can be formed of strong and resilient material along the lines of metal that can also prevent leakage of electromagnetic (EM) energy from components within compact computing system 2700 that radiate EM energy during operation. Base unit 2716 can also be formed of non-metallic compounds that can nonetheless be rendered electrically conductive using, for example, electrically conductive particles embedded therein. In order to assure that any electromagnetic energy emitted by components within compact computing system 2700 does not leak out, lower conductive gasket 2718 can be used to complete a Faraday cage formed by base unit 2716 and housing 2702. Upper conductive gasket 2720 (shown in more detail in FIG. 3) can be disposed on the interior surface of housing 2702 near a lower edge of portion 2710. Use of conductive gaskets 2718 and 120 to complete the Faraday cage can increase EMI isolation by about 20 dB.

Base unit 2716 can also include vents 2722. Vents 2722 can be dual purpose in that vents 2722 can be arranged in base unit 2716 in such a way that a suitable amount of air from an external environment can flow through vents 2722 in the form of intake airflow 2724. In one embodiment, intake airflow 2724 can be related to a pressure differential across vents 2722 created by an air mover disposed with compact computing system 2700. In one embodiment, the air mover can be disposed near second opening 2706 creating a suction effect that reduces an ambient pressure within housing 2702. In addition to facilitating intake airflow 2724, vents 2722 can be sized to prevent leakage of electromagnetic energy there through. The size of vents 2722 can be related to a wavelength corresponding to electromagnetic energy emitted by internal components.

It should be noted that although a cylindrical housing is shown, that nonetheless any suitably shaped housing can be used. For example, housing 2702 can be have a rectangular cross section, a conical cross section (of which the circle is only one), or the cross section can take the form of an n-sided polygon (of which the rectangle is one in which n=4 and a triangle where n=3) where n is an integer having a value of at least 3.

A desktop computing system is described having a housing having an interior surface that defines an internal volume and having a longitudinal axis, a computing engine that includes a computational component and a structural core positioned within the internal volume that provides structural support for the computing engine such that the computing engine takes on a general shape of the structural core. In one embodiment, the structural core includes a heat sink that facilitates removal from the desktop computing system at least some heat generated by the computing engine.

In one embodiment, the structural core includes a heat sink that facilitates removal of heat from the cylindrical volume and the heat sink includes a plurality of planar faces that provides the structural core with a triangular shape that encloses a central thermal zone having a triangular cross section such that the computing engine takes on the triangular shape of the structural core. In one embodiment, the central thermal zone is generally parallel to the longitudinal axis and an exterior surface of the plurality of planar faces and an interior surface of the cylindrical housing define a peripheral thermal zone apart from the central thermal zone. In one embodiment, a thermal management system and the computing engine cooperate to maintain a temperature of the computational component within a pre-determined range of operating temperatures such that a central airflow through the central thermal zone and a peripheral airflow are directed through the peripheral thermal zone. In one embodiment, the desktop computing system is characterized as having a computing density defined as a peak operating rate of the computing engine over an amount of time divided by the cylindrical volume. In one embodiment, the cylindrical housing is formed of aluminum. In one embodiment, a shape of the computational component is defined by a minor centerline corresponding to a minor length and a major centerline corresponding to a major length.

In one embodiment, the computational component has a shape having a major centerline corresponding to a major dimension and a minor centerline corresponding to a minor dimension. In one embodiment, the major dimension corresponding to a major length and the minor dimension corresponds to a minor length. In one embodiment, the major dimension is a length (L) and the minor dimension is a width. In one embodiment, the major dimension is generally parallel to the longitudinal axis. In one embodiment, the minor dimension is generally parallel to the longitudinal axis. In one embodiment, the major centerline is perpendicular to the minor centerline. In one embodiment, an internal structure of the computational component is organized generally parallel to the major centerline and in accordance with the major length. In one embodiment, the computational component includes a first node at a first end and a second node at a second end opposite the first end. The desktop computing system also includes a printed circuit board (PCB) having a PCB shape defined by a PCB major centerline, and an electrical trace and the computational component is mounted to the PCB and electrically connected to the electrical trace. In one embodiment, the PCB is mounted to one of the plurality of planar faces and the PCB centerline is generally parallel to the longitudinal axis and the PCB is one of a plurality of PCBs each having their respective major centerlines being generally parallel to the longitudinal axis and at least one PCB is a graphics processing unit (GPU) board In one embodiment, the GPU board comprises: a graphics processing unit (GPU) and a video random access memory (VRAM) coupled to the GPU via a corresponding electrical trace. In one embodiment, the system includes a central processing unit (CPU) board comprising: a central processing unit (CPU) mounted to a first side of the CPU board and a memory module mounted on a second side of the CPU board and electrically connected to the CPU where the first side is opposite the second side of the CPU board.

In one embodiment, an Input/Output (I/O) board that includes an input/output (I/O) interface board comprising a high speed data port where the high speed data port is accessible to an external system. In one embodiment, the system includes an interconnect board connected to (1) the GPU board through a first wide bandwidth interconnect cable, (2) the I/O interface board through a second wide bandwidth interconnect cable, and (3) the CPU board through a wide bandwidth edge connectors on the CPU board and a socket connector on the interconnect board. In one embodiment, the system also includes a power supply unit arranged to provide one or more direct current (DC) voltages to a top edge of the GPU board opposite to a bottom edge of the GPU board to which the first wide bandwidth interconnect cable attaches, and to a top edge of the CPU board opposite a bottom edge of the CPU board that includes the wide bandwidth edge connector. In one embodiment, the first and second wide bandwidth interconnects comprise flexible cables, and a third wide bandwidth interconnect comprises one or more edge connectors on the CPU board mated to one or more corresponding socket connectors on the interconnect board.

A desktop computing system is described. The desktop computing system includes a housing having an interior surface that defines an internal volume having a longitudinal axis and a computing engine located within the internal volume where the computing engine has a generally triangular cross section that is perpendicular to the longitudinal axis.

In one embodiment, the desktop computing system includes a heat sink in thermal contact with at least the computational component where the heat sink includes a plurality of planar faces at least one of which is parallel to the longitudinal axis and at least one of the plurality of planar faces provides a structural support for the computing engine. In one embodiment, the computational component is mounted to one of the plurality of planar faces. In one embodiment, the computational component has a shape comprising a major centerline corresponding to a major dimension and a minor centerline corresponding to a minor dimension and in one embodiment the major dimension is a length (L) and the minor dimension is a width (W). In one embodiment, an internal structure of the computational component is organized generally parallel to the major centerline. The computing engine further includes a printed circuit board (PCB) comprising a plurality of electrical traces and the printed circuit board has a PCB major centerline that is generally parallel to the longitudinal axis. In one embodiment, the printed circuit board is a central processing unit (CPU) board and a CPU is mounted to a first face of the CPU board and the CPU is connected to one of the plurality of electrical traces. In one embodiment, the CPU board further comprising a memory module mounted on a second face of the CPU board opposite the first face of the CPU board.

The desktop computing system also includes a memory module mechanism disposed on the second face of the CPU board and configured to provide support for the memory module. In one embodiment, the memory module mechanism includes a pair of end guides connected to each other by a supporting member and each end guide comprising a slot configured to hold an end of the memory module and direct the memory module to a socket mounted on the CPU board. In one embodiment, the memory module mechanism also includes a lock mechanism configured to provide for movement of the memory module mechanism between an unlocked position and a locked position and an actuator attached to a first end guide that actuates a locking function of the memory module mechanism by receiving an applied force at either the actuator or the supporting member causing the memory module mechanism to move between the unlocked position and the locked position. In one embodiment, the supporting member configured to provide structural support and to facilitate transfer of a portion of the applied force to a second end guide opposite the first end guide and to resist torsion of the memory module mechanism. In one embodiment, the memory module mechanism allows insertion and removal of the memory module in the unlocked position and restricts insertion and removal of the memory module in the locked position. In one embodiment, the memory module mechanism providing an over travel movement of the memory module mechanism in a first direction in response to the applied force received at the actuator or the supporting member when the memory module mechanism is in the locked position. In one embodiment, the memory module further includes a spring loaded mechanism that causes the memory module mechanism to move in a second direction opposite the first direction from the locked position to the unlocked position in response to the over travel movement. In one embodiment, the memory module is a dual in-line memory module having an approximate length of 133 mm. In one embodiment, the memory module mechanism engages the memory module to the socket in the locked position and disengages the memory module from the socket in the unlocked position. In one embodiment, the lock mechanism comprising a movable linkage assembly comprising a plurality of interconnected bars. In one embodiment, the housing is a cylindrical housing that defines a shape of the internal volume as being a cylindrical volume.

A desktop computing system is described. The desktop computing system includes a housing that encloses an internal volume having a longitudinal axis and a circular cross section defined by a radius perpendicular to the longitudinal axis. The system also includes a printed circuit board (PCB) disposed within the internal volume having a shape defined in part by a major centerline that is generally parallel to the longitudinal axis and perpendicular to the radius and radially positioned a radial distance from the longitudinal axis and along the radius. In one embodiment, the housing has a cylindrical shape that defines a shape of the internal volume as being a cylindrical volume.

In an embodiment, the radius has a maximum radial distance at an interior surface of the cylindrical housing. In an embodiment, the PCB is part of a stack of interconnected PCBs that includes a central processing unit (CPU) board located at a first radial distance along the radius and having a CPU board centerline generally parallel to the longitudinal axis and comprising a CPU having a CPU centerline mounted on a first side of the CPU board generally parallel to the CPU board centerline, the CPU board comprising a power input node at a first end and a data node comprising one or more wide bandwidth edge connectors at a second end opposite the first end, wherein the first and second ends are located at opposite ends of the CPU major centerline and a power supply unit coupled to the CPU board and arranged to provide one or more direct current (DC) voltages to the power input node. In an embodiment, the stack of interconnected PCBs further includes an input/output (I/O) interface board located at a second radial distance greater than radial distance, each of which is less than maximum radial distance, and includes a plurality of high speed data ports to one or more external systems, and an I/O interface panel comprising a plurality of illuminable I/O ports at least one of which corresponds to one of the plurality of high speed data ports, wherein when a sensor detects movement of the cylindrical desktop computing system, an illumination pattern display indicator for at least some of the plurality of illuminable I/O ports is illuminated.

A flexible I/O wall sub-assembly is mounted on an interior surface of the I/O interface panel configured to receive an illumination control signal in accordance with the movement detected by the sensor. In an embodiment, the flexible I/O wall sub-assembly further includes a light emitting diodes (LED) that responds to the illumination control signal by generating light and a grouping light guide positioned adjacent to at least one of the plurality of I/O ports and configured to receive and guide the light generated by the LED through an opening of an opaque layer on an outer surface of the I/O interface panel, the opening surrounding at least one of the plurality of I/O ports. In an embodiment, a first portion of the interface panel adjacent the grouping light guide is at least partially transparent to the light and a second portion of the interface panel adjacent to the first portion of the interface panel and adjacent to the at least one I/O port is opaque to the light. And the first portion of the interface panel includes the illumination pattern display indicator and the second portion of the interface panel blocks the light from emanating from the at least one I/O port. In an embodiment, movement includes at least one of rotational movement and translational movement.

A method of indicating movement of a desktop computing system is described. The method can be carried out by detecting the movement of the desktop computing system by a sensor, providing a movement detection signal by the sensor to a processor in accordance with the movement, providing an illumination control signal by the processor in response to the movement detection signal to an I/O interface panel comprising a light emitting diode (LED), generating light by the LED in response to the illumination control signal and illuminating an I/O port using at least some of the light indicating the movement of the desktop computing system.

A desktop computing system includes a housing having an axisymmetric shape and a longitudinal axis, an air passage that spans an entire length of the housing and a computational component disposed within the air passage. In an embodiment, the system includes a heat sink having a triangular cross section disposed within the air passage and in thermal contact with the computational component where the triangular heat sink includes a plurality of planar faces and the computational component is mounted to one planar face of the plurality of planar faces.

A computer architecture is described having an internal component arrangement that includes an internal component and external interface arrangement for a cylindrical compact computing system, the internal component and external interface arrangement having a structural heat sink that includes multiple faces to which computational components of a computing core of the compact computing system are attached including a first face connected to a second face by a plurality of cooling fins.

A method for illuminating an illumination pattern display indicator for a set of input/output (I/O) ports on an I/O interface panel of a compact computing system is described. The method is carried out by detecting at least one of a rotational movement and a translational movement of the compact computing system, providing an illumination control signal to an I/O flexible wall sub-assembly mounted on an interior face of the I/O interface panel of the compact computing system, and in response to the provided illumination control signal, activating one or more light emitting diodes (LEDs) to transmit a beam of light, guided by a grouping light guide positioned adjacent to the set of I/O ports, through a laser etched opening of a paint layer on an outer surface of the interface panel, wherein the laser etched opening surrounds the set of ports. In one embodiment, a first portion of the interface panel adjacent to the grouping light guide is at least partially transparent to the beam of light and a second portion of the interface panel adjacent to the first portion of the interface panel and adjacent to at least one port in the set of ports is opaque to the beam of light.

A rotating and locking memory module mechanism is described that includes a pair of end guides, connected by a supporting member, each end guide including a slot to hold an end of a memory module and direct the memory module to a socket mounted on a circuit board, a lock mechanism configured to provide for rotation of the memory module mechanism between an unlocked position and an unlocked position, an actuator attached to a first end guide in the pair of end guides, wherein a user actuates a rotating and locking function of the memory module mechanism by applying a pressing force to the actuator or to the supporting member, thereby rotating the memory module mechanism between the unlocked position and the locked position, and the supporting member configured to provide structural support to transfer a portion of the pressing force applied to the actuator to an end guide opposite the actuator and to resist torsion of the memory module mechanism. In one embodiment, the memory module mechanism allows insertion and removal of the memory module while in the unlocked position and restricts insertion and removal of the memory module while in the locked position.

In an embodiment, a lock mechanism is provided for movement of the memory module mechanism between an unlocked position and a locked position and an actuator attached to a first end guide that actuates a locking function of the memory module mechanism by receiving an applied force at either the actuator or the supporting member causing the memory module mechanism to move between the unlocked position and the locked position. In one embodiment, the supporting member configured to provide structural support and to facilitate transfer of a portion of the applied force to a second end guide opposite the first end guide and to resist torsion of the memory module mechanism. In one embodiment, the memory module mechanism allows insertion and removal of the memory module in the unlocked position and restricts insertion and removal of the memory module in the locked position.

In one embodiment, the memory module mechanism providing an over travel movement of the memory module mechanism in a first direction in response to the applied force received at the actuator or the supporting member when the memory module mechanism is in the locked position. In one embodiment, the memory module also includes a spring loaded mechanism that causes the memory module mechanism to move in a second direction opposite the first direction from the locked position to the unlocked position in response to the over travel movement. In one embodiment, the memory module is a dual in-line memory module having an approximate length of 133 mm. In one embodiment, the memory module mechanism engages the memory module to the socket in the locked position and disengages the memory module from the socket in the unlocked position. In one embodiment, the lock mechanism includes a movable linkage assembly comprising a plurality of interconnected bars.

A cylindrical desktop computing system includes a computing engine positioned within a cylindrical housing that cooperates with a thermal management system to promote a high computational processing rate per unit volume.

A memory module mechanism includes a pair of end guides having a first and second end guides, connected by a supporting member, each end guide including a slot to hold an end of a memory module and direct the memory module to a socket mounted on a circuit board, a lock mechanism configured to provide for rotation of the memory module mechanism between an unlocked position and a locked position, and an actuator attached to a first end guide in the pair of end guides, wherein a user actuates a rotating and locking function of the memory module mechanism by applying a force to the actuator or to the supporting member, thereby rotating the memory module mechanism between the unlocked position and the locked position.

A method of indicating movement of a desktop computing system is described. The method includes at least the following operations: detecting the movement of the desktop computing system by a sensor, providing a movement detection signal by the sensor to a processor in accordance with the movement; providing an illumination control signal by the processor in response to the movement detection signal to an I/O interface panel comprising a light emitting diode (LED); generating light by the LED in response to the illumination control signal; illuminating an I/O port using at least some of the light indicating the movement of the desktop computing system. In one embodiment, receiving at least some of the light generated by the LED by a grouping light guide adjacent to the plurality of I/O ports that guides some of the received light through an opening of an opaque layer on an outer surface of the I/O interface panel. In one embodiment, a first portion of the I/O interface panel is adjacent the grouping light guide and is at least partially transparent to the light. In one embodiment, a second portion of the I/O interface panel adjacent the first portion of the interface panel and adjacent to the at least one I/O port is opaque to the light.

A method for illuminating an illumination pattern display indicator for a set of input/output (I/O) ports on an I/O interface panel of a compact computing system is described. The method is carried out by detecting at least one of a rotational movement and a translational movement of the compact computing system, providing an illumination control signal to an I/O flexible wall sub-assembly mounted on an interior face of the I/O interface panel of the compact computing system, and in response to the provided illumination control signal, activating one or more light emitting diodes (LEDs) to transmit a beam of light, guided by a grouping light guide positioned adjacent to the set of I/O ports, through a laser etched opening of a paint layer on an outer surface of the interface panel, wherein the laser etched opening surrounds the set of ports. In one embodiment, a first portion of the interface panel adjacent to the grouping light guide is at least partially transparent to the beam of light and a second portion of the interface panel adjacent to the first portion of the interface panel and adjacent to at least one port in the set of ports is opaque to the beam of light.

A compact desktop computing system includes a computing engine having a generally triangular layout that cooperates with a corresponding cylindrical housing and a thermal management system to promote a high computational processing rate per unit volume.

A desktop computing system includes a housing having a longitudinal axis that encloses and defines an internal volume that is symmetric about the longitudinal axis, a computing engine disposed within the internal volume, and a structural core positioned within the internal volume that provides structural support for the computing engine such that the computing engine takes on a general shape of the structural core.

In an embodiment, the structural core comprises a heat sink that facilitates removal of heat from the axisymmetric volume. In an embodiment, the heat sink comprising a plurality of planar faces that provides the structural core with a shape of a polygon that encloses a central thermal zone having a cross section in the shape of the polygon. In an embodiment, the computing engine takes on the shape of the structural core. In an embodiment, the central thermal zone is generally parallel to the longitudinal axis. In an embodiment, an exterior surface of the plurality of planar faces and an interior surface of the housing define a peripheral thermal zone apart from the central thermal zone. In an embodiment, a thermal management system and the computing engine cooperate to maintain a temperature of the computational component within a pre-determined range of operating temperatures. In an embodiment, the housing having the axisymmetric shape is a cylindrical housing. In an embodiment, wherein the axisymmetric volume is a cylindrical volume. In an embodiment, wherein the polygon is a triangle.

A compact desktop computing system includes a housing having a longitudinal axis having a length L, where the housing encloses and defines an internal space that is symmetric about the longitudinal axis and having a volume V, a computing engine positioned within the internal space and a thermal management system that is closely coupled with the computing engine wherein the thermal management system acts to maintain the computing engine at a thermal state in accordance with the computing engine operating at an elevated computational processing rate. In an embodiment, thermal management system comprises a structural core that provides structural support for the computing engine. In an embodiment, the structural core comprises a plurality of planar faces that form a heat sink having a cross section in accordance with a polygon and that defines a central thermal zone.

In an embodiment, at least a portion of the computing engine is mounted to and supported by at least one of plurality of lateral faces and in close thermal contact with the heat sink. In an embodiment, the close coupling between the thermal management system and the computing engine comprises the computing engine taking on a general shape of the heat sink. In an embodiment, the thermal management system further comprises an air mover configured to move air through the central thermal zone. In an embodiment, the close coupling between the thermal management system and the computing engine also includes moving an amount of air at a velocity through the central thermal zone by the air mover in response to a computational processing rate of the computing engine. In an embodiment, the polygon is a triangle.

In an embodiment, a computational processing density is defined as the computational processing rate divided by the volume V. In an embodiment, the housing is cylindrical and wherein the internal space comprises a circular cross section that is perpendicular to the longitudinal axis and having an area A and wherein the volume V is about equal to length L times the area A (L×A). In another embodiment, the housing comprises n lateral faces wherein n is an integer having a value of at least 3 and wherein the internal space comprises an n-sided cross section that is perpendicular to the longitudinal axis and having an area A and wherein the volume V is about equal to length L times the area A (L×A). In still another embodiment, the housing has a shape such that the corresponding internal space comprises a conical cross section that is perpendicular to the longitudinal axis and having an area A and wherein the volume V is about equal to length L times the area A (L×A).

A desktop computing system includes a housing having a longitudinal axis and that defines an internal volume that is symmetric about the longitudinal axis, a computing engine comprising a computational component, and a structural core positioned within the internal volume that provides structural support for the computing engine.

A desktop computing system includes a housing having a longitudinal axis and an interior surface that defines an internal volume that is symmetric about the longitudinal axis and a computing engine comprising a computational component, the computing engine located within the internal volume comprising a cross section that has a polygonal shape and that is perpendicular to the longitudinal axis.

A desktop computing system includes a cylindrical housing having a longitudinal axis and that encloses and defines an internal volume having a circular cross section centered at the longitudinal axis and defined by a radius centered at the longitudinal axis and that is perpendicular to the longitudinal axis and a printed circuit board (PCB) disposed within the internal volume comprising a shape defined in part by a major centerline that is parallel to the longitudinal axis and is perpendicular to the radius and is located a distance from the longitudinal axis along the radius.

A method of indicating a movement of a desktop computing system includes at least the following operations: detecting the movement of the desktop computing system by a sensor, providing a movement detection signal by the sensor to a processor in accordance with the movement, providing an illumination control signal by the processor in response to the movement detection signal to an I/O interface panel comprising a light emitting diode (LED), generating a light by the LED in response to the illumination control signal, and illuminating an I/O port using at least some of the light indicating the movement of the desktop computing system.

A desktop computing system includes a housing having a shape that is symmetric about a longitudinal axis, an air passage spanning an entire length of the housing, and a computational component disposed within the air passage.

A computer architecture that includes an internal component and external interface arrangement for a compact computing system is described. The internal component and external interface arrangement includes a structural heat sink having a lengthwise axis and that provides structural support for a computing engine having a computational component, the structural heat sink including planar faces that define a central region having a polygonal cross section that is perpendicular to the lengthwise axis and at least one of which carries the computational component, and a cooling that connects an interior surface of a first planar face to an interior surface of at least a second planar face and that spans the central region.

A method for illuminating an illumination pattern display indicator for a set of input/output (I/O) ports on an I/O interface panel of a compact computing system is described. The method is carried out by detecting at least one of a rotational movement and a translational movement of the compact computing system, providing an illumination control signal to an I/O flexible wall sub-assembly mounted on an interior face of the I/O interface panel of the compact computing system, and in response to the provided illumination control signal, activating one or more light emitting diodes (LEDs) to transmit a beam of light, guided by a grouping light guide positioned adjacent to the set of I/O ports, through a laser etched opening of a paint layer on an outer surface of the interface panel, where the laser etched opening surrounds the set of ports, and where a first portion of the interface panel adjacent to the grouping light guide is at least partially transparent to the beam of light, and where a second portion of the interface panel adjacent to the first portion of the interface panel and adjacent to at least one port in the set of ports is opaque to the beam of light.

A rotating and locking memory module mechanism includes a pair of end guides, connected by a supporting member, each end guide including a slot to hold an end of a memory module and direct the memory module to a socket mounted on a circuit board, a lock mechanism configured to provide for rotation of the memory module mechanism between an unlocked position and locked position, an actuator attached to a first end guide in the pair of end guides, wherein a user actuates a rotating and locking function of the memory module mechanism by applying a pressing force to the actuator or to the supporting member, thereby rotating the memory module mechanism between the unlocked position and the locked position and the supporting member configured to provide structural support to transfer a portion of the pressing force applied to the actuator to an end guide opposite the actuator and to resist torsion of the memory module mechanism. The memory module mechanism allows insertion and removal of the memory module while in the unlocked position and restricts insertion and removal of the memory module while in the locked position.

A desktop computing system, includes a computing engine positioned within a cylindrical housing that defines a cylindrical volume having a longitudinal axis and a thermal management system closely coupled with the computing engine wherein the thermal management system responds directly to a change in an activity level of the computing engine in real time.

A memory module mechanism includes a pair of end guides comprising a first and second end guides, connected by a supporting member, each end guide including a slot to hold an end of a memory module and direct the memory module to a socket mounted on a circuit board, a lock mechanism configured to provide for rotation of the memory module mechanism between an unlocked position and a locked position, and an actuator attached to a first end guide in the pair of end guides, wherein a user actuates a rotating and locking function of the memory module mechanism by applying a force to the actuator or to the supporting member, thereby rotating the memory module mechanism between the unlocked position and the locked position.

A desktop computing system includes a housing having an interior surface that defines a cylindrical volume having longitudinal axis and a computing engine comprising a computational component mounted to a printed circuit board (PCB), the computing engine located within the cylindrical volume and having a generally triangular cross section that is perpendicular to the longitudinal axis.

A desktop computing system includes a housing having a longitudinal axis that encloses and defines an internal volume that is symmetric about the longitudinal axis, a computing engine disposed within the internal volume, and a structural heat sink positioned within the internal volume that provides structural support for the computing engine such that a shape of the computing engine corresponds to a shape of the structural heat sink and wherein the structural heat sink facilitates removal of heat from the internal volume.

A compact desktop computing system includes a housing having a longitudinal axis having a length L, wherein the housing encloses and defines an internal space that is symmetric about the longitudinal axis and having a volume V. a computing engine positioned within the internal space and a thermal management system that is closely coupled with the computing engine wherein the thermal management system enables the computing engine to operate at a computational processing rate.

A desktop computing system includes a housing that defines an internal space, an air passage positioned within the internal space having a length that spans an entire length of the housing, and a computational component disposed within the air passage wherein an amount of air that moves through the air passage is in accordance with a current operation of the computational component.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

While the embodiments have been described in terms of several particular embodiments, there are alterations, permutations, and equivalents, which fall within the scope of these general concepts. It should also be noted that there are many alternative ways of implementing the methods and apparatuses of the present embodiments. It is therefore intended that the following appended claims be interpreted as including all such alterations, permutations, and equivalents as fall within the true spirit and scope of the described embodiments.

What is claimed is:

1. A cylindrically shaped consumer electronic product, comprising:
   a cylindrically shaped enclosure having an aperture and characterized by a longitudinal axis and a radius having a first length at a first end of the cylindrically shaped enclosure and a constant length, greater than the first length, at a central portion of the cylindrically shaped enclosure, the cylindrically shaped enclosure having a first opening at the first end sized in accordance with the first length and a second opening at a second end, opposite the first end, having a size less than the constant length, and wherein the longitudinal axis and the radius define a first internal volume,
   a circular base secured to the cylindrically shaped enclosure at the second opening and that defines a second internal volume and is capable of supporting the cylindrically shaped enclosure on a horizontal surface, and
   electronic components located within the first internal volume and carried by the circular base and separate from the cylindrically shaped enclosure, wherein the electronic components include:
      a first printed circuit board (PCB) located within the first internal volume and that is aligned perpendicular to the longitudinal axis and parallel to the radius, the first PCB electrically coupled to an interface panel, wherein the interface panel is capable of receiving a tactile input corresponding to a control input,
      a second printed circuit board (PCB) that is offset from and parallel to the longitudinal axis,
      an air moving component that provides an audible sound that is capable of passing through the aperture, and
      a radio-frequency (RF) circuit coupled to an RF antenna, the RF antenna located in proximity to the first opening so as to facilitate an RF communication channel using an RF protocol.

2. The cylindrically shaped consumer electronic product as recited in claim 1, wherein the electronic components further include an optical component capable of providing a visible light.

3. The cylindrically shaped consumer electronic product as recited in claim 1, wherein the air moving component is centered at and perpendicular to the longitudinal axis.

4. The cylindrically shaped consumer electronic product as recited in claim 1, wherein the air moving component is capable of moving air in a controlled manner towards the first opening and in accordance with the longitudinal axis.

5. The cylindrically shaped consumer electronic product as recited in claim 4, wherein the moving air is capable of producing the audible sound.

6. A cylindrically shaped consumer electronic product, comprising:
   a cylindrically shaped enclosure that is defined by a longitudinal axis and a radius having a first length at a first end and a constant length, greater than the first length, at a central portion, the cylindrically shaped enclosure having a first opening at the first end sized in accordance with the first length and a second opening at a second end, opposite the first end, having a size less than the constant length, wherein the longitudinal axis and the radius define an internal volume;
   components located within the internal volume and separate from the enclosure and at least one of which is an air moving component capable of producing an audible sound that is capable of passing through an aperture in the cylindrically shaped enclosure; and
   a circular base that supports the components.

7. The cylindrically shaped consumer electronic product as recited in claim 6, wherein the circular base supports the cylindrically shaped enclosure at the second opening.

8. The cylindrically shaped consumer electronic product as recited in claim 6, wherein the air moving component capable of providing the audible sound is centered at and perpendicular to the longitudinal axis and that directs a flow of moving air towards the first opening.

9. The cylindrically shaped consumer electronic product as recited in claim 8, wherein the flow of moving air is aligned with the longitudinal axis.

10. The cylindrically shaped consumer electronic product as recited in claim 8, wherein the aperture is capable of passing visible light.

11. The cylindrically shaped consumer electronic product as recited in claim 10, wherein the visible light is arranged in a pattern.

12. The cylindrically shaped consumer electronic product as recited in claim 11, wherein the visible light is arranged in the pattern conveys information that corresponds to an operating state of the at least one of the components.

13. A desktop electronic device, comprising:
   a tubular shaped enclosure defined by (i) a longitudinal axis, (ii) an overall shape that is symmetric about the longitudinal axis, and (iii) a radius that is perpendicular to the longitudinal axis and having a first radial length at a first end of tubular shaped enclosure and a fixed radial length at a central portion of the tubular shaped enclosure that is greater than the first radial length, the tubular shaped enclosure having at least one aperture suitable for passing audible sound and a first opening at the first end sized in accordance with the first radial length;

a circular base that is centered at and perpendicular to the longitudinal axis, wherein the circular base is capable of supporting the tubular shaped enclosure; and components that are (i) separate from the tubular shaped enclosure, and (ii) supported by the circular base.

14. The desktop electronic device as recited in claim 13, wherein the components include a printed circuit board (PCB) having an RF antenna in communication with an RF circuit, the RF antenna being used to facilitate a wireless communication over a wireless communication channel.

15. The desktop electronic device as recited in claim 13, wherein at least one of the components is capable of producing an audible sound.

16. The desktop electronic device as recited in claim 15, the component that is capable of providing the audible sound is centered at and perpendicular to the longitudinal axis and directs a flow of moving air towards the first opening in accordance with the longitudinal axis.

17. The desktop electronic device as recited in claim 13, wherein at least one of the apertures allows passage of a visible light.

18. The desktop electronic device as recited in claim 17, wherein the visible light is arranged in a pattern that conveys information that corresponds to an operating state of at least one component.

* * * * *